(12) United States Patent
Chang et al.

(10) Patent No.: US 8,264,289 B2
(45) Date of Patent: Sep. 11, 2012

(54) NTH-ORDER ARBITRARY-PHASE-SHIFT SINUSOIDAL OSCILLATOR STRUCTURE AND ANALYTICAL SYNTHESIS METHOD OF MAKING THE SAME

(75) Inventors: Chun-Ming Chang, Chung-Li (TW); Shu-Hui Tu, Chung-Li (TW)

(73) Assignee: Chung Yuan Christian University, Chung-Li (TW)

( * ) Notice: Subject to any disclaimer, the term of this patent is extended or adjusted under 35 U.S.C. 154(b) by 0 days.

(21) Appl. No.: 12/759,682

(22) Filed: Apr. 13, 2010

(65) Prior Publication Data
US 2010/0264996 A1 Oct. 21, 2010

Related U.S. Application Data

(66) Substitute for application No. 61/170,809, filed on Apr. 20, 2009.

(51) Int. Cl.
*H03B 5/20* (2006.01)
(52) U.S. Cl. .................................... 331/108 B; 331/135
(58) Field of Classification Search .................. 331/135, 331/136, 137, 108 B
See application file for complete search history.

(56) References Cited

U.S. PATENT DOCUMENTS 5,852,385 A * 12/1998 Izumikawa ..................... 331/57
6,194,972 B1 * 2/2001 Brown ....................... 331/108 B

OTHER PUBLICATIONS

Swamy et al., "Generation of New OTA-C Oscillator Structures Using Network Transposition", Circuits and Systems, 2004, MWSCAS '04, The 2004 47th Midwest Symposium on, Issue Date: Jul. 25-28, 2004, pp. I-73-6.*
Cam et al., "A New CCII-Based Sinusoidal Oscillator Providing Fully Independent Control of Oscillation Condition and Frequency", Mcroelectronics Journal, vol. 29, Issue 11, Nov. 1998, pp. 913-919.*

* cited by examiner

*Primary Examiner* — Ryan Johnson
(74) *Attorney, Agent, or Firm* — Chun-Ming Shih

(57) ABSTRACT

Nth-order voltage- and current-mode arbitrary phase shift oscillator structures are synthesized using n operational transconductance amplifiers (OTAs) or second-generation current controlled conveyors (CCCIIs) and n grounded capacitors. Linking up the I/O characteristics of the OTA and the CCCII and the reactance of grounded capacitor, the step of synthesis is first based on the algebraic analysis to oscillatory characteristic equations, resulting in a quadrature oscillator structure. Secondly, instead of the quadrature characteristic, to control each output signal with one another by a desired phase difference > or <90°, selectively superposing any of two fundamental OTA/CCCII-C sub-circuitries benefits the transformation of quadrature to arbitrary-phase-shift characteristic for the sinusoidal oscillator structure. Furthermore, several compensation schemes are presented for reducing the output parameter deviation due to the non-ideal effects.

6 Claims, 56 Drawing Sheets

NTH-ORDER ARBITRARY-PHASE-SHIFT SINUSOIDAL OSCILLATOR STRUCTURE AND ANALYTICAL SYNTHESIS METHOD OF MAKING THE SAME

CROSS-REFERENCE

This application claims priority from U.S. Provisional Patent Application No. 61/170,809, filed on Apr. 20, 2009.

FIELD OF THE INVENTION

The present invention relates to nth-order any-phase-shift sinusoidal oscillator structure and more specifically using analytical synthesis method for the synthesis of the voltage-mode and current-mode nth-order any-phase-shift sinusoidal oscillator structure.

DESCRIPTION OF THE PRIOR ART

Quadrature or multiphase sinusoidal oscillators have been considerably attended by analog circuit designers especially for recent several years. For instance, the availability of I/Q local oscillator (LO) references is essential for the monolithic implementation of direct-conversion receivers [1]. The phase-locked loop (PLL) operates as an edge-combining type fractional-N frequency synthesizer/multiplier using multiphase clock signals from a ring-type voltage-controlled oscillator (VCO) [2-3]. Moreover, multiphase sampling clock can be applied to high-speed samplers for reducing the maximum clock frequency. All these usages typically require accurate phase delay among outputs. Thus, phase errors between the phases raises the fractional spurs at the output [4]; phase inaccuracy between the I/Q references limits the image rejection for image-reject receivers [5]. Ring oscillators are capable of generating multiphase outputs [6], [7]. However, they suffer from that the achieved phase accuracy poorer is the required power consumption more significant. Coupled LC oscillators can also generate multiphase outputs [8] but with performance trade-offs.

Very recently, in order to obtain arbitrary-phase-shift sinusoidal oscillators (which can be quadrature, or multiphase, or any-phase-shift oscillators such that their practical applications may be more various than those at present), a fractional calculus approach was applied to the design of oscillator structures [9] in which a fractance device is needed in the design.

In order to obtain any-phase-shift sinusoidal oscillator structures, a fractional calculus approach, which will be briefly shown as follows, was applied to the design of oscillator structures [10]. The Riemann-Liouville definition of a fractional derivative [11] is given by $$_0 d_t^\alpha f(t) \equiv D^\alpha f(t) = \frac{1}{\Gamma(1-\alpha)} \frac{d}{dt} \int_0^t (t-\tau)^{-\alpha} f(\tau) d\tau \quad \text{(D1)}$$

where $0 < \alpha < 1$. Applying Laplace transform to (D1) and assuming zero initial conditions, (D1) yields $$L\{_0 d_t^\alpha f(t)\} = s^\alpha F(s) \quad \text{(D2)}$$

Then, a fractance device is needed in the design. The fractional-order capacitances were investigated and proposed via semi infinite self-similar RC trees [12-13] for realizing $Z=1/C s \alpha$, where $\alpha=0.5$ or $\alpha<1$. FIG. 1 shows the circuit realization of a half-order capacitance. The infinite series tells us that the practical finite realization of such a capacitance exists an inevitable approximation error. In addition, a lot of capacitors and resistors to do the realization lead to a very large area on the IC chip. Since the fractional-order capacitance presented is not a simple two-terminal device, investigations of fractional-order capacitors remain limited and confine mostly to simulations of special case circuits due to the non-existence of a real fractance device.

If a linear system with three fractance devices of orders, $\alpha$, $\beta$, and $\gamma$, is given by [10]

$$\begin{pmatrix} D^\alpha x_1 \\ D^\beta x_2 \\ D^\gamma x_3 \end{pmatrix} = \begin{pmatrix} a_{11} & a_{12} & a_{13} \\ a_{21} & a_{22} & a_{23} \\ a_{31} & a_{32} & a_{33} \end{pmatrix} \begin{pmatrix} x_1 \\ x_2 \\ x_3 \end{pmatrix} \quad \text{(D3)}$$

the above system sustains sinusoidal oscillations provided that there exists a value for $\omega$ to satisfy the following equation [10]:

$$\omega^{\alpha+\beta+\gamma}\cos(\alpha+\beta+\gamma)\frac{\pi}{2} - a_{22}\omega^{\alpha+\gamma}\cos(\alpha+\gamma)\frac{\pi}{2} - \quad \text{(D4)}$$
$$a_{33}\omega^{\alpha+\beta}\cos(\alpha+\beta)\frac{\pi}{2} - a_{11}\omega^{\beta+\gamma}\cos(\beta+\gamma)\frac{\pi}{2} +$$
$$\omega^\alpha |A_\alpha|\cos\frac{\alpha\pi}{2} + \omega^\beta |A_\beta|\cos\frac{\beta\pi}{2} + \omega^\gamma |A_\gamma|\cos\frac{\gamma\pi}{2} - |A| = 0$$

And its counterpart equation obtained by replacing every $\cos(\bullet)$ term in (D4) with a $\sin(\bullet)$ term and removing the last $-|A|$ term. Here, $|A|$ is the determinant of the 3×3 matrix, $|A_\alpha|=a_{22}a_{33}-a_{23}a_{32}$, $|A_\beta|=a_{11}a_{33}-a_{13}a_{31}$, and $|A_\gamma|=a_{11}a_{22}-a_{12}a_{21}$. If $\alpha=\beta=\gamma$, then $$\omega = \left[ tr(A) \left( \frac{\cos\frac{\alpha\pi}{2} + \sqrt{\cos^2\frac{\alpha\pi}{2} + \frac{|A_{\alpha\beta\gamma}|}{tr^2(A)}\left(1 - 4\cos^2\frac{\alpha\pi}{2}\right)}}{4\cos^2\frac{\alpha\pi}{2} + 1} \right) \right]^{\frac{1}{\alpha}}, \quad \text{(D5)}$$

$$\alpha \neq \frac{2}{3};$$

$$\omega = \left( \frac{|A_{\alpha\beta\gamma}|}{tr(A)} \right)^{3/2}, \quad \alpha = \frac{2}{3}$$

where $|A_{\alpha\beta\gamma}|=|A_\alpha|+|A_\beta|+|A_\gamma|$ and $tr(A)=a_{11}+a_{22}+a_{33}$. The design procedure and practical examples using the concept of fractional calculus for realizing sinusoidal oscillators with any phase shifts are shown in [10]. Because (i) the whole design procedure involves in a set of complicated mathematical operations like (D4) and (D5), and because (ii) the fractional-order capacitor is constructed by an infinite series of resistors and capacitors (for example, shown in FIG. 1), the application of fractional calculus to the design of any-phase-shift sinusoidal oscillators is quite difficult to follow for designers and hard to be realized practically in the integrated circuit. Therefore, how to synthesize any-phase-shift sinusoidal oscillator structures using a simple methodology (easy to follow) and using practical elements (easy to be fabricated on an IC chip) becomes a valuable research work. A new idea for realizing an nth-order (note that the previous one [10] cannot realize nth-order quadrature oscillator structure, which can only realize the second-order quadrature oscillator [10]) any-phase-shift sinusoidal oscillator structure is briefly explained as follows.

In the literature, several different kinds of second-order quadrature sinusoidal oscillators were published [14-27]. The most simplified single current-feedback-operational-amplifier (CFOA)-based (resp. single fully-differential-current-conveyor (FDCCII)-based) second-order quadrature oscillators [16] (resp. [17]) were presented using two floating/grounded capacitors and three floating/grounded resistors (resp. two grounded capacitors and three grounded resistors) in addition to one big active element, CFOA, constructed by one plus-type second-generation current conveyor in cascade with one operational amplifier (resp. FDCCII which is composed of 36 transistors, equivalent to the size of two ordinary active elements). The most simplified second-/first-generation current-conveyor based quadrature oscillator was proposed using two grounded capacitors, and three grounded resistors [18] unlike [19] employing one more grounded resistor or a grounded resistor replaced by a floating resistor. In the literature, the most simplified OTA-based second-order quadrature oscillator, which has the characteristic equation, $a_2s^2+(a_1-b_1)s+a_0=0$, was designed using only three single-ended-input OTAs and two grounded capacitors (FIG. 5($b$) in [22]). Note that the above second-order quadrature oscillator is with both the condition of oscillation and the frequency of oscillation. However, the simplest second-order Operational Transconductance Amplifier-Capacitor (OTA-C) oscillator structure uses only two integrators, i.e., two single-ended-input OTAs and two grounded capacitors, which realizes the characteristic equation, $a_2s^2+a_0=0$, without the condition of oscillation [26, 27]. Although the simplest ideal oscillators [26, 27] enjoy the minimum number of active and passive components, yet the simplest ideal one (i) cannot absolutely confirm its oscillation due to no obedience of the condition of oscillation (then, two additional OTAs are needed for the confirmation [26, 27]) and (ii) cannot be used to expand its quadrature characteristic to arbitrary-phase-shift merit using the approach proposed in this paper. Hence, it is another valuable piece of research work to synthesize a second-order quadrature sinusoidal oscillator with the characteristic equation, $a_2s^2+(a_1-b_1)s+a_0=0$, using only "two" (not three) OTAs and two grounded capacitors.

On the other hand, if we would like to have three voltage output oscillation signals simultaneously from an oscillator, a voltage-mode third-order sinusoidal oscillator may be a good choice.

The characteristic equation of the third-order sinusoidal oscillators is given by [28-30]

$$a_3s^3+a_2s^2+a_1s+a_0=0 \quad (D6)$$

$$\text{in which } -ja_3\omega_o^3+ja_1\omega_o=0 \quad (D7)$$

$$\text{and } -a_2\omega_o^2+a_0=0 \quad (D8)$$

when $S=j\omega_o$.

Then, the angular frequency of oscillation (FO) is $$\omega_o = \sqrt{\frac{a_1}{a_3}} = \sqrt{\frac{a_o}{a_2}} \quad (D9)$$

the condition of oscillation (CO) is $$a_1a_2=a_3a_o \quad (D10)$$

Note that all the four coefficients, $a_3$, $a_2$, $a_1$, and $a_0$, need to be with the same sign, namely, all positive or all negative.

The above characteristic equation, shown in (D6), of the third-order sinusoidal oscillators can be deduced to an nth-order case shown as below.

$$a_ns^n+a_{n-1}s^{n-1}+a_{n-2}s^{n-2}+\ldots+a_1s+a_0=0 \quad (D11)$$

It is evident that both zero requirements for real and imaginary parts on the left side of the equation supply both CO and FO of the nth-order sinusoidal oscillator.

Recently, many voltage-mode or/and current-mode second or third-order quadrature oscillators were proposed [28-42]. However, none of them presented the scheme for synthesizing a quadrature sinusoidal oscillator with two node voltages or through currents having the phase difference of 90°. The simplest topology with the characteristic of quadrature may be a single-ended-input OTA, acted as a grounded trans-conductance, gm, and a grounded capacitor C to make two node voltages, V1 and V2, have the following relationship:

$$\frac{V_1}{V_2} = \frac{-g_m}{sC} \quad (D12)$$

It is evident that when the phase angles of V1 and V2 are 180° and 90°, respectively, V2 lags behind V1 by 90°. Moreover, the above phase difference 90° may be reduced using one of the following two simple approaches:

(i) $\quad$ (D13)

$$\frac{V_1}{V_2} = \frac{-g_m+sC_1}{sC}$$

(ii) $\quad$ (D14)

$$\frac{V_1}{V_2} = \frac{-g_m}{-g_2+sC}$$

In (C13), C1 is added to the place in parallel with the −gm such that the phase angle of V1 is with a decrement through C1. In (D14), −g2 is added to the place in parallel with the sC such that the phase angle of V2 is with an increment through −g2. Both of the above two approaches lead to the result: V2 lags behind V1 by an angle lower than 90° (for example, 60°). If we would like to use fewer capacitors in an integrated circuit (since the chip area of a capacitor is much larger than that of a trans-conductance, i.e. an OTA, and the accuracy of the capacitance of a capacitor manufactured in an integrated circuit is difficult to be guaranteed), the scheme of approach (D14) may be better than that of approach (D13).

On the contrary, the phase difference 90° of (D12) may be increased using one of the following two simple approaches:

(i) $\quad$ (D15)

$$\frac{V_1}{V_2} = \frac{-g_m-sC_1}{sC}$$

(ii) $\quad$ (D16)

$$\frac{V_1}{V_2} = \frac{-g_m}{g_2+sC}$$

In (D15), −C1 is added to the place in parallel with the −gm such that the phase angle of V1 is with an increment through −C1. In (D16), g2 is added to the place in parallel with the sC such that the phase angle of V2 has a decrement through g2. Both of the above two approaches lead to the result: V2 lags behind V1 by an angle larger than 90° (for example, 120°, but lower than) 180°. If we would like to use fewer capacitors in an integrated circuit, the scheme of approach (D16) may be better than that of approach (D15).

Therefore, if we would like to synthesize an nth-order any-phase-shift sinusoidal oscillator structure, how to synthesize the relationships, (D11), (D12), (D14), and (D16), simultaneously, is the main object in this patent.

SUMMARY OF THE INVENTION

Recently, the analytical synthesis methods [20-25] were clearly demonstrated to be very effective for achieving the following three important criteria, simultaneously, for the design of OTA-C filters:
- circuits use grounded capacitors because they can absorb equivalent shunt capacitive parasitics;
- circuits employ only single-ended-input OTAs to overcome the feed-through effects due to finite input parasitic capacitances associated with double-input OTAs;
- circuits have the minimum number of active and passive components for a given order to reduce total parasitics, power consumption, chip areas, and noise.

None of the analytical synthesis methods has been applied to the design of oscillator structures. And none of the nth-order any-phase-shift sinusoidal oscillator structures has been presented although an any-phase-shift sinusoidal oscillator structure with two or three fractance devices was proposed very recently using a sophisticated fractional calculus approach and employing fractional-order capacitors [10]. The voltage and current-mode nth-order quadrature oscillator structure with the minimum number of active and passive components is synthesized first in this patent using single-ended-input operational transconductance amplifiers (OTAs) and grounded capacitors by the application of a new analytical synthesis method to (i) the characteristic equation of an nth-order oscillator structure and (ii) the quadrature relationship of two node voltages.

Superposing the synthesized sub-circuitries with node voltages having phase shift smaller or larger than 90° to the quadrature oscillator structure, a voltage-mode and current-mode nth-order any-phase-shift OTA-C sinusoidal oscillator structure is then obtained.

The non-ideal trans-conductance function G(s) of an OTA and the parasitic capacitances and conductances on an IC chip deviate the output sinusoidal signals. The compensation schemes are presented and improve the accuracies of the oscillation frequency, the total harmonic distortions (THDs), and the phase shifts with the errors lower than 1% for a fourth-order case with phase shifts, 90°, 120°, and 60°. H-Spice simulations with 0.35 μm process are supplied for validating the theoretical predictions.

The analytical synthesis method may be able to be used for the synthesis of the voltage-mode and current-mode nth-order any-phase-shift sinusoidal oscillator structure. Using a succession of innovative algebra process to decompose a complicated nth-order transfer function, which involves in both the characteristic equation (D11) and the quadrature (with phase shift 90°) relationship (D12), into a set of simple equations is presented in Section II. The realization uses all single-ended-input OTAs and all grounded capacitors and the minimum number of active and passive components. Two more requirements, (D14) and (D16), and their equivalent OTA-C circuitries are then superposed to the above nth-order quadrature sinusoidal oscillator structure for constructing an nth-order "any-phase-shift" sinusoidal oscillator structure.

The new methodology for synthesizing an nth-order any-phase-shift sinusoidal oscillator structure is much simpler in the derivation than the previous one [10] and then easy to follow for readers. Moreover, the elements, single-ended-input OTAs and grounded capacitors, used in the new synthesis are easily fabricated, unlike the fractional-order capacitors employed in [10] difficult to be manufactured, in the integrated circuit. Five examples, (i) a third-order oscillator with two 90° phase shifts, (ii) a third-order one with two 120° phase shifts, (iii) a third-order one with two 60° phase shifts, (iv) a fourth-order one with three 90° phase shifts, and (v) a fourth-order one with phase shifts, 90°, 120°, and 60°, are given to demonstrate the new nth-order any-phase-shift OTA-C sinusoidal oscillator structure. H-Spice simulation with 0.35 μm process is given to do the demonstration. From (i) the frequency of oscillation, (ii) the phase shift, and (iii) the total harmonic distortion (THD) points of view, the simulation results are in agreement with theory.

Nevertheless, the non-ideal (or practical) trans-conductance of an OTA is not just a real number, which is a frequency dependent function, denoted by G(s) equal to gm/(1+s/ωo), and approximated by gm(1−sT) [49] The inevitable parasitic capacitance and conductance on an IC chip should also be inserted into (D12), (D14), and (D16). Then, (D12), (D14), and (D16) become $$\frac{V_1}{V_2} = \frac{-g_m(1-sT)}{sC+sC_p+G_p} \quad (D17)$$

$$\frac{V_1}{V_2} = \frac{-g_m(1-sT)}{-g_2(1-sT_2)+sC+sC_p+G_p} \quad (D18)$$

$$\frac{V_1}{V_2} = \frac{-g_m(1-sT)}{g_2(1-sT_2)+sC+sC_p+G_p} \quad (D19)$$

These non-ideal factors stated above make output signals be with a deviation different from the theory. The compensation schemes for the reduction of the deviations of the phase shifts and the frequency of oscillation are presented and verified. For a fourth-order case with three phase shifts, 90°, 120°, and 60°, after carrying out the compensation schemes relevant to phase shifts, in addition to the enjoyment of very precise phase shifts within 1% error, the THDs, simultaneously, have been improved to the values much smaller than the standard value, 1%, and the frequency of oscillation to an error, only 0.36%, without varying any capacitances.

BRIEF DESCRIPTION OF THE DRAWINGS

Other objects, features, and advantages of the present invention will become apparent from the following detailed description of the preferred but non-limiting embodiment. The description is made with reference to the accompanying drawings in which.

DETAILED DESCRIPTION OF THE PREFERRED EMBODIMENT

1. Second-Order Quadrature Oscillator Structure

Analytical synthesis methods (ASMs) have been demonstrated [43-47] to be very effective for simultaneously achieving three important criteria for the design of OTA-C filters [49]. It applies a series of algebraic operations to decompose a complicated transfer function into a set of simple and feasible equations. The final circuit structure is then constructed by superposing those sub-circuitries realized from the above simple equations. Several different kinds of decompositions lead to distinct kinds of filter structures [43-47]. However, none of the previous analytical synthesis methods has been used to synthesize a sinusoidal oscillator. In this section, we focus our attentions to the generation of second-order quadrature (90° phase shift) oscillator structures. The characteristic equation of a second-order sinusoidal oscillator is $$a_2 s^2 + (a_1 - b_1)s + a_0 = 0 \qquad (a1)$$

where the condition of oscillation (CO) is $$a_1 = b_1 \qquad (a2)$$

and the angular frequency of oscillation (FO) is $$\omega_o = \sqrt{a_0/a_2} \qquad (a3)$$

In addition to these, if an oscillator is quadrature, then the phase relationship between two node voltages, $V_1$ and $V_2$, in an oscillator may be $$\frac{V_1}{V_2} = \frac{\pm g_m}{sC} \tag{a4}$$

such that $V_1$ lags (resp. leads ahead) $V_2$ by 90° if the sign is +(resp. −) in (a4). A new analytical synthesis method (ASM) for synthesizing (a1) by OTAs and grounded capacitors is shown as below.

Multiplying and dividing both sides of (a1) by a node voltage $V_1$ and $a_2$, respectively, $$\left[s^2 + \left(\frac{a_1}{a_2} - \frac{b_1}{a_2}\right)s + \frac{a_0}{a_2}\right]V_1 = 0 \tag{a5}$$

Note that the minimum number of transconductances or OTAs to realize (a5) is three, for synthesizing the three different coefficients, $a_1/a_2$, $b_1/a_2$, and $a_0/a_2$, and the minimum number of capacitances is two, for realizing $s^2$. However, there exists a simpler realization of (a5). If $a_0/a_2$ is arranged as the product of two elements, $(a_1/a_2)$ and $(b_1/a_2)$, then only two (not three) different transconductances, namely, $(a_1/a_2)$ and $(b_1/a_2)$, of two OTAs, are needed for the design of a quadrature oscillator. Consequently, (a5) can be re-written as $$\left[s^2 + \left(\frac{a_1}{a_2} - \frac{b_1}{a_2}\right)s + \left(\frac{a_1}{a_2}\right)\left(\frac{b_1}{a_2}\right)\right]V_1 = 0 \tag{a6}$$

Dividing both sides of (a6) by s, (a6) becomes $$\left[s + \left(\frac{a_1}{a_2} - \frac{b_1}{a_2}\right) + \frac{(a_1/a_2)(b_1/a_2)}{s}\right]V_1 = 0 \tag{a7}$$

Let $V_2 = \frac{(a_1/a_2)}{s}V_1$ or \tag{a8}

$$V_2 = \frac{-(b_1/a_2)}{s}V_1 \tag{a9}$$

Then, (a7) is $$\left[s + \left(\frac{a_1}{a_2} - \frac{b_1}{a_2}\right)\right]V_1 + \left(\frac{b_1}{a_2}\right)V_2 = 0 \tag{a10}$$

or $\left[s + \left(\frac{a_1}{a_2} - \frac{b_1}{a_2}\right)\right]V_1 - \left(\frac{a_1}{a_2}\right)V_2 = 0$ \tag{a11}

Figure 3:
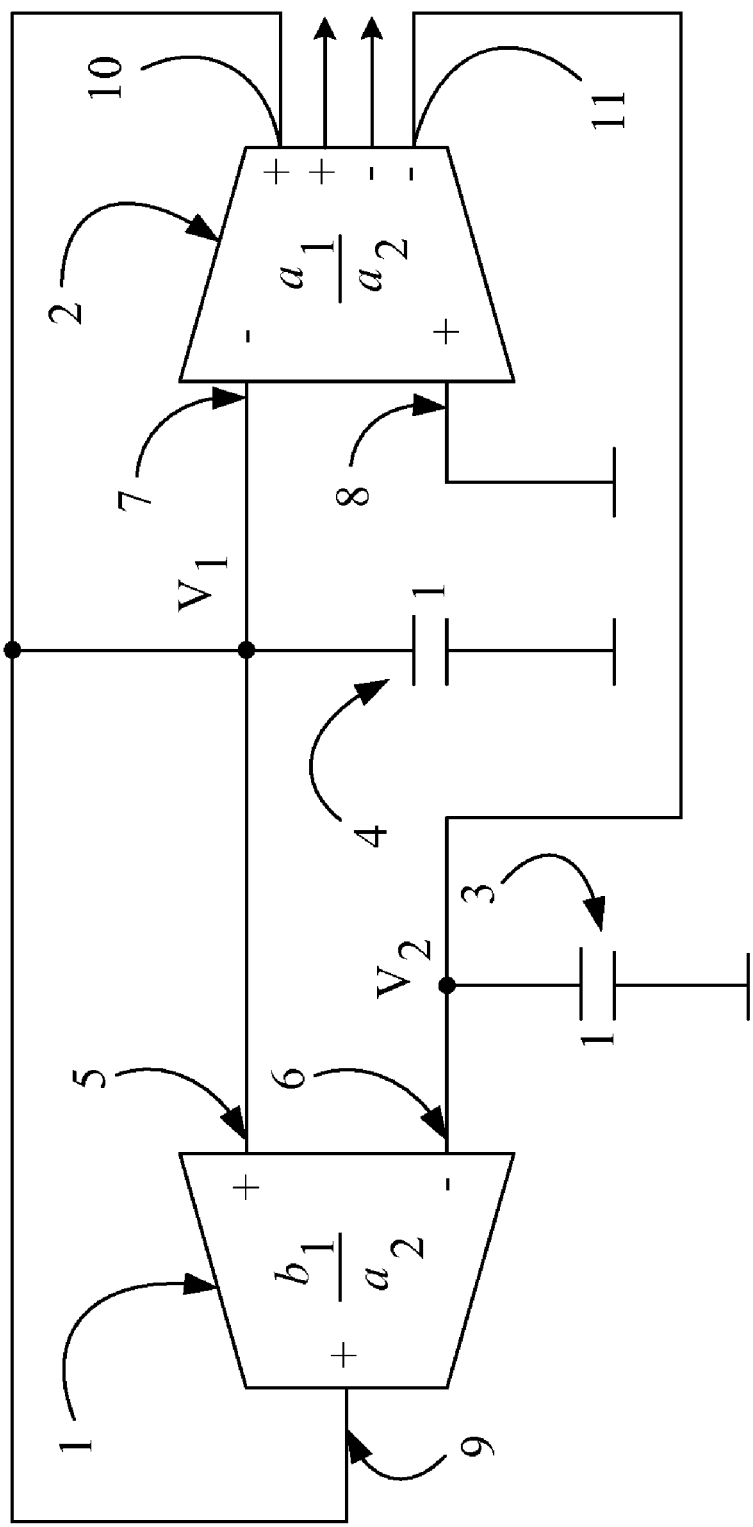
FIG. 3 is a circuit diagram of the second order OTA-C quadrature oscillator structure with phase of $V_1$ leads ahead that of $V_2$ by 90°.

The combination of the OTA-C sub-circuitries for realizing (a8) and (a10) (resp. (a9) and (a11)) is shown in FIG. 3 (resp. 4). Only two OTAs and two grounded capacitors are used in the design. An nth-order arbitrary-phase-shift sinusoidal oscillator structure in which its second order and quadrature phase shift, comprising a first ground capacitor 4, a second ground capacitor 3, a first operational transconductance amplifier 1 and a second operational transconductance amplifier 2. The noninverting output 10 of the second operational transconductance amplifier 2 is connected to a first ground capacitor 4, the first input 7, 5 of the first and second operational transconductance amplifier 1, 2, and output 9 of the first operational transconductance amplifier 1, the inverting output 11 of the second operational transconductance amplifier 2 connecting to the second ground capacitor 3 and second input 6 of the first operational transconductance amplifier 1, the second input 8 of the second operational transconductance amplifier 2 is connected to the ground.

Referring to FIG. 3, the transconductance of the first operational transconductance amplifier 1 can also be b1/a2 and transconductance of the second operational transconductance amplifier 2 is a1/a2, the first input 5 of the first operational transconductance amplifier 1 and the second input 8 of the second operational transconductance amplifier 2 are noninverting input, the second input 6 of the first operational transconductance amplifier 1 and the first input 7 of the second operational transconductance amplifier 2 are inverting input.

Figure 4:
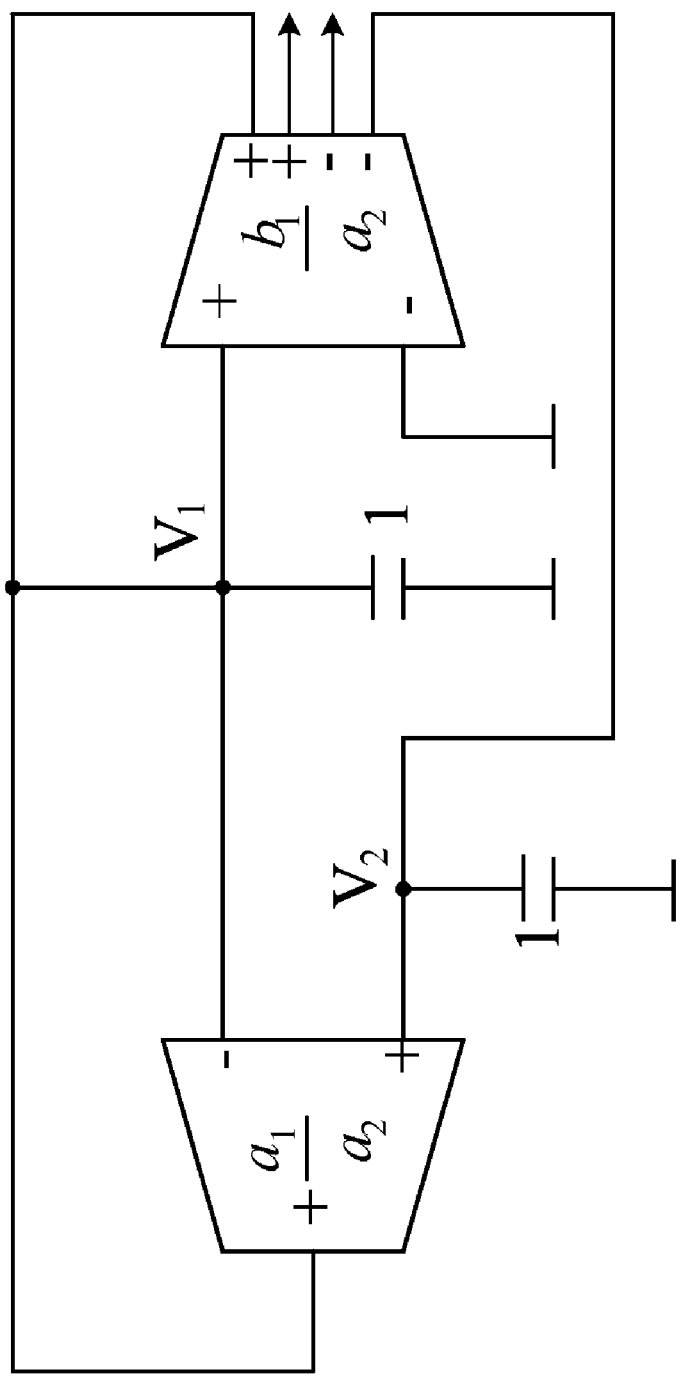
FIG. 4 is a circuit diagram of second order OTA-C quadrature oscillator structure with phase of $V_1$ lags that of $V_2$ by 90°.
Figure 4A:
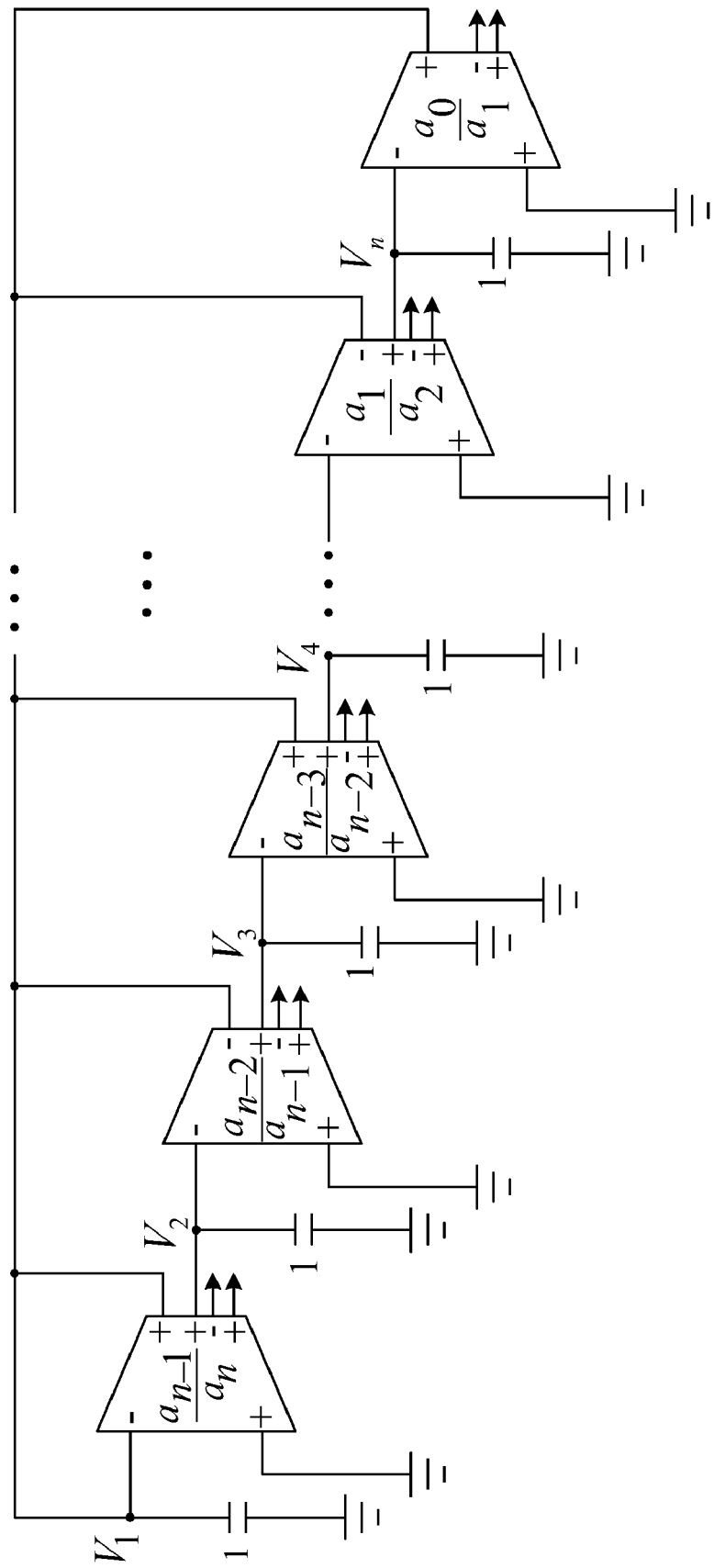
FIG. 4A is a circuit diagram of the voltage-mode and current-mode OTA-C quadrature oscillator structure (n is odd)
Figure 4B:
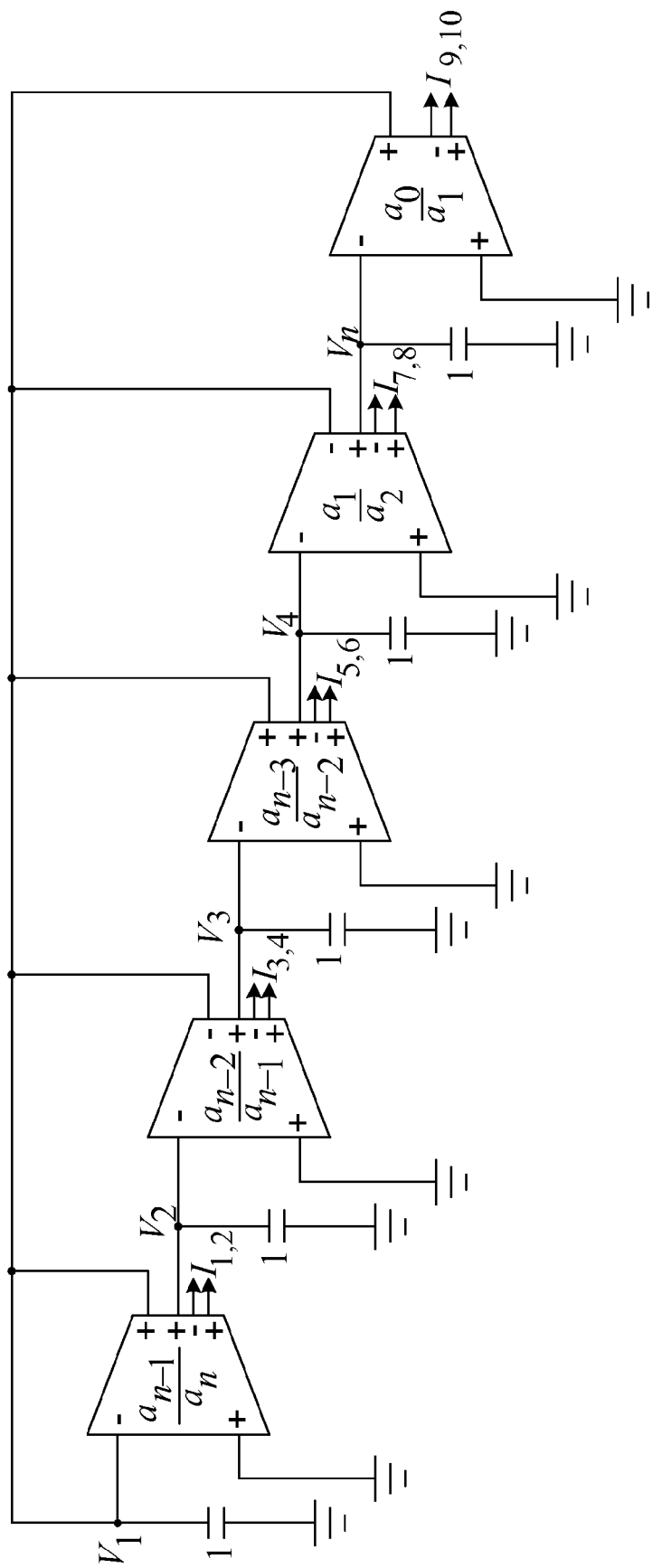
FIG. 4B is a circuit diagram of the fifth-order OTA-C quadrature oscillator structure.

Referring to another FIG. 4 of the transconductance of the first operational transconductance amplifier 1 can also be a1/a2 and transconductance of the second operational transconductance amplifier 2 is b1/a2, the first input 5 of the first operational transconductance amplifier 1 and the second input 8 of the second operational transconductance amplifier 2 are inverting input, the second input 6 of the first operational transconductance amplifier 1 and the first input 7 of the second operational transconductance amplifier 2 are noninverting input. Also, the second and first grounded capacitor can have unity capacitance.

Note that the phase of $V_1$ leads ahead that of $V_2$ by 90° in FIG. 3 and the phase of $V_1$ lags that of $V_2$ by 90° in FIG. 4. The proposed oscillator structures, shown in FIGS. 3 and 4, are different from the previous ones [14-27].

2. Analytical Synthesis of High-Order Quadrature Oscillator Structure

The characteristic equation of the voltage-mode and current-mode nth-order (where n is an integer larger than two) quadrature oscillator structure is shown as below.

$$a_n s^n + a_{n-1} s^{n-1} + a_{n-2} s^{n-2} + \ldots + a_2 s^2 + a_1 s + a_0 = 0 \tag{1}$$

The minimum number of OTAs and passive capacitors used in the design for realizing (1) is considered as follows. N capacitances are needed for realizing the nth-order term, $a_n s^n$, and n transconductances are also required for synthesizing the remaining n different coefficients, an−1, an−2 . . . , a2, a1, and a0. Therefore, n OTAs and n capacitors are the minimum number active and passive components necessary for designing an nth-order quadrature sinusoidal oscillator structure. The new analytical synthesis method for realizing (20) is shown as follows.

Dividing by $a_n s^{n-1}$, multiplying by V1 and re-arranging, (1) becomes $$V_1\left(s + \frac{a_{n-1}}{a_n}\right) + V_1\left(\frac{a_{n-2}}{a_n s} + \frac{a_{n-3}}{a_n s^2} + \ldots + \frac{a_2}{a_n s^{n-3}} + \frac{a_1}{a_n s^{n-2}} + \frac{a_0}{a_n s^{n-1}}\right) = 0 \tag{2}$$

Since $$\left(\frac{a_0}{a_n}\right) = \prod_{i=0}^{n-1}\left(\frac{a_i}{a_{i+1}}\right),$$

$$\left(\frac{a_1}{a_n}\right) = \prod_{i=1}^{n-1}\left(\frac{a_i}{a_{i+1}}\right), \ldots,$$

$$\left(\frac{a_{n-2}}{a_n}\right) = \prod_{i=n-2}^{n-1}\left(\frac{a_i}{a_{i+1}}\right),$$

$$\left(\frac{a_{n-1}}{a_n}\right) = \prod_{i=n-1}^{n-1}\left(\frac{a_i}{a_{i+1}}\right)$$

(3)

(2) becomes $$V_1\left(s + \frac{a_{n-1}}{a_n}\right) + V_1 \sum_{j=0}^{n-2}\left[\frac{\prod_{i=j}^{n-1}\left(\frac{a_i}{a_{i+1}}\right)}{s^{n-1-j}}\right] = 0 \quad (4)$$

PART I: If n is an odd integer, then (4) can be represented by $$V_1\left(s + \frac{a_{n-1}}{a_n}\right) + V_1 \sum_{j=0}^{n-2}\left[\frac{(-1)^j\left(\frac{a_j}{a_{j+1}}\right)\prod_{i=j+1}^{n-1}\left(-\frac{a_i}{a_{i+1}}\right)}{s^{n-1-j}}\right] = 0 \quad (5)$$

or $$V_1\left(s + \frac{a_{n-1}}{a_n}\right) + V_1 \sum_{j=0}^{n-2}\left[\frac{(+1)^j\left(\frac{a_j}{a_{j+1}}\right)\prod_{i=j+1}^{n-1}\left(+\frac{a_i}{a_{i+1}}\right)}{s^{n-1-j}}\right] = 0$$

Therefore, we can let $$V_1\left(-\frac{a_{n-1}}{a_n}\right)\frac{1}{s} \equiv V_2 \text{ or } V_1\left(+\frac{a_{n-1}}{a_n}\right)\frac{1}{s} \equiv V_2 \quad (6\text{-}1)$$

for each from the first term to the last term in the bracket of (5). And we can let $$V_2\left(-\frac{a_{n-2}}{a_{n-1}}\right)\frac{1}{s} \equiv V_3 \text{ or } V_2\left(+\frac{a_{n-2}}{a_{n-1}}\right)\frac{1}{s} \equiv V_3 \quad (6\text{-}2)$$

for each from the second term to the last term in the bracket of (5).
And then, we can let $$V_{n-2}\left(-\frac{a_2}{a_3}\right)\frac{1}{s} \equiv V_{n-1} \text{ or } V_{n-2}\left(+\frac{a_2}{a_3}\right)\frac{1}{s} \equiv V_{n-1} \quad (6\text{-}n\text{-}2)$$

for each from the (n-2)th term to the last term in the bracket of (5). Finally, we can let $$V_{n-1}\left(-\frac{a_1}{a_2}\right)\frac{1}{s} \equiv V_n \text{ or } V_{n-1}\left(+\frac{a_1}{a_2}\right)\frac{1}{s} \equiv V_n \quad (6\text{-}n\text{-}1)$$

for the last term in the bracket of (5). (6-1) to (6-n-1) can be combined as the following (6).

$$V_{n-j+1} = V_{n-j}\frac{\left(-\frac{a_j}{a_{j+1}}\right)}{s} \text{ for } j = 1, 2, 3\ldots, n-2, \text{ and } n-1. \quad (6)$$

or $$V_{n-j+1} = V_{n-j}\frac{\left(+\frac{a_j}{a_{j+1}}\right)}{s} \text{ for } j = 1, 2, 3\ldots, n-2, \text{ and } n-1. \quad (6^*)$$

Eq. (6) (resp. 6*) controls the phase angle relationship between Vn−j+1 and Vn−j. If the phase of Vn−j+1 is 180° (resp. 0°) due to the numerator, −aj/aj+1 (resp. aj/aj+1), then the phase of Vn−j is 90° due to the denominator, s, which is equal to jω. Then, the phase of Vn−j (with the phase angle 90°) lags (reap. Leads) Vn−j+1 (with the phase angle 180° (resp. 0°)) by 90° (or a quadrature) in which j=1, 2, 3 . . . , n−2, and n−1. It means that the realized circuit is a quadrature sinusoidal oscillator with n node voltages having the following phase relationship $$\angle V_{n-j} \pm 90° = \angle V_{n-j+1} \text{ for } j=1, 2, 3 \ldots, n-2, \text{ and } n-1. \quad (7)$$

And (5) becomes $$V_1\left(s + \frac{a_{n-1}}{a_n}\right) + V_2\left(-\frac{a_{n-2}}{a_{n-1}}\right) + V_3\left(\frac{a_{n-3}}{a_{n-2}}\right) +$$
$$V_4\left(-\frac{a_{n-4}}{a_{n-3}}\right) + \ldots + V_{n-1}\left(-\frac{a_1}{a_2}\right) + V_n\left(\frac{a_0}{a_1}\right) = 0$$

$$V_1\left(s + \frac{a_{n-1}}{a_n}\right) + V_2\left(+\frac{a_{n-2}}{a_{n-1}}\right) + V_3\left(\frac{a_{n-3}}{a_{n-2}}\right) +$$
$$V_4\left(+\frac{a_{n-4}}{a_{n-3}}\right) + \ldots + V_{n-1}\left(+\frac{a_1}{a_2}\right) + V_n\left(\frac{a_0}{a_1}\right) = 0$$

which is the last constraint:

$$V_1 s + \sum_{j=0}^{n-1}\left[(-1)^j V_{n-j}\left(\frac{a_j}{a_{j+1}}\right)\right] = 0 \quad (8)$$

or $$V_1 s + \sum_{j=0}^{n-1}\left[(+1)^j V_{n-j}\left(\frac{a_j}{a_{j+1}}\right)\right] = 0 \quad (8^*)$$

Figure 1:
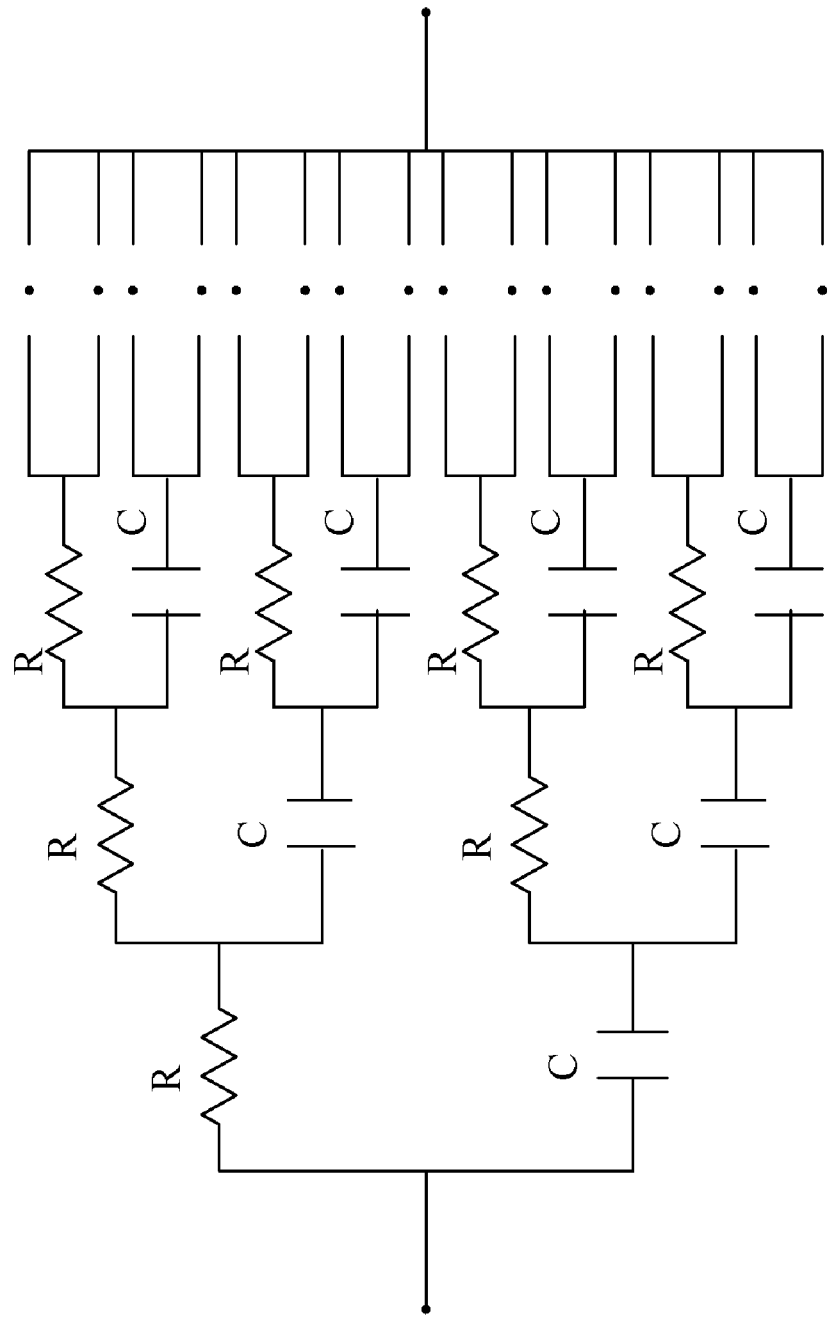
FIG. 1 is a circuit realization of a half-order capacitance.
Figure 2:
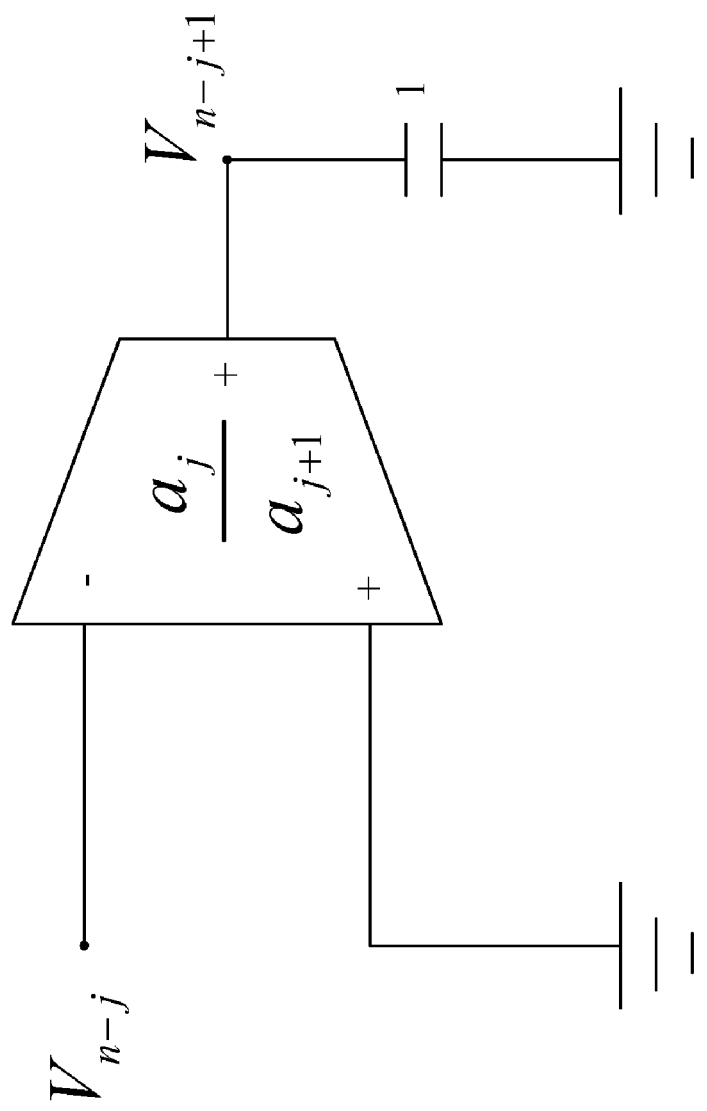
FIG. 2 is a circuit diagram of the realized OTA-C sub-circuitry of formula (6)

The realized OTA-C sub-circuitry of (6) is shown in FIG. 2, in which one single-ended-input OTA with the transconductance aj/aj+1 is connected with a grounded capacitor having unity capacitance.

The last constraint equation, (8), including V1, V2, V3. . . , Vn−1, and Vn, is used for the connection of the n-1 realized sub-circuitries of (6) shown in FIG. 2. The complete OTA-C circuit structure realized from (6) and (8) is shown in FIG. 3 which is the voltage and current-mode nth-order single-ended-input OTA and grounded capacitor quadrature oscillator structure in which n is an odd integer.

Similarly, the other single-ended-input OTA and grounded capacitor quadrature oscillator structure realized from (6*) and (8*) can also be easily obtained.

Figure 5:
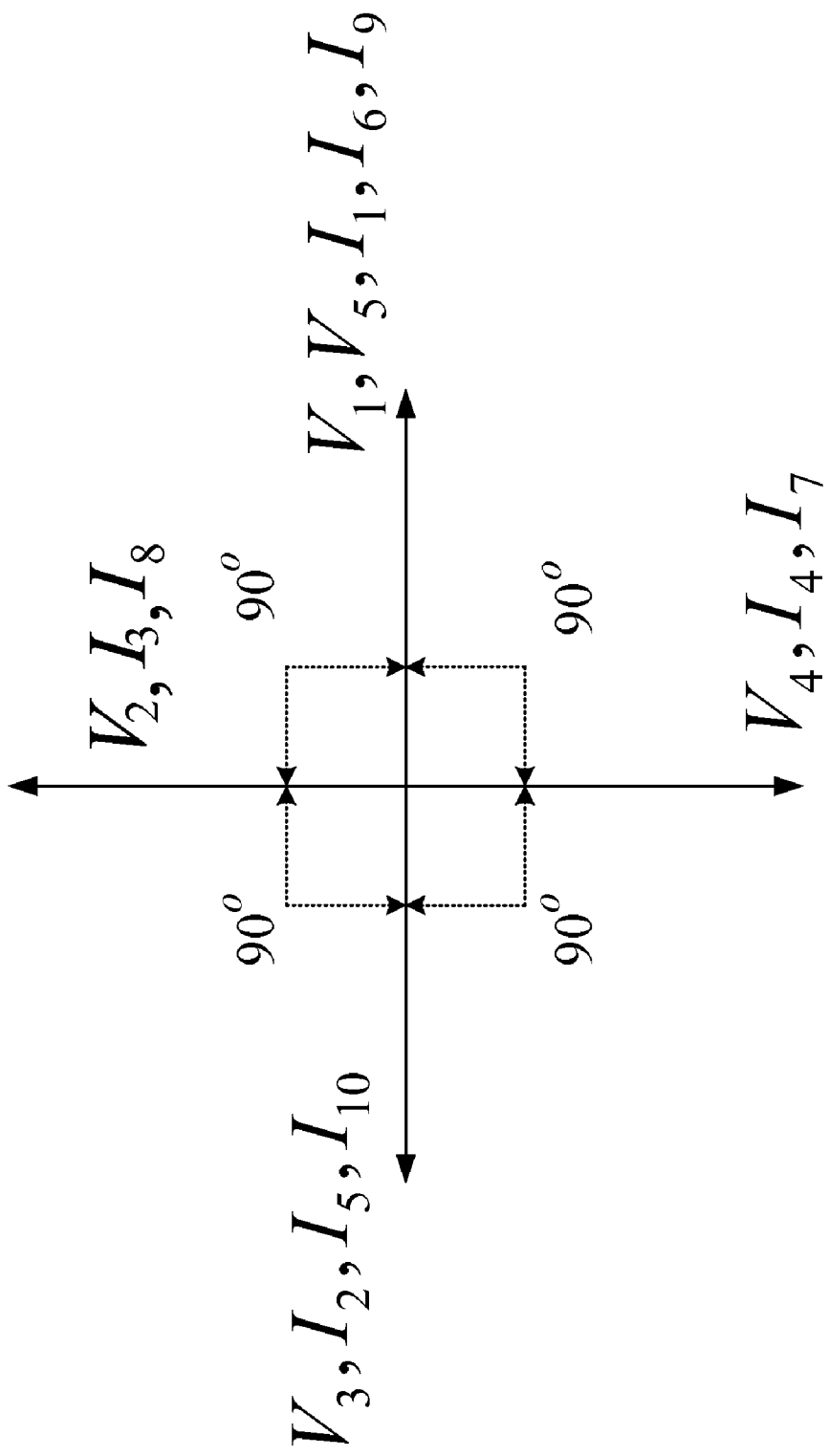
FIG. 5 shows the quadrature phase sequence of the output signals of FIG. 4.

Only n grounded capacitors and n single-ended-input OTAs, the minimum number active and passive components, are employed. Equal capacitance is also used in the design for preventing from the difficulty to fabricate different capacitances with keen accuracy to several digits in an integrated circuit. The phase of Vi lags behind that of Vi+1 by 90°, and the output current from the upper (resp. lower) terminal of each OTA is with the same phase (resp. the inverse phase) as the input voltage of the OTA. A fifth-order quadrature oscillator structure, presented in FIG. 4, has five node voltages with 90° phase difference sequence and ten output currents with quadrature phase shift as well (presented in FIG. 5). The current output of each OTA is with very high output impedance and cascadable to next current-mode stage.

Figure 6:
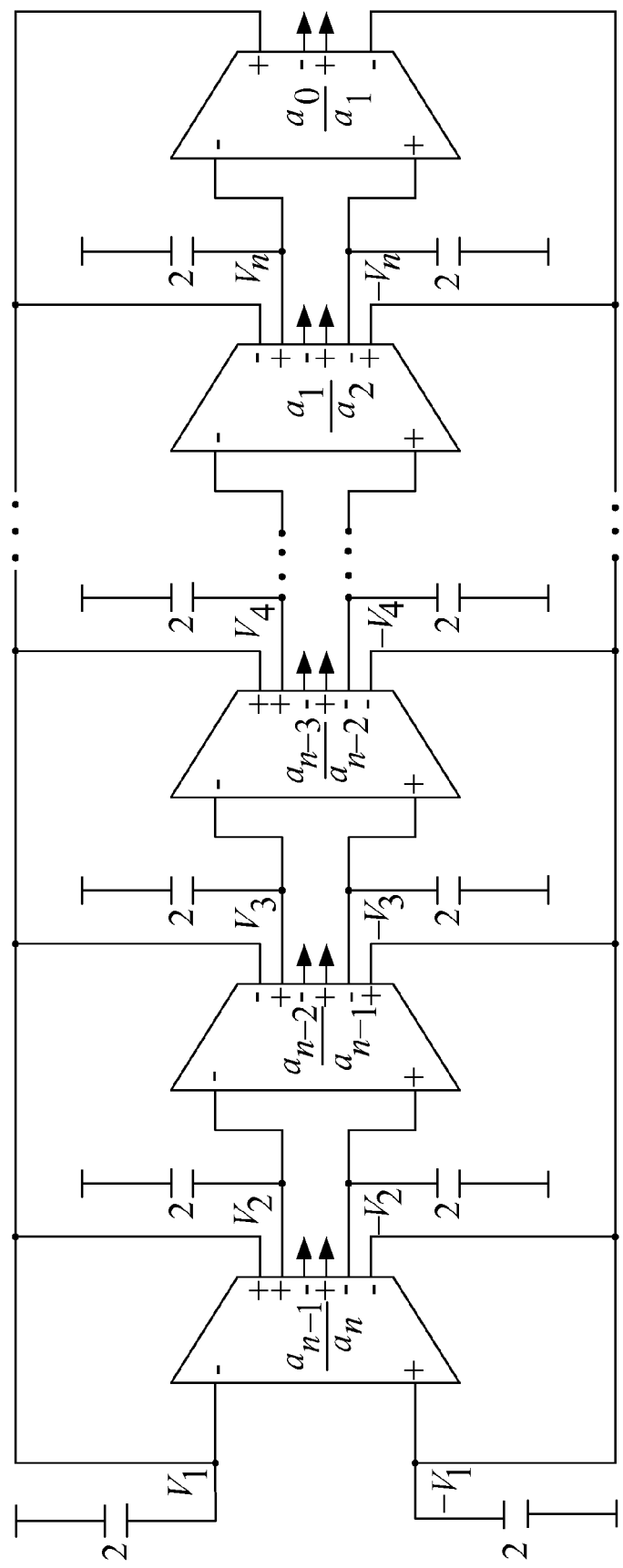
FIG. 6 is a circuit diagram of the fully differential OTA-grounded C quadrature oscillator structure (n is odd)

It has been well known [50] that the single-ended-input OTA and grounded C circuit structure shown in FIG. 3 can be easily converted to a fully differential OTA and grounded C circuit structure shown in FIG. 6 with much lower noise.

PART II: If n is an even integer, then (4) can be represented by $$V_1\left(s + \frac{a_{n-1}}{a_n}\right) + V_1 \sum_{j=0}^{n-2}\left[\frac{(-1)^{j+1}\left(\frac{a_j}{a_{j+1}}\right)\prod_{i=j+1}^{n-1}\left(-\frac{a_i}{a_{i+1}}\right)}{s^{n-1-j}}\right] = 0 \quad (9)$$

or $$V_1\left(s + \frac{a_{n-1}}{a_n}\right) + V_1 \sum_{j=0}^{n-2}\left[\frac{(+1)^{j+1}\left(\frac{a_j}{a_{j+1}}\right)\prod_{i=j+1}^{n-1}\left(+\frac{a_i}{a_{i+1}}\right)}{s^{n-1-j}}\right] = 0 \quad (9^*)$$

Therefore, we can let $$V_{n-j+1} = V_{n-j}\frac{\left(-\frac{a_j}{a_{j+1}}\right)}{s} \text{ for } j = 1, 2, 3\ldots, n-2, \text{ and } n-1. \quad (10)$$

$$V_{n-j+1} = V_{n-j}\frac{\left(+\frac{a_j}{a_{j+1}}\right)}{s} \text{ for } j = 1, 2, 3\ldots, n-2, \text{ and } n-1. \quad (10^*)$$

Note that the phase of $V_{n-j}$ lags or leads $V_{n-j+1}$ by 90° (or a quadrature) in which j=1, 2, 3 . . . , n−2, and n−1. It means that the realized circuit is a quadrature oscillator with n node voltages having the following phase relationship $$\angle V_{n-j} \pm 90° = \angle V_{n-j+1} \text{ for } i=1, 2, 3 \ldots, \text{ and } n-1. \quad (11)$$

And the last constraint is $$V_1 s + \sum_{j=0}^{n-1}\left[(-1)^{j+1}V_{n-j}\left(\frac{a_j}{a_{j+1}}\right)\right] = 0 \quad (12)$$

or $$V_1 s + \sum_{j=0}^{n-1}\left[(+1)^{j+1}V_{n-j}\left(\frac{a_j}{a_{j+1}}\right)\right] = 0 \quad (12^*)$$

Figure 7:
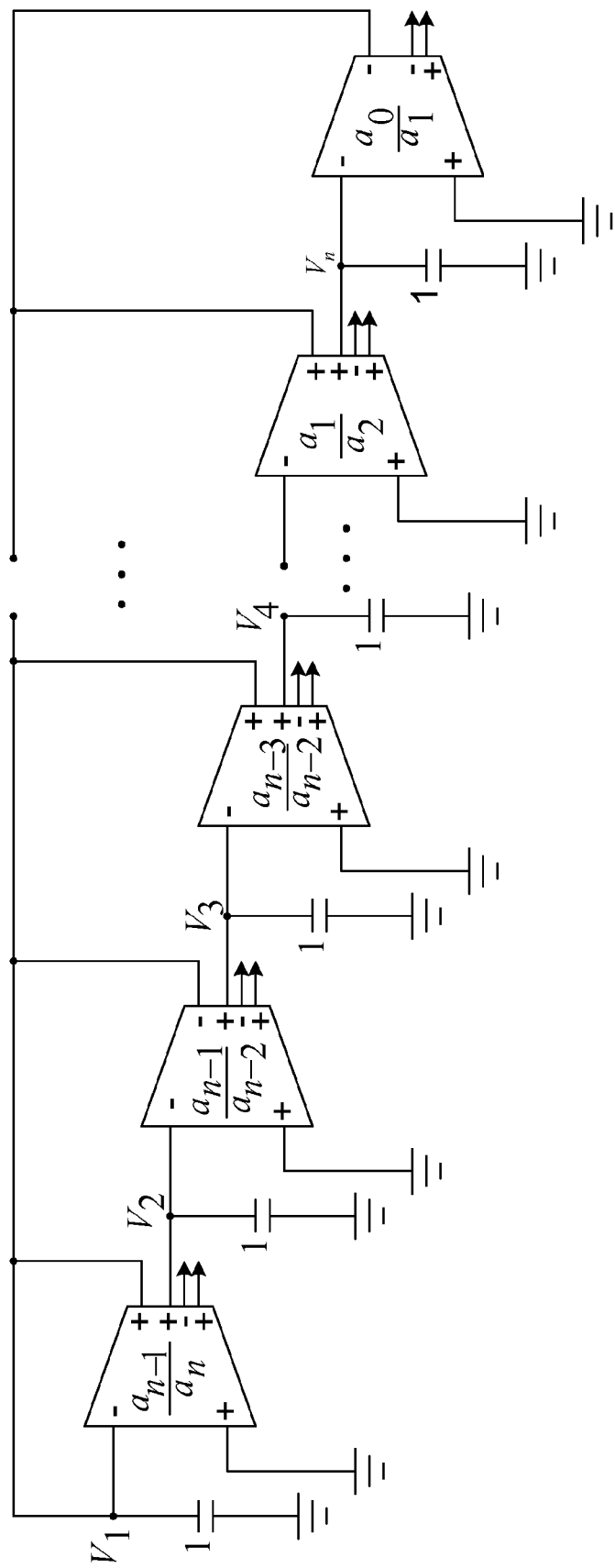
FIG. 7 is a circuit diagram of the voltage-mode and current-mode OTA-C quadrature oscillator structure (n is even)

The realized OTA-C sub-circuitry of (10) is also shown in FIG. 2. In a similar way, the whole OTA-C circuit structure realized from (10) and (12) is shown in FIG. 7 when n is an even integer. The other one realized from (10*) and (12*) can be easily obtained.

Figure 8:
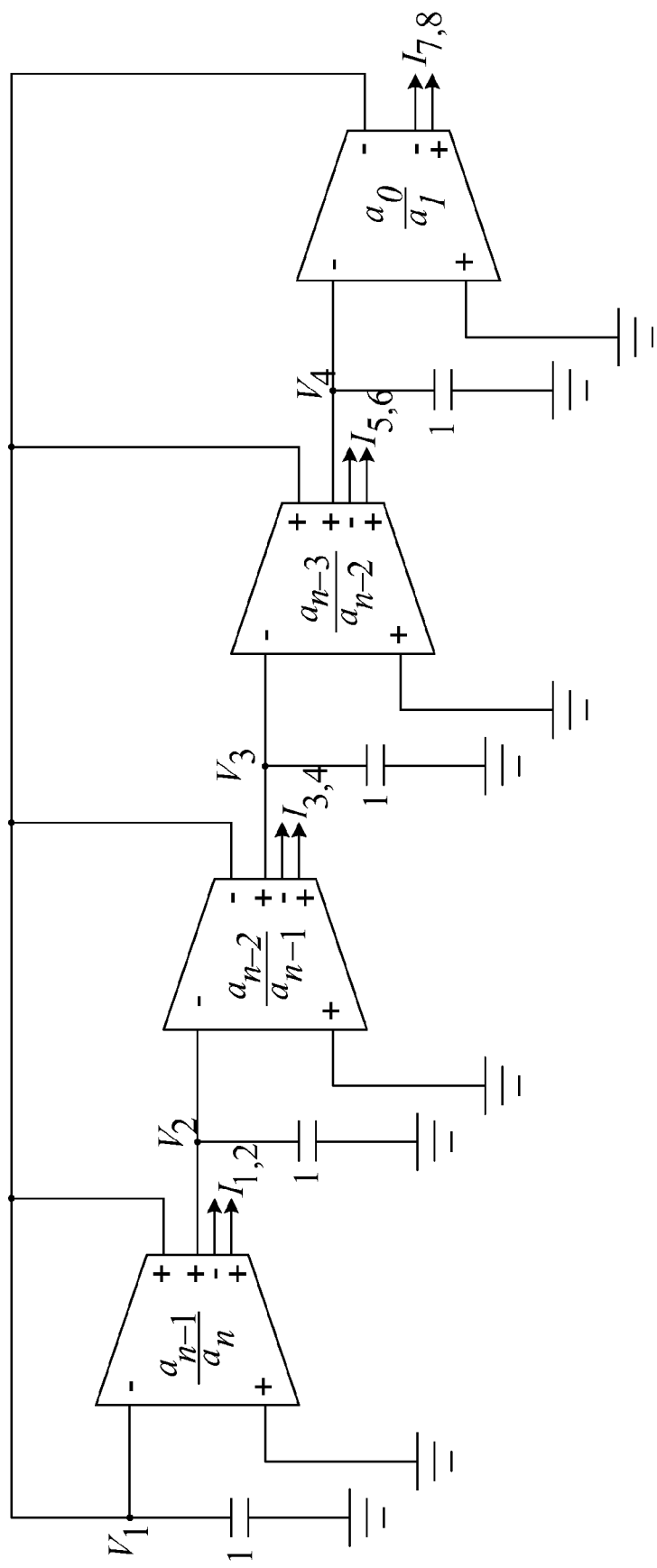
FIG. 8 is a circuit diagram of the fourth-order OTA-C quadrature oscillator structure.
Figure 9:
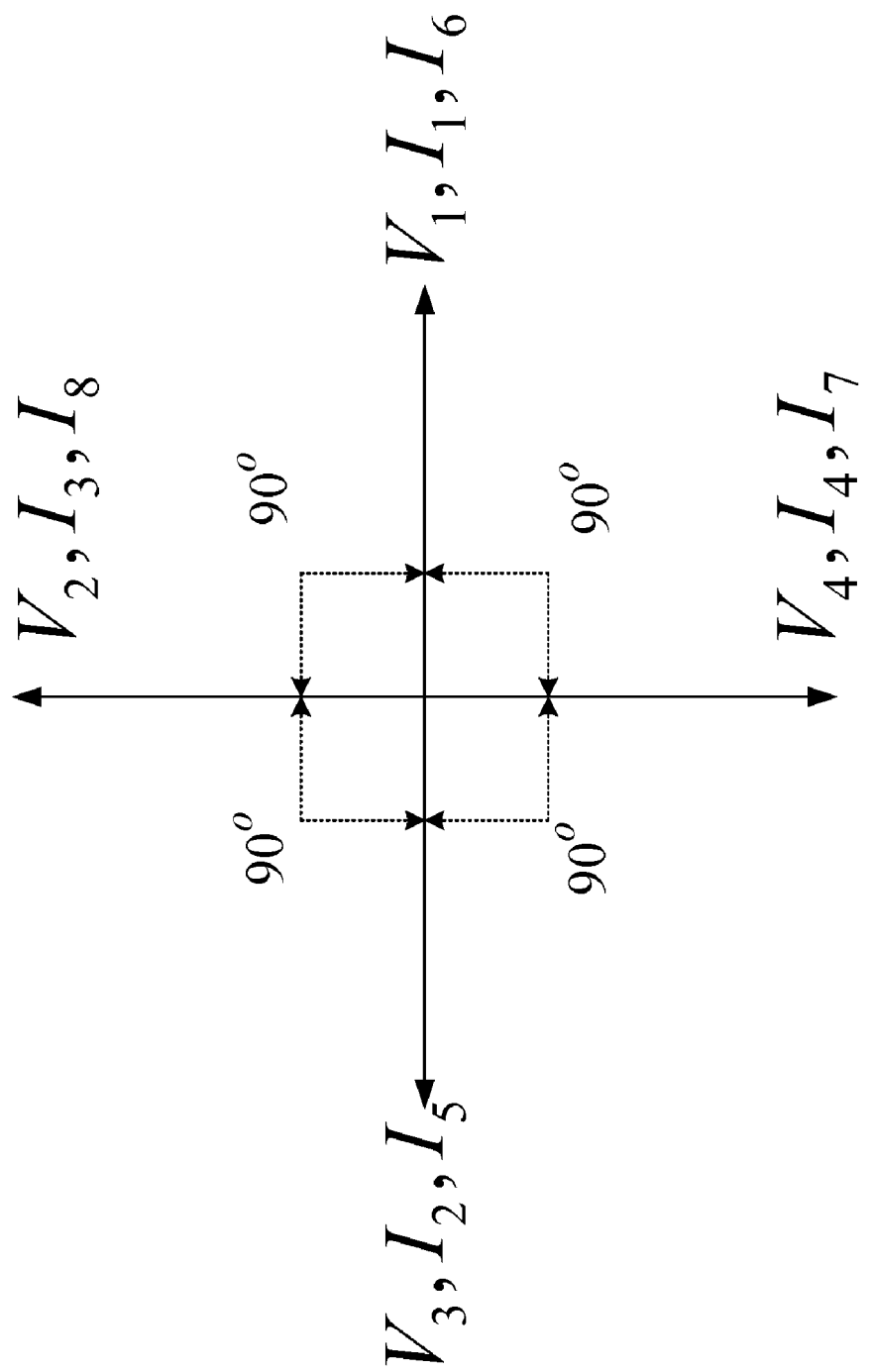
FIG. 9 shows the quadrature phase sequence of the output signals of FIG. 8.

A fourth-order four-phase voltage and current-mode quadrature oscillator structure is shown in FIG. 8 whose phase sequence of the output signals is shown in FIG. 9.

Figure 10:
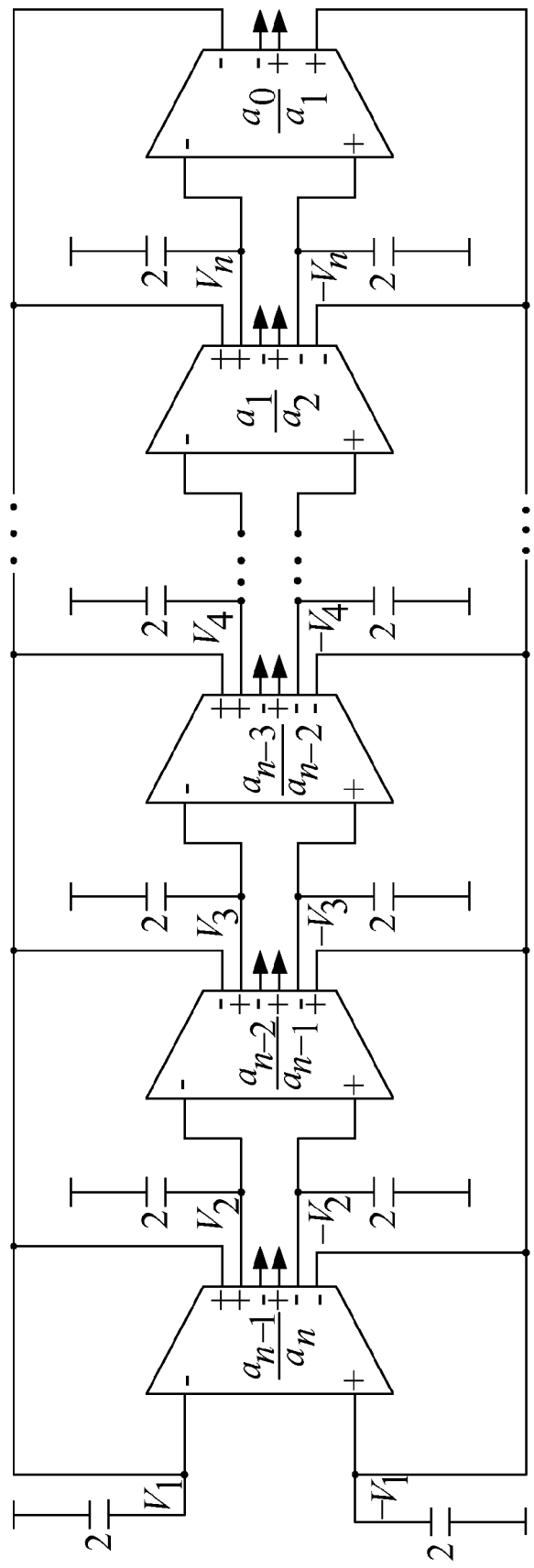
FIG. 10 is a circuit diagram of the fully differential OTA-grounded C quadrature oscillator structure (n is even)

The corresponding fully differential OTA and grounded C circuit structure is shown in FIG. 10.

Therefore, for constructing a nth-order any-phase-shift sinusoidal oscillator structure, comprising: the same number of series-connected single-ended-input operational transconductance amplifiers as the number of order of nth order and the same number of grounded capacitor connected at output of operational transconductance amplifiers as the number of order of nth order.

3. Analytical Synthesis of Any-Phase Oscillator Structure

Eqs. (6) and (10) control the phase angle relationship between $V_{n-j+1}$ and $V_{n-j}$. It is the reason why the above presented oscillator structures are in the quadrature form. The above 90° phase shift can be changed using the following two approaches. The first approach leads to a phase shift larger than 90° but lower than 180°. The second one leads to a phase difference lower than 90°.

Figure 11:
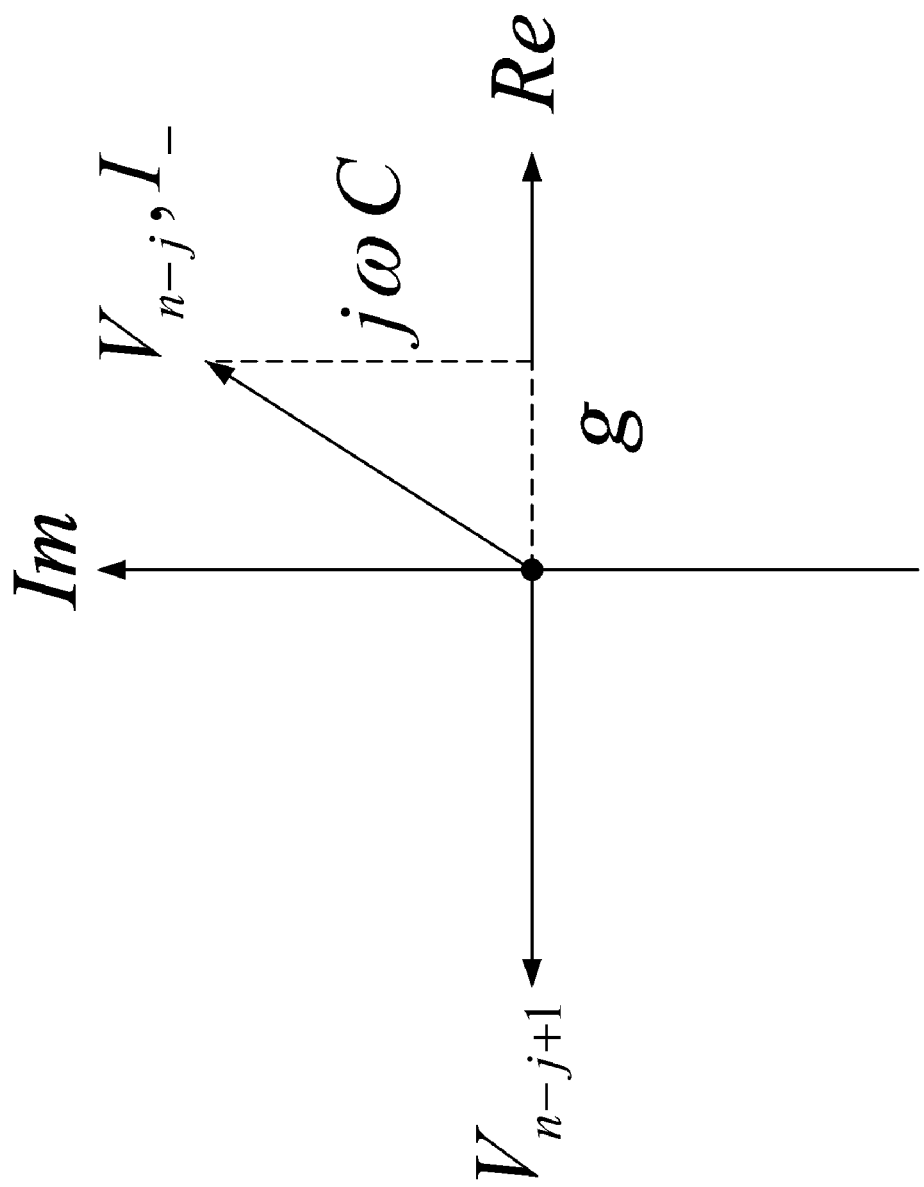
FIG. 11 shows the phase difference between $V_{n-j+1}$ and $V_{n-j}$ in formula (13)

Approach I:

If we replace the relationship between $V_{n-j+1}$ and $V_{n-j}$ shown in (6) or (10) with $$V_{n-j+1} = V_{n-j}\frac{\left(-\frac{a_j}{a_{j+1}}\right)}{sC+g} \text{ for } j = 1, 2, 3\ldots, n-2, \text{ and } n-1. \quad (13)$$

namely, a conductor g is added to the place in parallel with the grounded capacitor, then when the phase of $V_{n-j+1}$ is still 180° due to the numerator, $-a_j/a_{j+1}$, then the phase of $V_{n-j}$ is less than 90° due to the changed denominator, sC+g, whose phase angle is equal to arctan($\omega$C/g) smaller than 90°. The phase relationship between $V_{n-j+1}$ and $V_{n-j}$ is presented in FIG. 11. The OTA-C realization of sC+g is shown in FIG. 12, a grounded capacitor in parallel with a single-ended-input OTA which works like a positive conductor.

Figure 12:
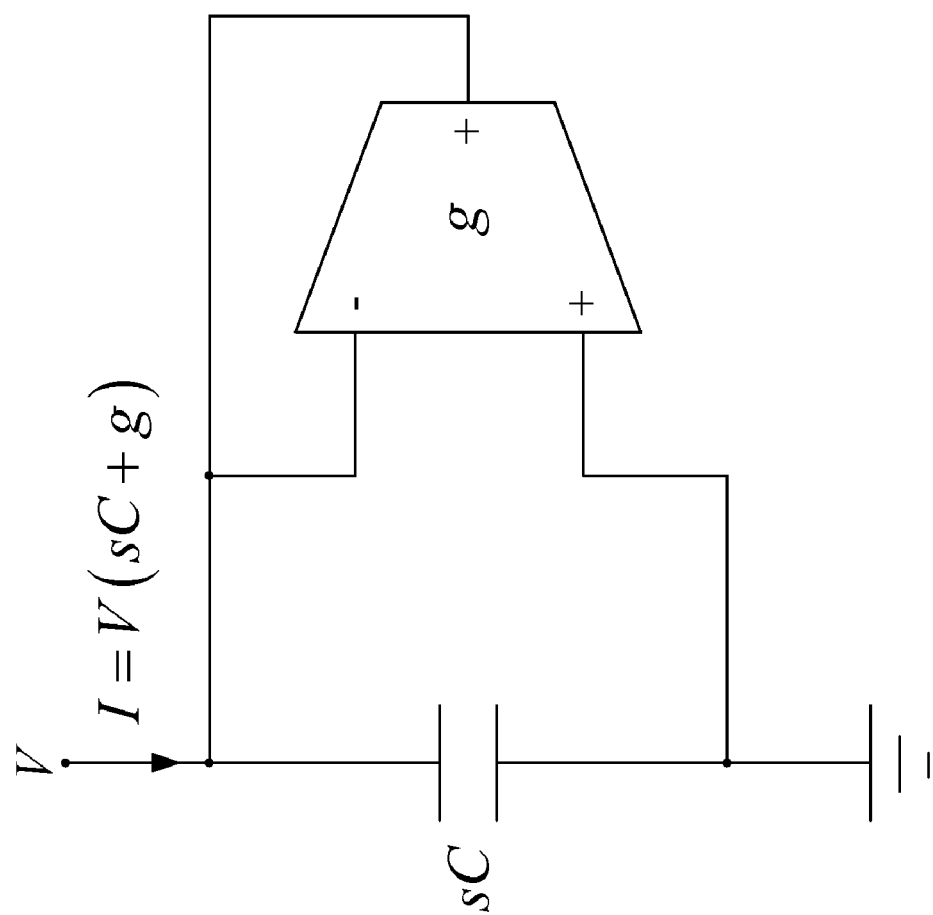
FIG. 12 is a circuit diagram of the OTA-C sub-circuitry of a positive conductor in parallel with a grounded capacitor.

In this approach, for a third-order oscillator structure, if we replace one grounded capacitor with the OTA-C sub-circuitry shown in FIG. 12, then the characteristic equation of the third-order oscillator structure becomes one of the following three equations by replacing sCi with sCi+g.

$$s^2(sC_1+g)C_2C_3+s^2C_2C_3g_1+sC_3g_1g_2+g_1g_2g_3=0 \quad (14)$$

$$s^2C_1(sC_2+g)C_3+s(sC_2+g)C_3g_1+sC_3g_1g_2+g_1g_2g_3=0 \quad (15)$$

$$s^2C_1C_2(sC_3+g)+sC_2(sC_3+g)g_1+(sC_3+g)g_1g_2+g_1g_2g_3=0 \quad (16)$$

Figure 13:
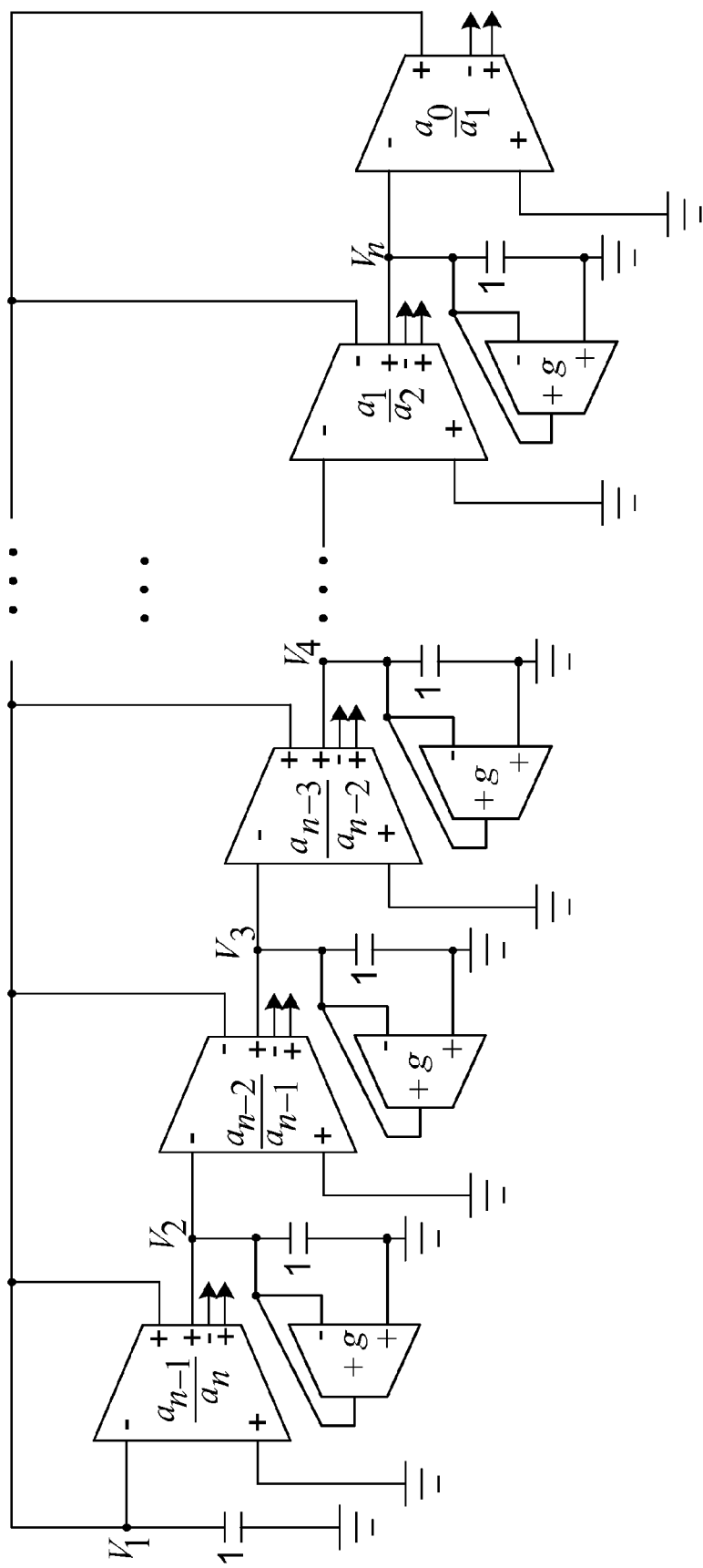
FIG. 13 is a circuit diagram of the odd-nth-order OTA-C oscillator structure with a phase shift larger than 90° but lower than 180°.

All the above three equations are still consistent with the standard third-order characteristic equation. It is evident that if we replace two or three grounded capacitors with two or three sets of the OTA-C sub-circuitries shown in FIG. 12, their final characteristic equations are still consistent with the standard equation. Then, a sinusoidal oscillator structure with fixed phase shift larger than 90° but lower than 180° may be realized. The voltage-mode and current-mode nth-order single-ended-input OTA-grounded capacitor oscillator structure with a phase shift larger than 90° but lower than 180° is shown in FIGS. 13 (if n is odd), and 14 (if n is even), respectively. Note that the practical phase difference is decided by the magnitudes of the real part and the imaginary part of the admittance, sC+g.

Figure 14:
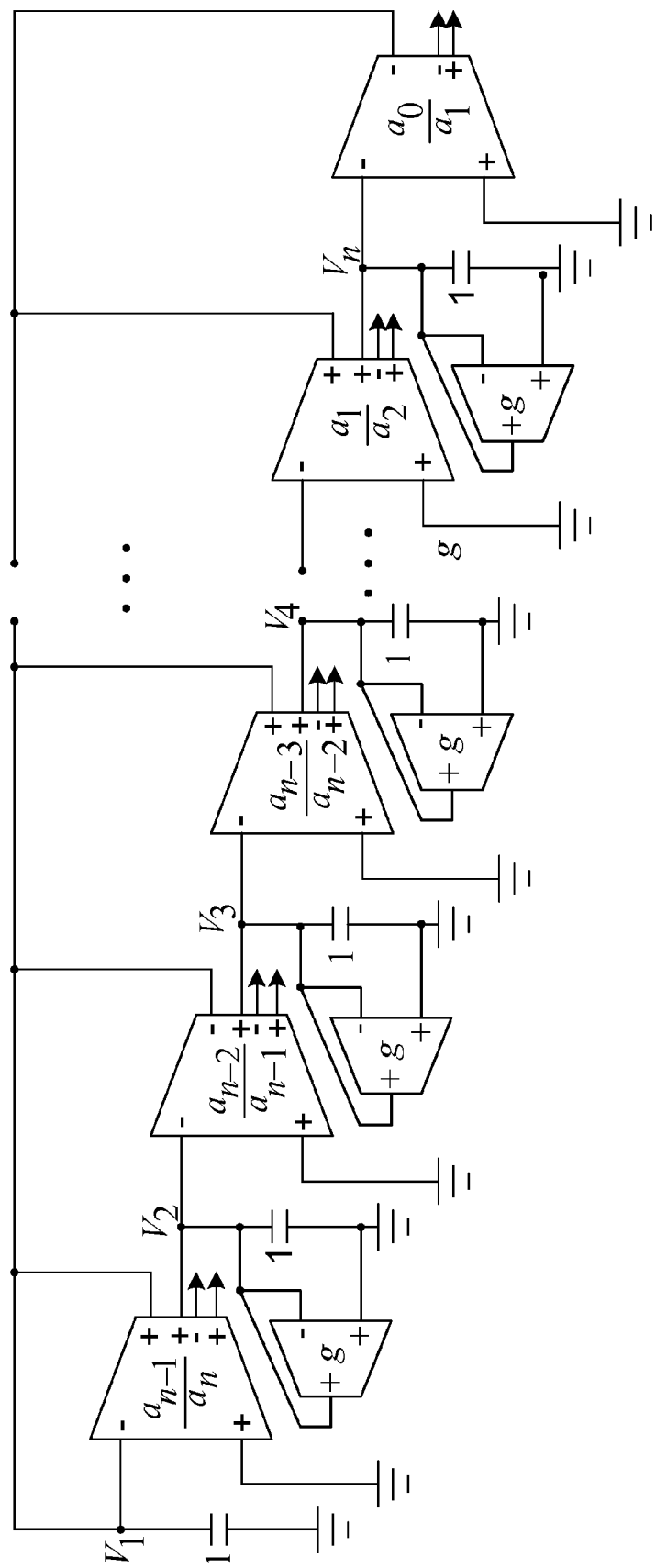
FIG. 14 is a circuit diagram of the even-nth-order OTA-C oscillator structure with a phase shift larger than 90° but lower than 180°.
Figure 14A:
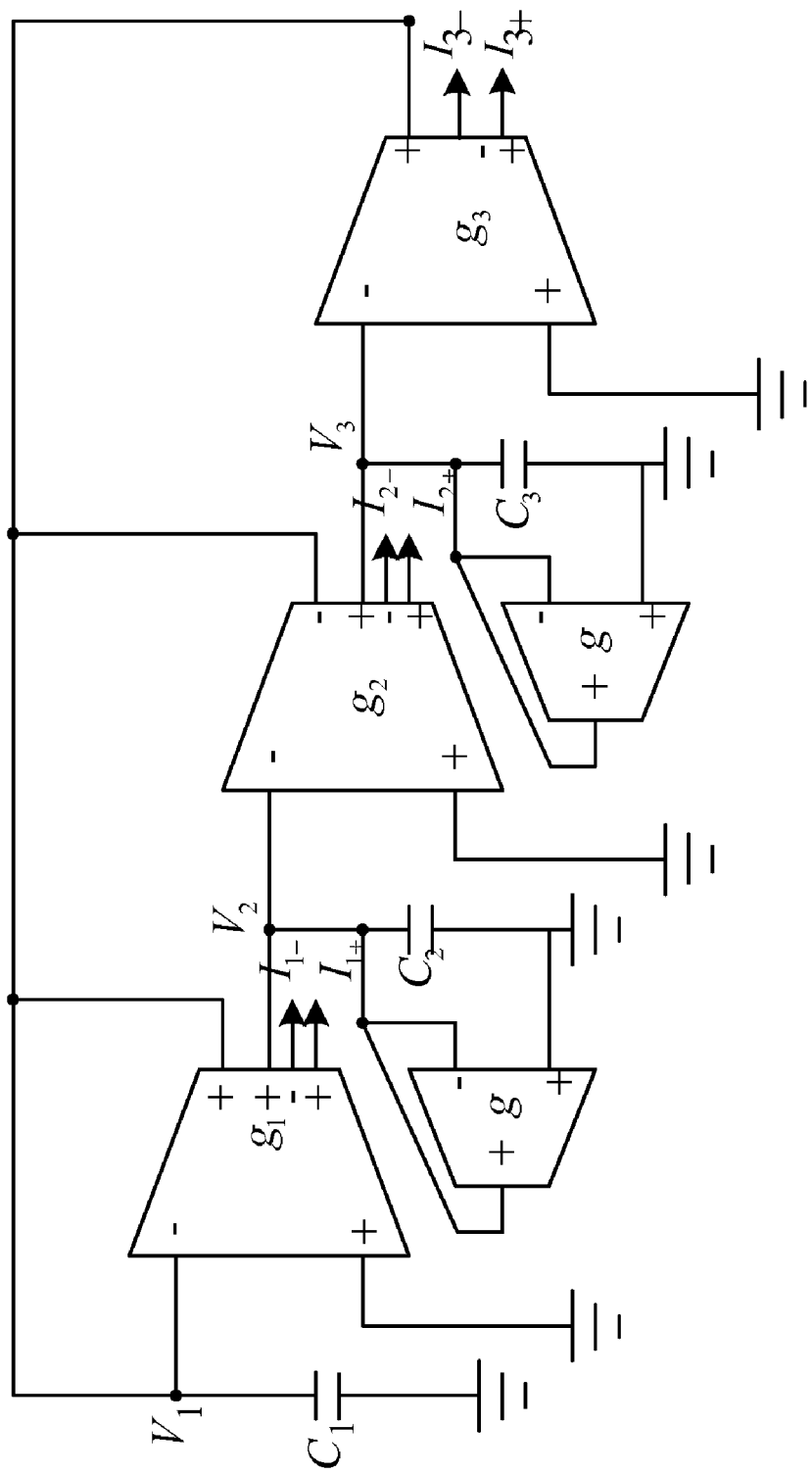
FIG. 14A Voltage-mode three-phase and current-mode six-phase OTA-C oscillator structure if $C1=C2=C3=C$ and $\omega C = \sqrt{3}g$.
Figure 15:
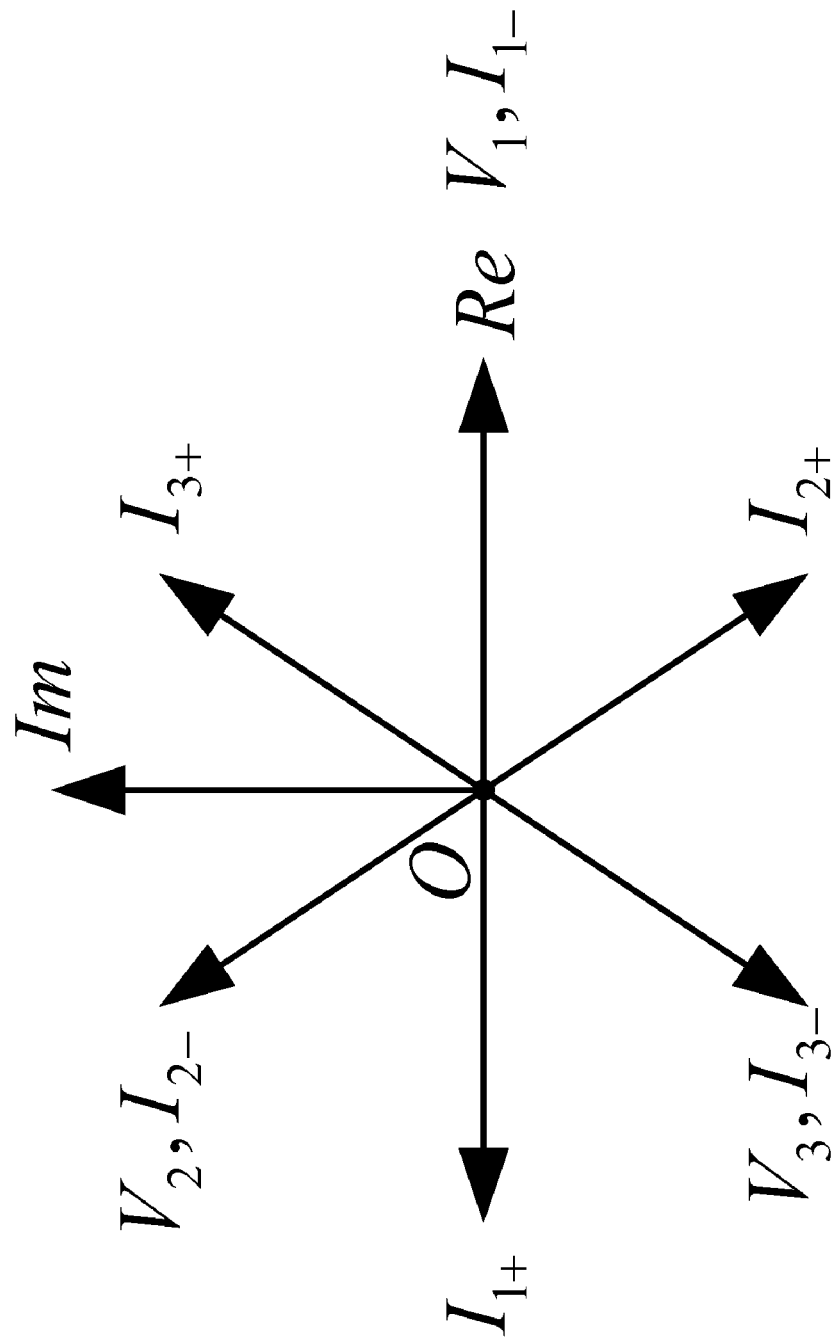
FIG. 15 shows the phase angles of the output signals.

A voltage-mode three-phase (with phase shift 120°) and current-mode six-phase (with phase shift 60°) oscillator structure, using five single-ended-input OTAs and three grounded capacitors, is shown in FIG. 14A, which can be easily realized if C1=C2=C3=C and $\omega C=\sqrt{3}g$ The characteristic equation of the voltage-mode three-phase and current-mode six-phase sinusoidal oscillator structure shown in FIG. 14A is $$sC_1(sC_2+g)(sC_3+g)+(sC_2+g)(sC_3+g)g_1+(sC_3+g)g_1g_2+g_1g_2g_3=0 \quad (17)$$

which is still consistent with the standard characteristic equation. As C1=C2=C3=C and $\omega C=\sqrt{3}g$, V1 lags behind V2 by 120° and V2 lags behind V3 by 120°. Then the phase relationship among voltage-mode and current-mode output signals is shown in FIG. 15. This is a voltage-mode three-phase (with phase shift 120°) and current-mode six-phase (with phase shift) 60° oscillator structure.

Figure 16:
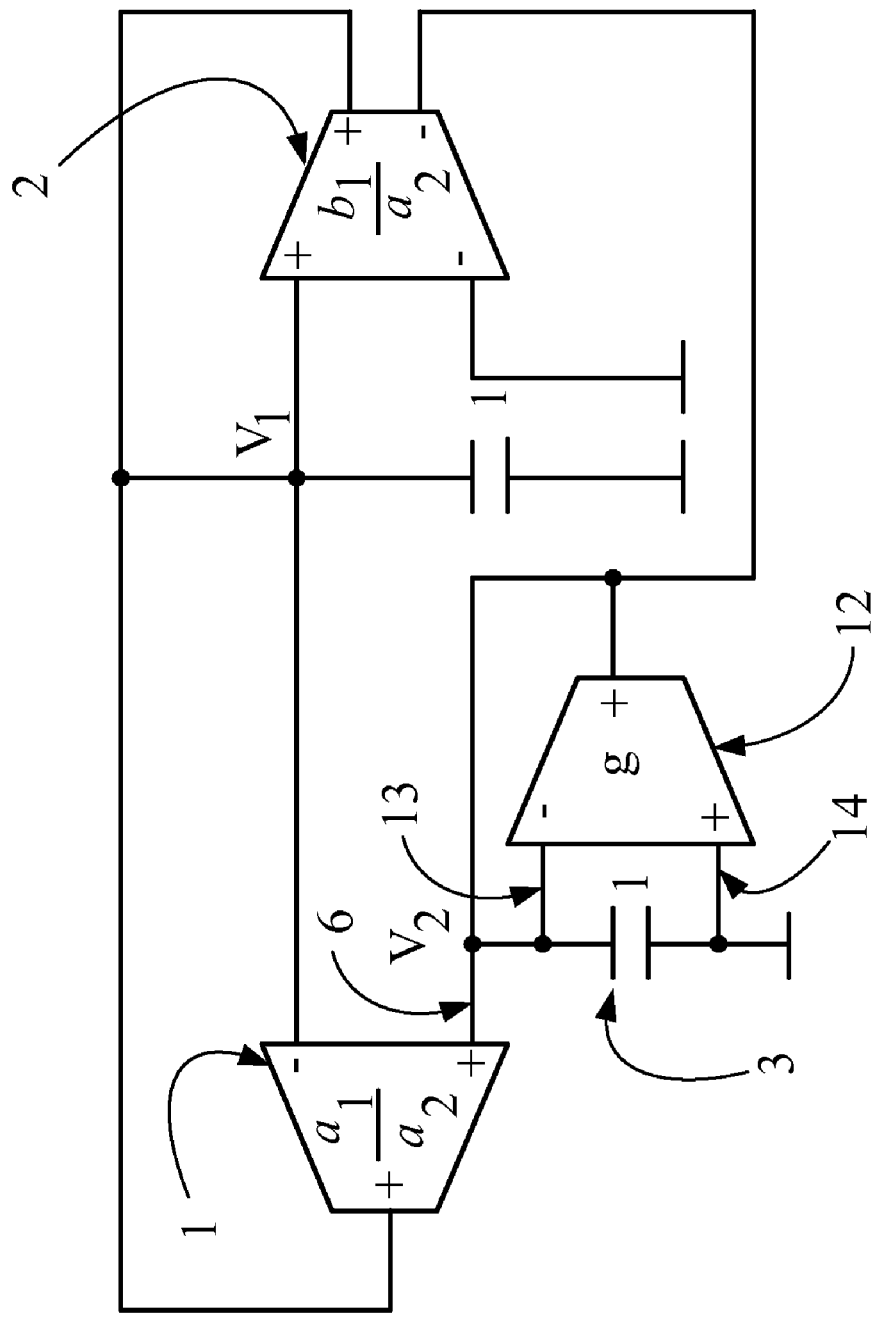
FIG. 16 shows Second-order OTA-C oscillator designed from FIG. 4 with a phase shift larger than 90° but lower than 180°.

Referring to FIG. 16 The nth-order arbitrary-phase-shift sinusoidal oscillator structure is further comprise a third operational transconductance amplifier 12 wherein the inputs are connected parallel to the second grounded capacitor 3 and the output 13, 14 of the third operational transconductance amplifier 12 is connected to the second input 6 of first operational transconductance amplifier 1, second grounded capacitor 3 and inverting output 11 of second operational transconductance amplifier 2.

The non-inverting input 14 of third operational transconductance amplifier 12 can also be connected to the ground of the second ground capacitor 3, the inverting input 14 of third operational transconductance amplifier 12 is connected to the second grounded capacitor 3.

The inverting input 14 of third operational transconductance amplifier 12 can also be connected to the ground of the second ground capacitor 3, the non-inverting input 13 of third operational transconductance amplifier 12 is connected to the second grounded capacitor 3.

Similarly, the second-order OTA-C oscillator structure with a phase shift larger than 90° but lower than 180° can also be obtained and shown in FIG. 16 by adding a positive-transconductance OTA in parallel with the grounded capacitor located at the node voltage, V2, in FIG. 4.

Approach II:

If we replace the relationship between $V_2$ and $V_1$ shown in (a8) with $$V_2 = \frac{(a_1/a_2)}{sC - g} V_1 \qquad (a12)$$

then when the phase of $V_2$ is 0° due to the numerator, $a_1/a_2$, then the phase of $V_1$ is less than 180° but larger than 90° due to the denominator, $sC-g$ whose phase angle is equal to arctan $[\omega C/(-g)]$. The OTA-C realization of $sC-g$ is shown in FIG. 17, a grounded capacitor in parallel with a single-ended-input OTA which works like a negative conductor.

Figure 17:
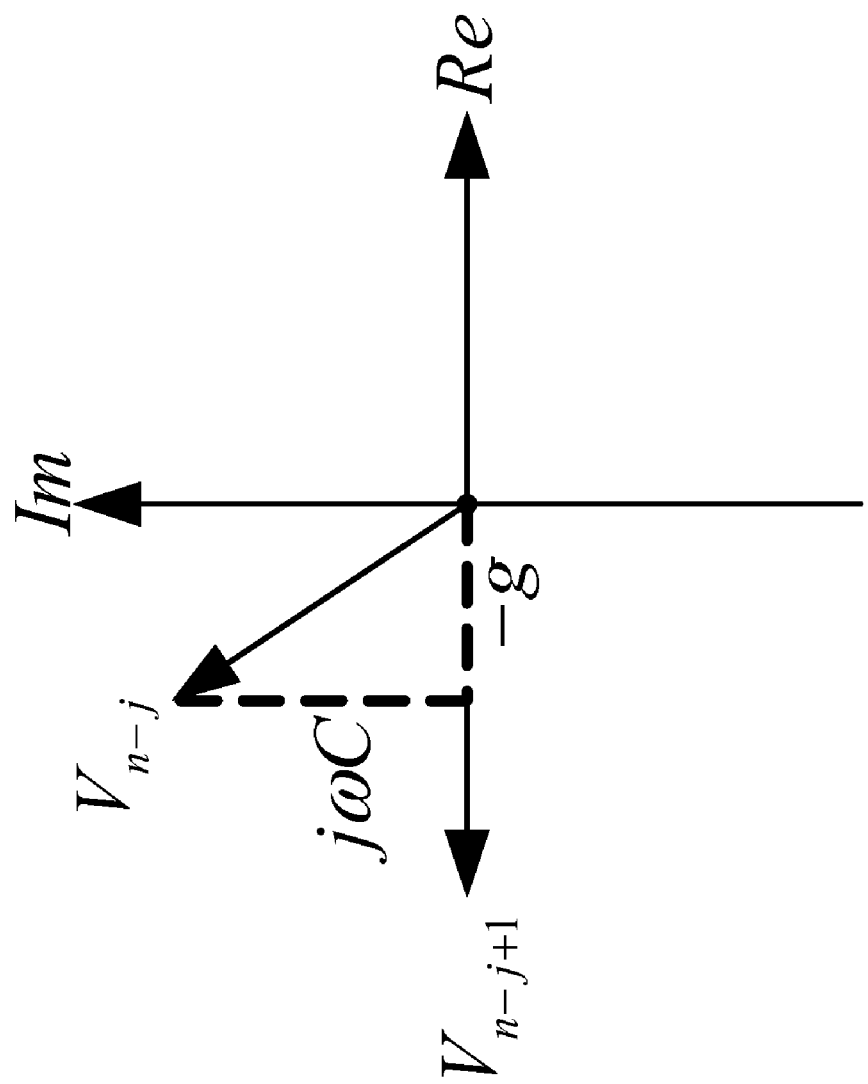
FIG. 17 shows the phase difference between $V_{n-j+1}$ and $V_{n-j}$ in formula (18)

In this approach, for a second-order oscillator structure shown in FIG. 4, if we replace one grounded capacitor with the OTA-C sub-circuitry shown in FIG. 17, then the characteristic equation of the second-order oscillator structure becomes $$sC_1(sC_2-g)+(sC_2-g)(g_1-g_2)+g_1g_2=0 \qquad (a13)$$

The above equation is consistent with the standard second-order characteristic equation (a1), if all the four coefficients in (a1) are positive and satisfying (a2) and (a3). Then, a sinusoidal oscillator, which has a fixed phase shift lower than 180° but larger than 90°, may be realized from FIG. 4 and shown in FIG. 17A.

Approach III:

If we replace the relationship between $V_{n-j+1}$ and $V_{n-j}$ shown in (6) or (10) with $$V_{n-j+1} = V_{n-j} \frac{\left(-\frac{a_j}{a_{j+1}}\right)}{sC - g} \text{ for } j = 1, 2, 3 \ldots, n-2, \text{ and } n-1, \qquad (18)$$

then when the phase of $V_{n-j+1}$ is still 180° due to the numerator, $-a_j/a_{j+1}$, then the phase of $V_{n-j}$ is less than 180° but larger than 90° due to the denominator, $sC-g$ whose phase angle is equal to arctan $[\omega C/(-g)]$. The phase relationship between $V_{n-j+1}$ and $V_{n-j}$ is presented in FIG. 17. The OTA-C realization of $sC-g$ is shown in FIG. 18, a grounded capacitor in parallel with a single-ended-input OTA which works like a negative conductor.

Figure 18:
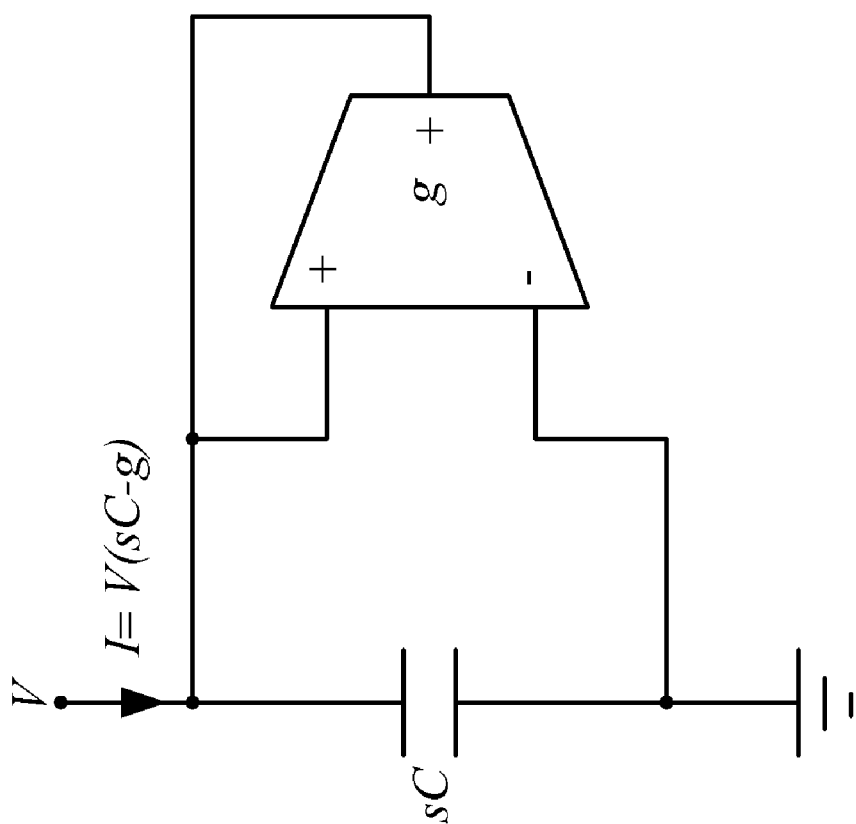
FIG. 18 is a circuit diagram of the OTA-C sub-circuitry of a negative conductor in parallel with a grounded capacitor.

In this approach, for a third-order oscillator structure, if we replace one grounded capacitor with the OTA-C sub-circuitry shown in FIG. 18, then the characteristic equation of the third-order oscillator structure becomes one of the following three equations by replacing $sC_i$ with $sC_i-g$.

$$s^2(sC_1-g)C_2C_3+s^2C_2C_3g_1+sC_3g_1g_2+g_1g_2g_3=0 \qquad (19)$$

$$s^2C_1(sC_2-g)C_3+s^2(sC_2-g)C_3g_1+sC_3g_1g_2+g_1g_2g_3=0 \qquad (20)$$

$$s^2C_1C_2(sC_3-g)+s^2C_2(sC_3-g)g_1+(sC_3-g)g_1g_2+g_1g_2g_3=0 \qquad (21)$$

Figure 19:
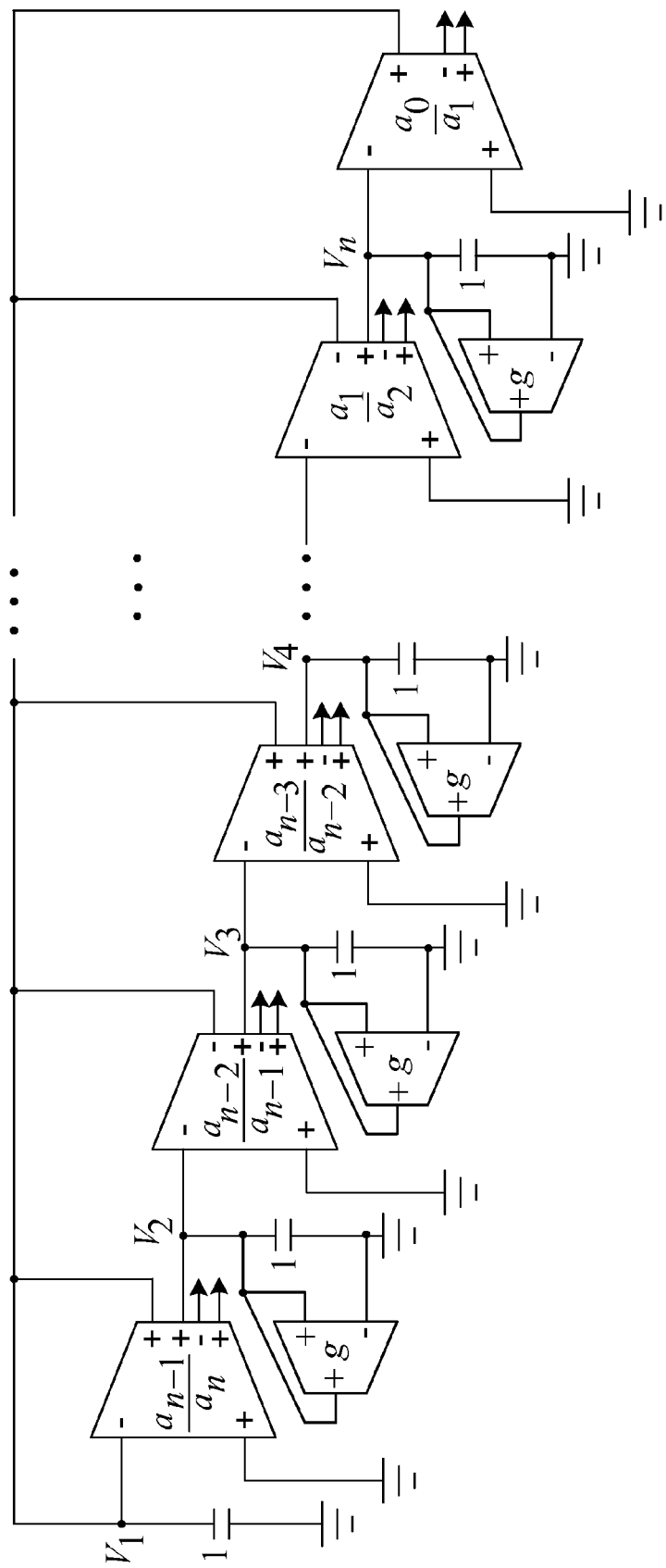
FIG. 19 is a circuit diagram of the odd-nth-order OTA-C oscillator structure with a phase shift lower than 90°.

All the above three equations may be consistent with the standard third-order characteristic equation, if all the four coefficients in the standard third-order characteristic equation are positive. It is evident that if we replace two or three grounded capacitors with two or three OTA-C sub-circuitries shown in FIG. 18, their final characteristic equations may also be consistent with the above standard equation if all the coefficients are still positive. Then, a sinusoidal oscillator structure with phase-shift lower than 90° may be realized. The voltage-mode and current-mode nth-order single-ended-input OTA-grounded capacitor oscillator structure with a phase shift lower than 90° is shown in FIGS. 19 (if n is odd), and 20 (if n is even), respectively. Note that the practical phase difference is decided by the magnitudes of the real part and the imaginary part of the admittance of $sC-g$.

Figure 21:
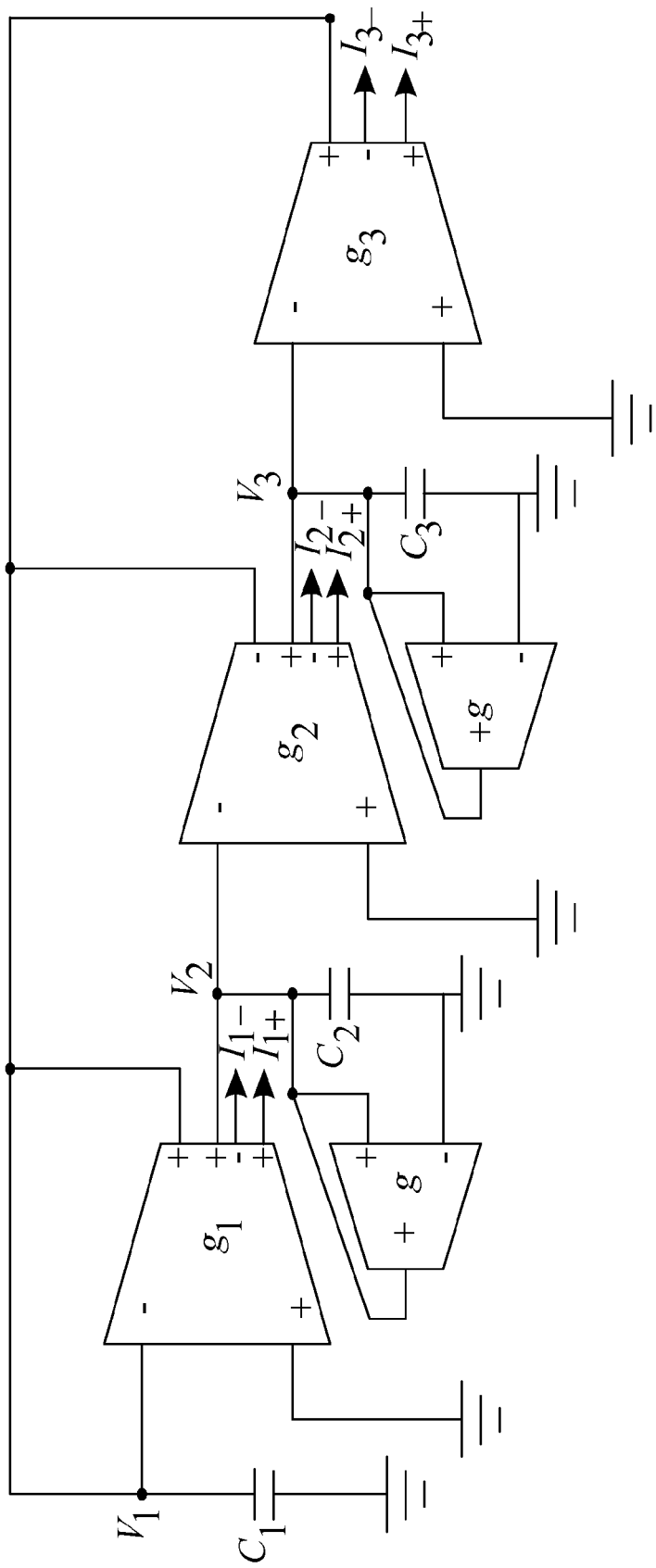
FIG. 21 is a circuit diagram of the current-mode six-phase OTA-C oscillator structure with two 60° phase shifts.

A current-mode six-phase (with phase shift 60°) sinusoidal oscillator structure, using five single-ended-input OTAs and three grounded capacitors, shown in FIG. 21, may be realized provided that $C1=C2=C3=C$ and $\omega C=\sqrt{3}g$ in which V1 lags V2 by 60° and V2 lags V3 by 60°. The characteristic equation of the current-mode six-phase oscillator structure shown in FIG. 21 is $$sC_1(sC_2-g)(sC_3-g)+(sC_2-g)(sC_3-g)g_1+(sC_3-g)g_1g_2+ \\ g_1g_2g_3=s^3C_1C_2C_3+s^2(C_1C_2+C_1C_3)(-g)+ \\ s^2C_2C_3g_1+sC_1g^2+s(C_2+C_3)(-g)g_1+sC_3g_1g_2+ \\ g_1g_2g_3+g^2g_1-gg_1g_2=0 \qquad (22)$$

Thus, the condition of oscillation (CO) is $$\sqrt{g^2-2gg_1+g_1g_2} = \sqrt{\frac{g^2g_1-gg_1g_2+g_1g_2g_3}{-2g+g_1}} \qquad (22\text{-}1)$$

And the frequency of oscillation (FO) is $$f_o = \frac{\sqrt{g^2-2gg_1+g_1g_2}}{2\pi C} = \frac{\sqrt{3}\,g}{2\pi C} \qquad (22\text{-}2)$$

Figure 20:
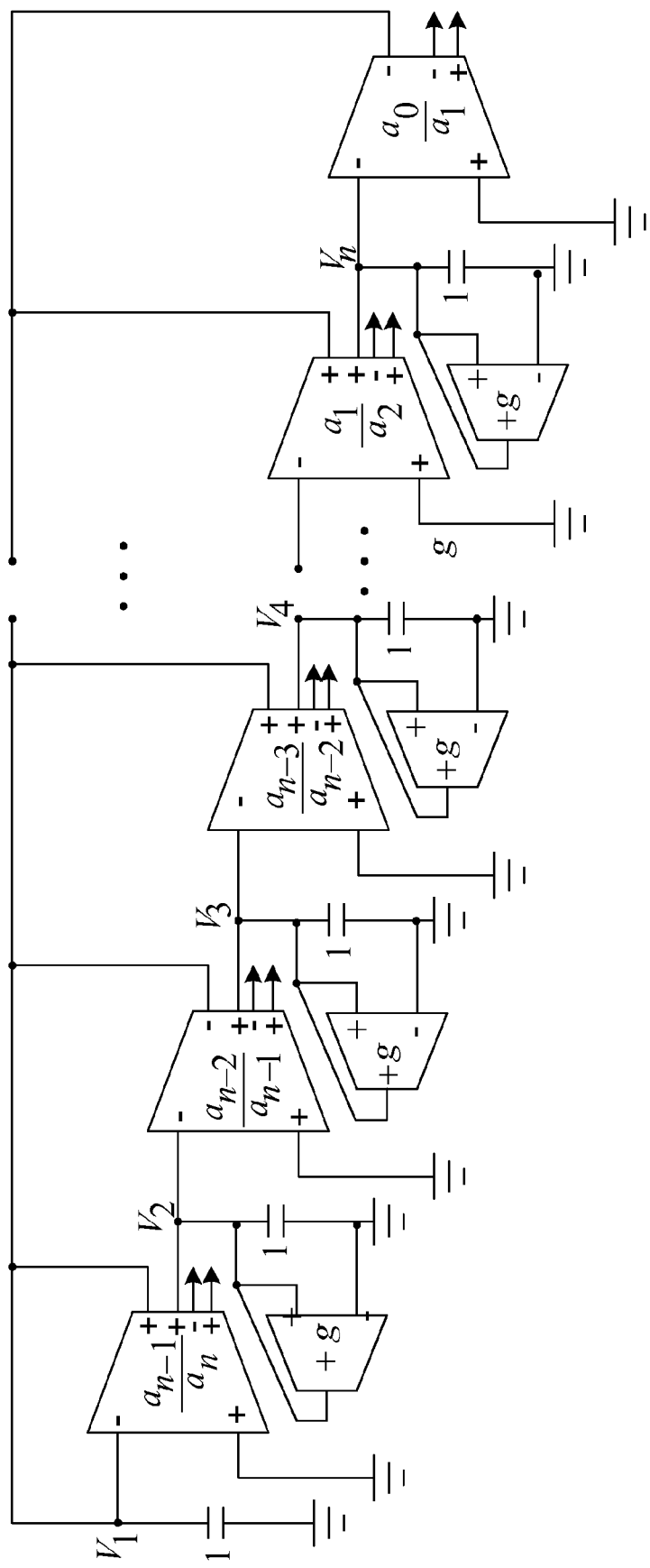
FIG. 20 is a circuit diagram of the even-nth-order OTA-C oscillator structure with a phase shift lower than 90°.
Figure 22:
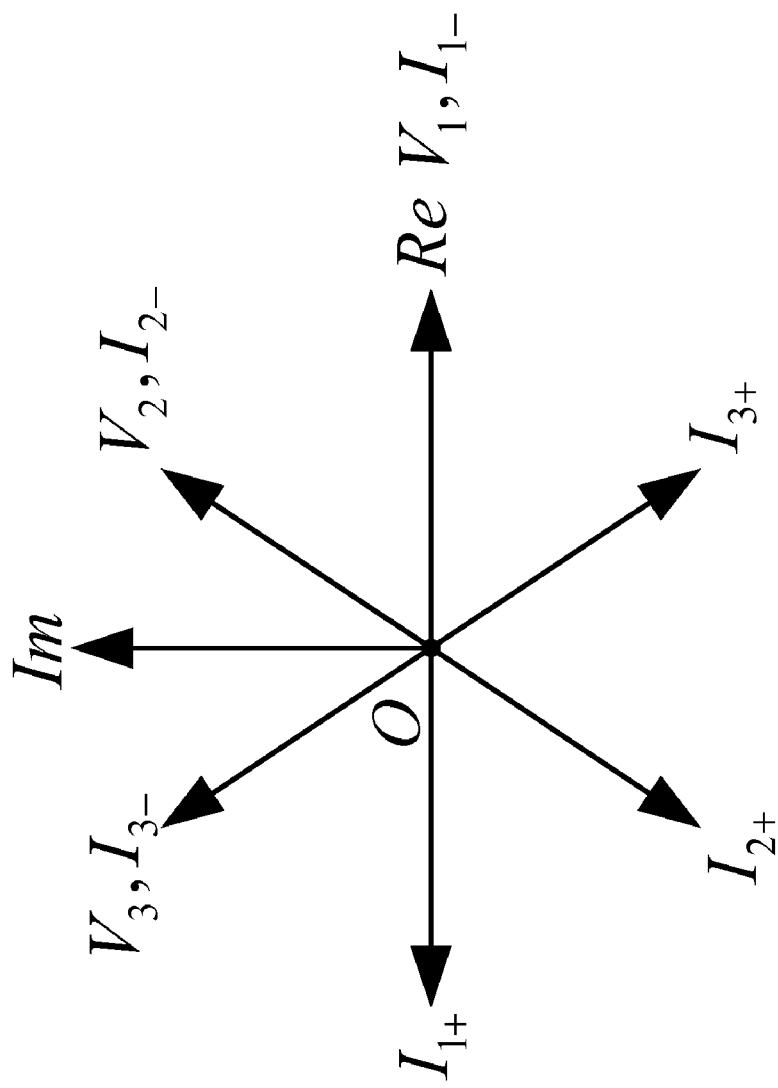
FIG. 22 is a circuit diagram of the phase angles of the output signals of FIG. 21.

The non-trivial solution may be obtained when (i) $g^2+g_1g_2 > 2gg_1$, and (ii)

$$\frac{g^2g_1-gg_1g_2+g_1g_2g_3}{-2g+g_1} > 0.$$

which will be consistent with the standard characteristic equation if all the coefficients are positive. As $C1=C2=C3=C$ and $\omega C=\sqrt{3}g$, V1 lags behind V2 by 60° and V2 lags behind V3 by 60°. Then the phase relationship among voltage-mode and current-mode output signals is shown in FIG. 22. Therefore, the circuit shown in FIG. 20 is a current-mode six-phase oscillator with phase shift 60°.

Approach IV:

If we replace the relationship between V2 and V1 shown in (a8) with $$V_2 = \frac{(a_1/a_2)}{sC+g} V_1 \qquad (a14)$$

then when the phase of V2 is 0° due to the numerator, a1/a2, then the phase of V1 is less than 90° due to the denominator, sC+g whose phase angle is equal to arctan [ωC/(g)]. The OTA-C realization of sC+g is shown in FIG. 17.

In this approach, for a second-order oscillator structure shown in FIG. 4, if we replace one grounded capacitor with the OTA-C sub-circuitry shown in FIG. 17, then the characteristic equation of the second-order oscillator structure becomes $$sC_1(sC_2+g)+(sC_2+g)(g_1-g_2)+g_1g_2=0 \qquad (a15)$$

Figure 20A:
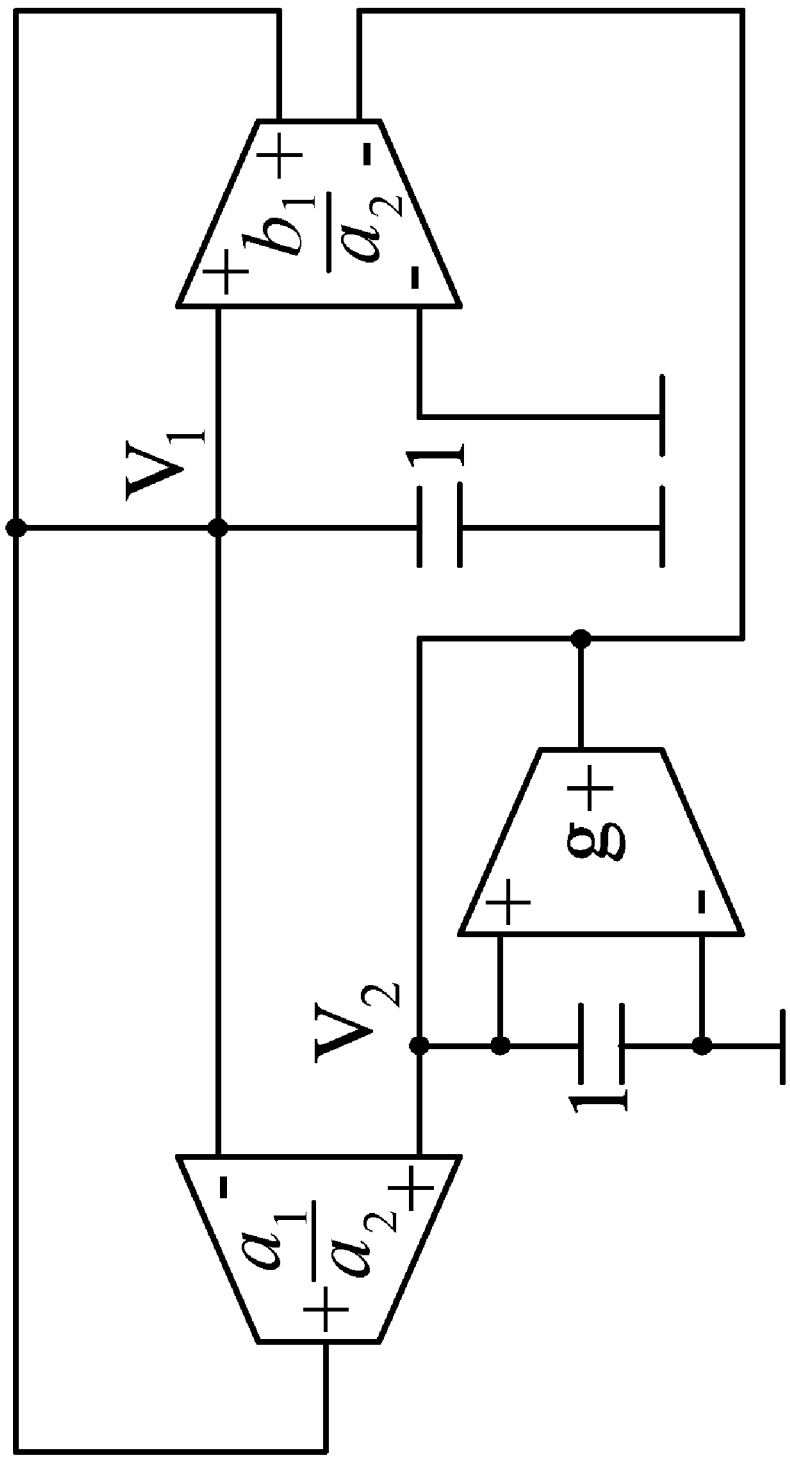
FIG. 20A shows second-order OTA-C oscillator designed from FIG. 4 with a phase shift lower than 90°.

The above equation is consistent with the standard second-order characteristic equation (a1), if all the four coefficients in (a1) are positive and satisfying (a2) and (a3). Then, a sinusoidal oscillator with a fixed phase shift lower than 90° may be realized and shown in FIG. 20A.

A several-different-phase-shift sinusoidal oscillator structure may also be realized using all the above three phase-shift schemes. For example, if we would like to design a fourth-order oscillator structure with four node voltages having phase angles, 0°, 90°, 210°, and 270°, respectively, (namely, V1 lags behind V2 by 90°, V2 lags behind V3 by 120°, and V3 lags behind V4 by 60°), we use a quadrature sub-circuitry first, a phase shift 120° sub-circuitry in cascade latter, and then a phase difference 60° sub-circuitry last to construct such an oscillator structure shown in FIG. 23 in which $$\frac{V_2}{V_1} = \frac{-g_1}{sC_2}, \; \frac{V_3}{V_2} = \frac{-g_2}{sC_3+g_4}, \; \frac{V_4}{V_3} = \frac{-g_3}{sC_4-g_5}, \qquad (23)$$

$$\text{and } \omega C_3 = \sqrt{3}\, g_4, \; \omega C_4 = \sqrt{3}\, g_5$$

Figure 23:
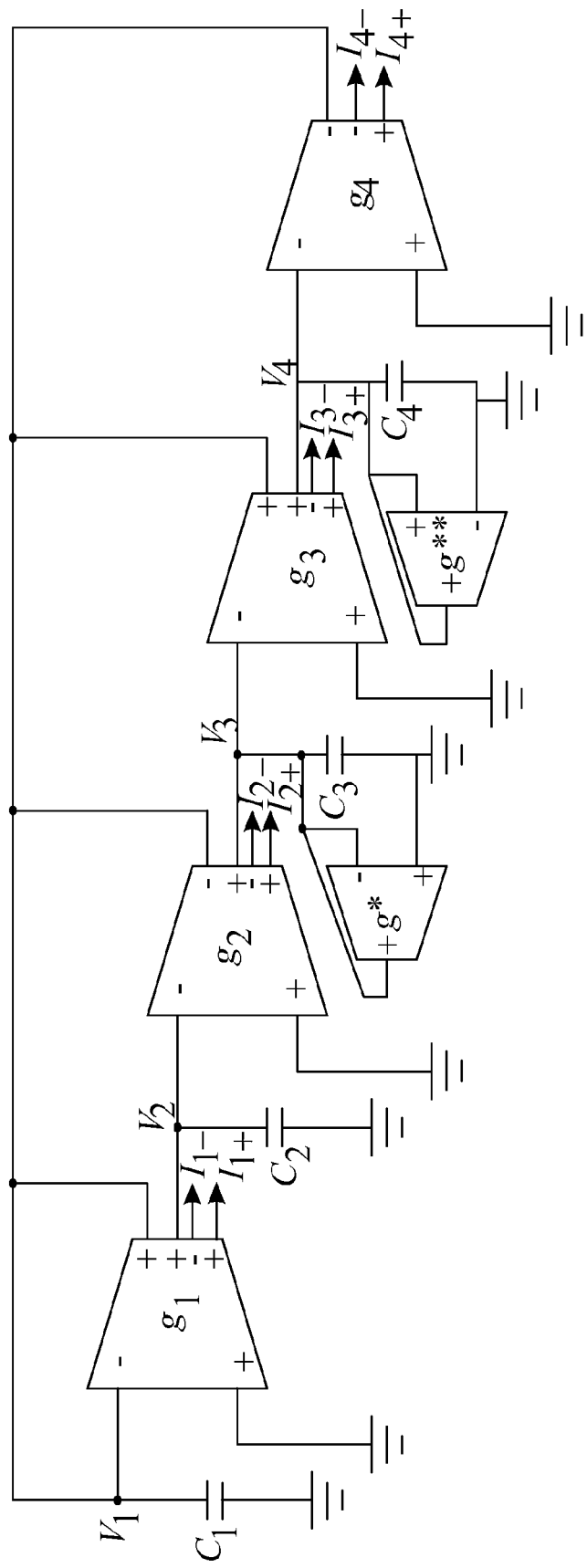
FIG. 23 is a circuit diagram of the fourth-order three-different-phase-shift OTA-C oscillator structure.

Hence, the characteristic equation of this fourth-order arbitrary-phase-shift oscillator shown in FIG. 23 is $$\begin{aligned}&s^4 C_2 C_3 C_4 + s^3 C_2 C_3 C_4 g_1 - s^3 C_1 C_2 C_3 g^{**} + \\ &s^3 C_1 C_2 C_4 g^* - s^2 C_1 C_2 g^* g^{} - s^2 C_2 C_3 g_1 g^{} + \\ &s^2 C_2 C_4 g_1 g^* + s^2 C_3 C_4 g_1 g_2 + s C_4 g_1 g_2 (g_3 + g^*) - \\ &s C_2 g_1 g^* g^{} - s C_3 g_1 g_2 g^{} + g_1 g_2 g_3 g_4 - g_1 g_2 g^{**} (g_3 + \\ &g^*) = 0\end{aligned} \qquad (23\text{-}1)$$

The condition of oscillation (CO) is $$\sqrt{\frac{C_4 g_1 g_2 (g_3 + g^*) - C_2 g_1 g^* g^{} - C_3 g_1 g_2 g^{}}{C_2 C_3 C_4 g_1 + C_1 C_2 C_4 g^* - C_1 C_2 C_3 g^{**}}} = \frac{-b + \sqrt{b^2 - 4ac}}{2a} \qquad (23\text{-}2)$$

where $$a = C_1 C_2 C_3 C_4,$$

$$b = C_2 C_4 g_1 g^* + C_3 C_4 g_1 g_2 - C_1 C_2 g^* g^{} - C_2 C_3 g_1 g^{}$$

$$c = g_1 g_2 g_3 g_4 - g_1 g_2 g^{**}(g_3 + g^*) \qquad (23\text{-}3)$$

And the frequency of oscillation (FO) is $$\begin{aligned}f_o &= \frac{1}{2\pi} \sqrt{\frac{C_4 g_1 g_2 (g_3 + g^*) - C_2 g_1 g^* g^{} - C_3 g_1 g_2 g^{}}{C_2 C_3 C_4 g_1 + C_1 C_2 C_4 g^* - C_1 C_2 C_3 g^{**}}} \\ &= \frac{\sqrt{3}\, g_4}{2\pi C_3} \\ &= \frac{\sqrt{3}\, g_5}{2\pi C_4}\end{aligned} \qquad (23\text{-}4)$$

The feasible solution may be obtained provided that $$\frac{C_4 g_1 g_2 (g_3 + g^*) - C_2 g_1 g^* g^{} - C_3 g_1 g_2 g^{}}{C_2 C_3 C_4 g_1 + C_1 C_2 C_4 g^* - C_1 C_2 C_3 g^{**}} > 0, \qquad (i)$$

and (ii) if b>0, then c must be negative. Otherwise, if b<0, then only a positive (b2−4ac) is necessary.

Figure 24:
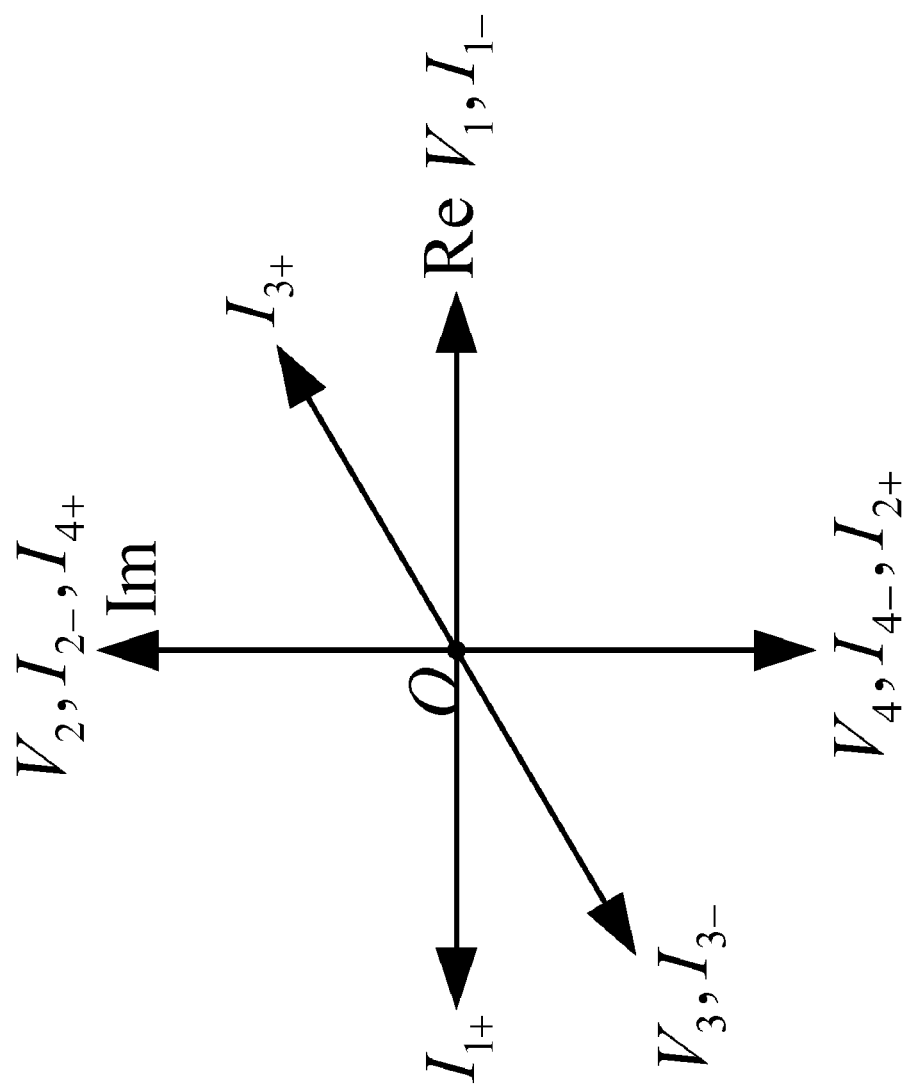
FIG. 24 shows the phase angles of the output signals of FIG. 23.

The phase shift diagram among voltage and current output signals of FIG. 23 is shown in FIG. 24. Note that there are eight more current output signals having phase angles, 0°, 30°, 90°, 180°, 210°, and 270°, respectively (namely, I1− lags behind I3+ by 30°, I3+ lags behind I2− or I4+ by 60°, I2− or I4+ lags behind I1+ by 90°, I1+ lags behind I3− by 30°, I3− lags behind I4− or I2+ by 60°).

Therefore, a nth-order any-phase-shift sinusoidal oscillator structure, comprises the same number of series-connected first set of single-ended-input operational transconductance amplifiers as the number of order of nth order and the same number of grounded capacitor connected at output of operational transconductance amplifiers as the number of order of nth order. at least one second set of single-ended-input operational transconductance amplifier connected in parallel with the grounded capacitance and said output of second set of single-ended-input operational transconductance amplifier connected to the output of first set of single-ended-input operational transconductance amplifiers.

4. Compensation Schemes

Let us consider the non-ideal effects [26] due to (i) the frequency dependency of the trans-conductance, Gj(s) (=gj (1−sTj), instead of the transconductance being g, (ii) the input parasitic capacitance Cip of an OTA, (iii) the output parasitic capacitance Cop of an OTA, (iv) the output parasitic conductance Gop of an OTA, and (v) the nodal parasitic capacitance Cnp at each internal node of an OTA-C circuit. How to do the compensation for the deviation, due to the above non-ideal effect, of phase shift and oscillation frequency is shown as follows. After appropriate compensations, we expect that the phase shift angles and the oscillation frequency of the realized oscillator structure be much more accurate than those without any compensation.

Therefore, first construct a nth-order any-phase-shift sinusoidal oscillator structure, which comprising the steps of:

i) connecting output of the same number of single-ended-input operational transconductance amplifiers as the number of order of nth order in series;

ii) connecting grounded capacitor to the output of each of single-ended-input operational transconductance amplifiers.

Then, compensates for the non-ideal effects and various compensation scheme is as follow.

Figure 25:
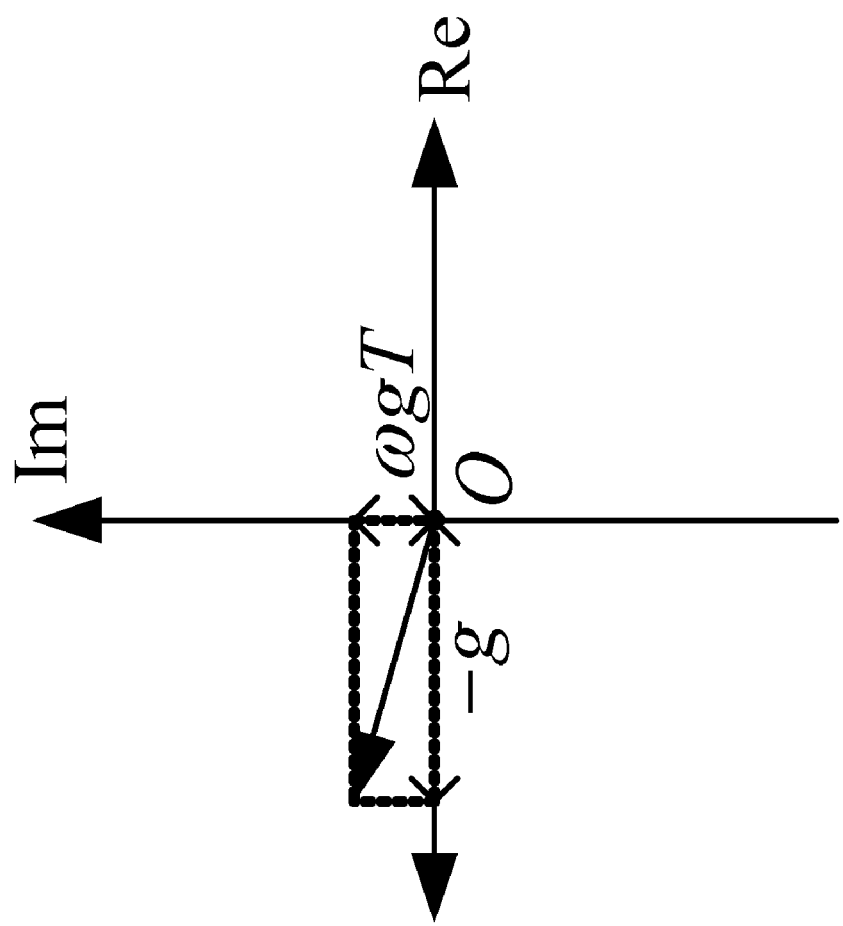
FIG. 25 shows the phase angle of the numerator of formula (24)

Compensation Scheme I:

The non-ideal quadrature relationship between two node voltages shown in (6) and (10) may be re-written as $$\frac{V_{n-j+1}}{V_{n-j}} = \frac{-g(1-sT)}{sC + sC_p + G_p} = \frac{-g + sgT}{G_p + s(C + C_p)} \quad (24)$$

in which $sC_p$ and $G_p$ represent the total parasitic capacitance and conductance, respectively, in parallel with the grounded capacitor with the capacitance C. Then, (i) the phase, shown in FIG. 25, of the numerator decreases by the angle $\arctan(\omega gT/g)$ from 180°, and (ii) the phase, shown in FIG. 26, of the denominator reduces by the angle $\arctan[G_p/\omega(C+C_p)]$ from 90°.

Figure 27:
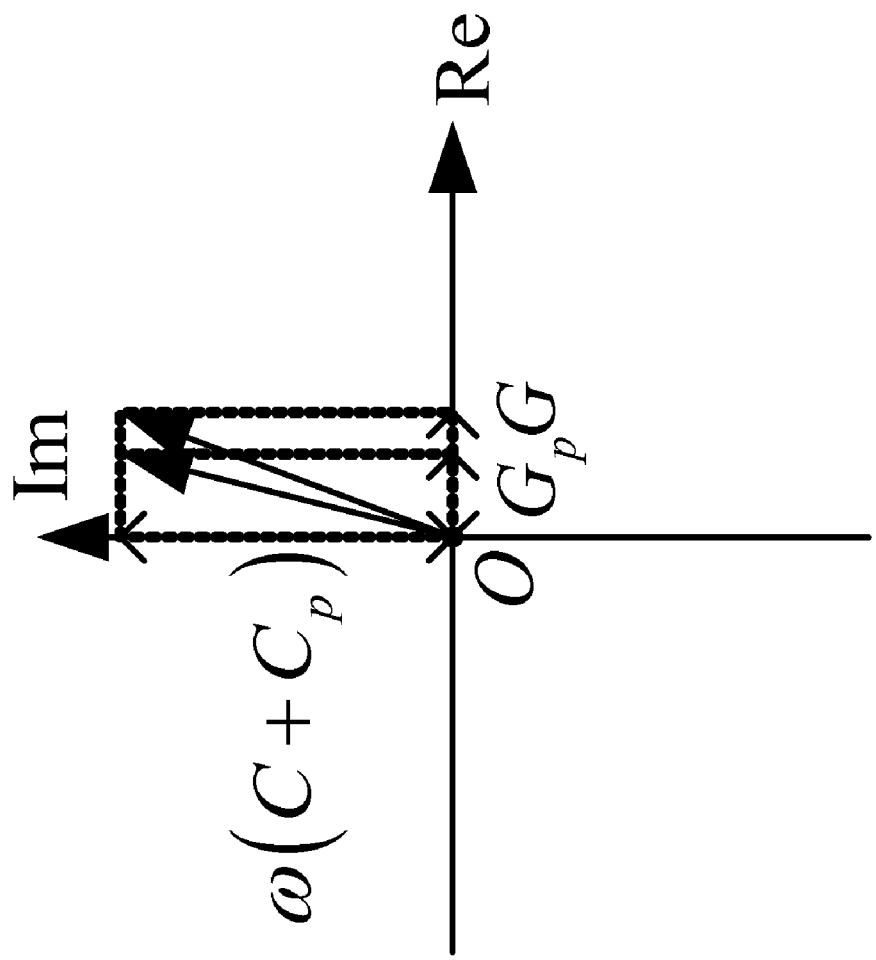
FIG. 27 shows the phase change of the denominator of formula (24) before and after compensation.

When the simulated phase shift is less than 90° (compared to theoretical phase shift 90°), the compensation scheme is to let the phase angle of the denominator be much smaller, that is, to shunt a small and proper conductance, G, in parallel with the grounded capacitor. Then, the phase change of the denominator of (24) before and after doing this compensation scheme is shown in FIG. 27.

Compensation Scheme II:

The non-ideal phase relationship between two node voltages shown in (13) may be re-written as $$\frac{V_{n-j+1}}{V_{n-j}} = \frac{-g(1-sT)}{sC_i + g_i(1-sT_i) + sC_p + G_p} = \frac{-g + sgT}{(g_i + G_p) + s(C + C_p - g_iT_i)} \quad (25)$$

in which $sC_p$ and $G_p$ represent the total parasitic capacitance and conductance, respectively, in parallel with the grounded capacitor with the capacitance C. Then, (i) the phase, shown in FIG. 25, of the numerator decreases by the angle $\arctan(\omega gT/g)$ from 180°, and (ii) the phase, shown in FIG. 28, of the denominator may (i) increase, (ii) keep the same, and (iii) decrease based upon three different possible cases for distinct magnitudes of Cp, Gp, and giTi. When the simulated phase shift is less than the prediction (please refer to the simulation section), the compensation scheme is to let the phase angle of the denominator be much smaller, that is, to give a little bit larger $g_i^*$ of the single-ended-input OTA which is in parallel with the grounded capacitor Ci. Then, the phase change of the denominator of (25) before and after doing this compensation scheme is shown in FIG. 29.

Figure 30:
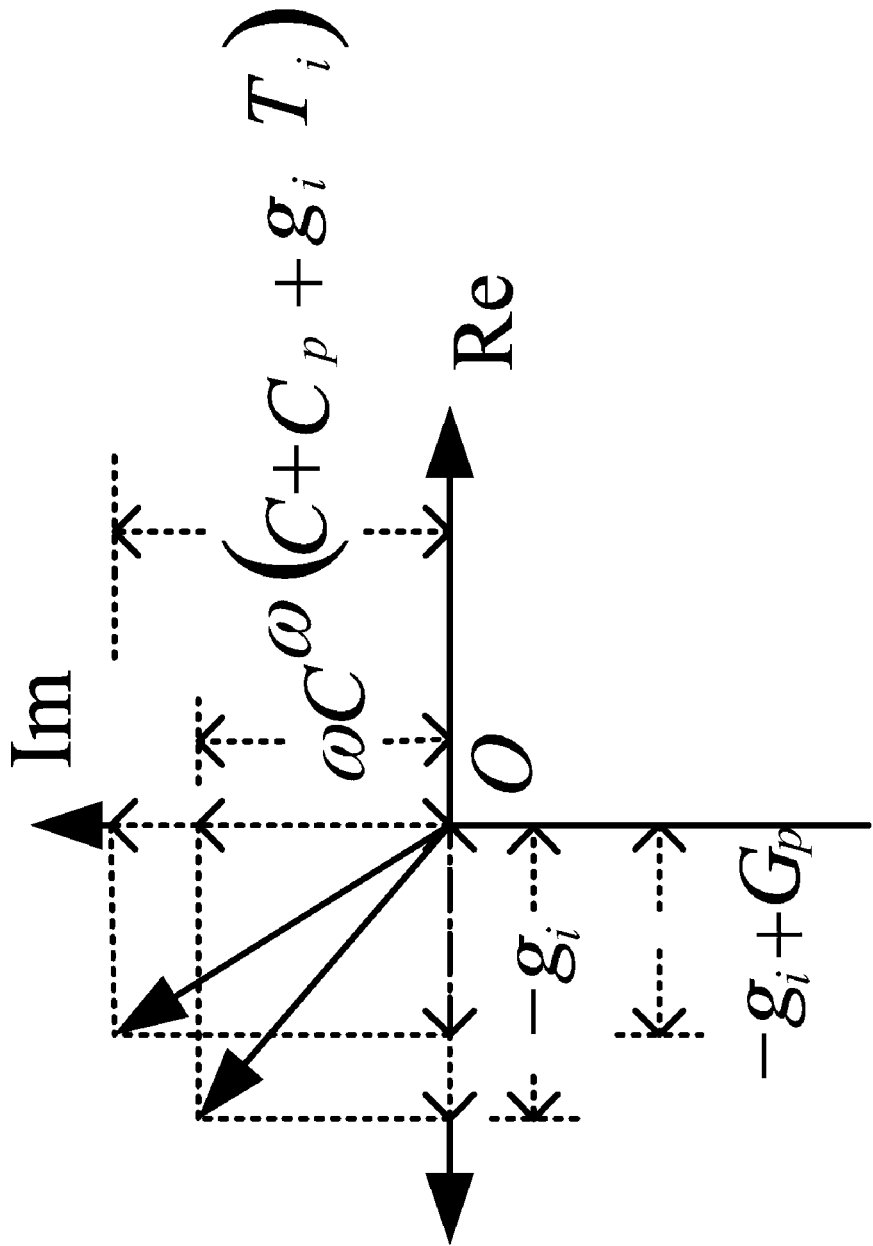
FIG. 30 shows the phase angle of the denominator of formula (26)
Figure 31:
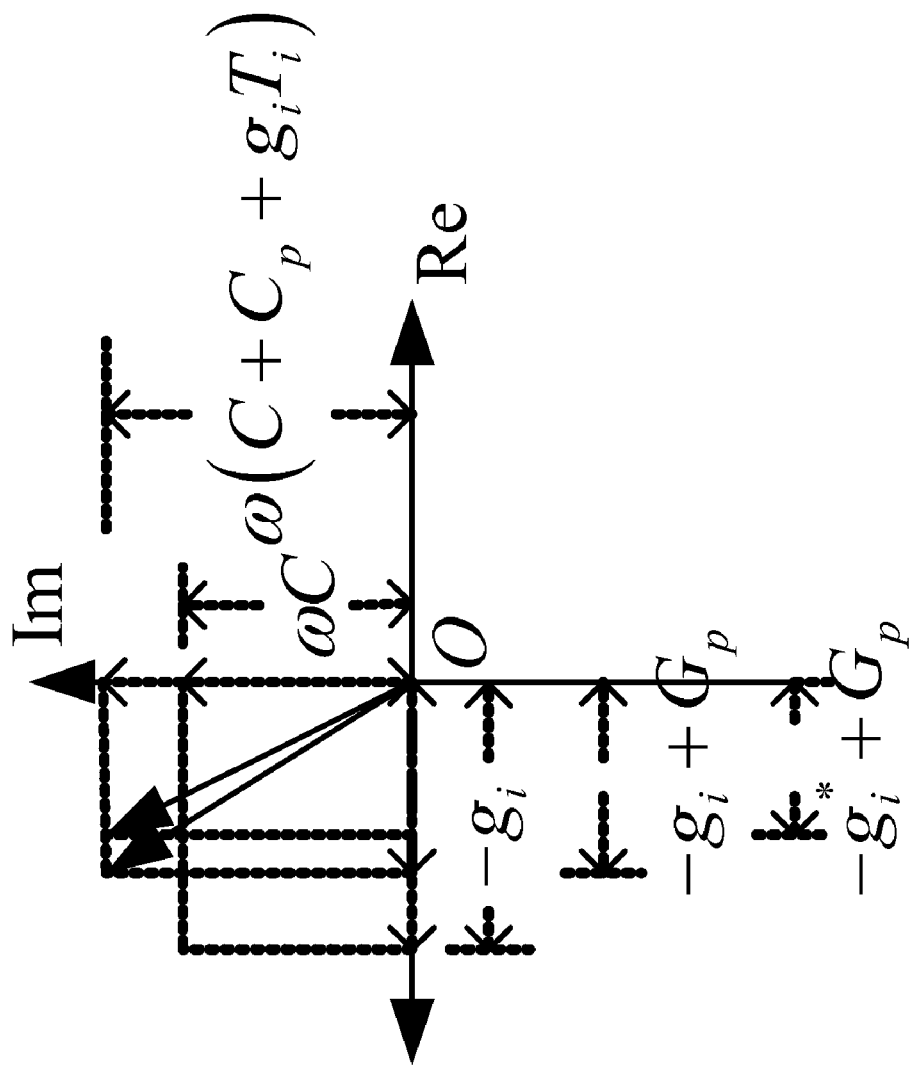
FIG. 31 shows the phase change of the denominator of formula (26) before and after compensation.

Compensation Scheme III:

The non-ideal phase relationship between two node voltages shown in (18) may be re-written as $$\frac{V_{n-j+1}}{V_{n-j}} = \frac{-g(1-sT)}{sC_i - g_i(1-sT_i) + sC_p + G_p} = \frac{-g + sgT}{(-g_i + G_p) + s(C + C_p + g_iT_i)} \quad (26)$$

in which $sC_p$ and $G_p$ represent the total parasitic capacitance and conductance, respectively, in parallel with the grounded capacitor with the capacitance C. Then, (i) the phase, shown in FIG. 25, of the numerator decreases by the angle $\arctan(\omega gT/g)$ from 180°, and (ii) the phase (in the second quadrant), shown in FIG. 30, of the denominator may decrease, due to the decrement of the absolute magnitude of the real part and the increment of the imaginary part. When the simulated phase shift is less than the prediction (please refer to the simulation section), the compensation scheme is to let the phase angle of the denominator be much smaller, that is, to give a little bit smaller $g_i^*$, to make a much smaller absolute magnitude of the real part, of the single-ended-input OTA which is in parallel with the grounded capacitor Ci. Then, the phase change of the denominator of (26) before and after doing this compensation scheme is shown in FIG. 31.

Compensation Scheme IV:

For the second-order quadrature oscillator shown in FIG. 4, the non-ideal phase relationship between two nodes shown in (a8) may be re-written as $$\frac{V_2}{V_1} = \frac{g(1-sT)}{sC + sC_p + G_p} = \frac{g - sgT}{G_p + s(C + C_p)} \quad (b1)$$

in which $sC_p$ and $G_p$ represent the total parasitic capacitance and conductance, respectively, in parallel with the grounded capacitor with the capacitance C.

Figure 26:
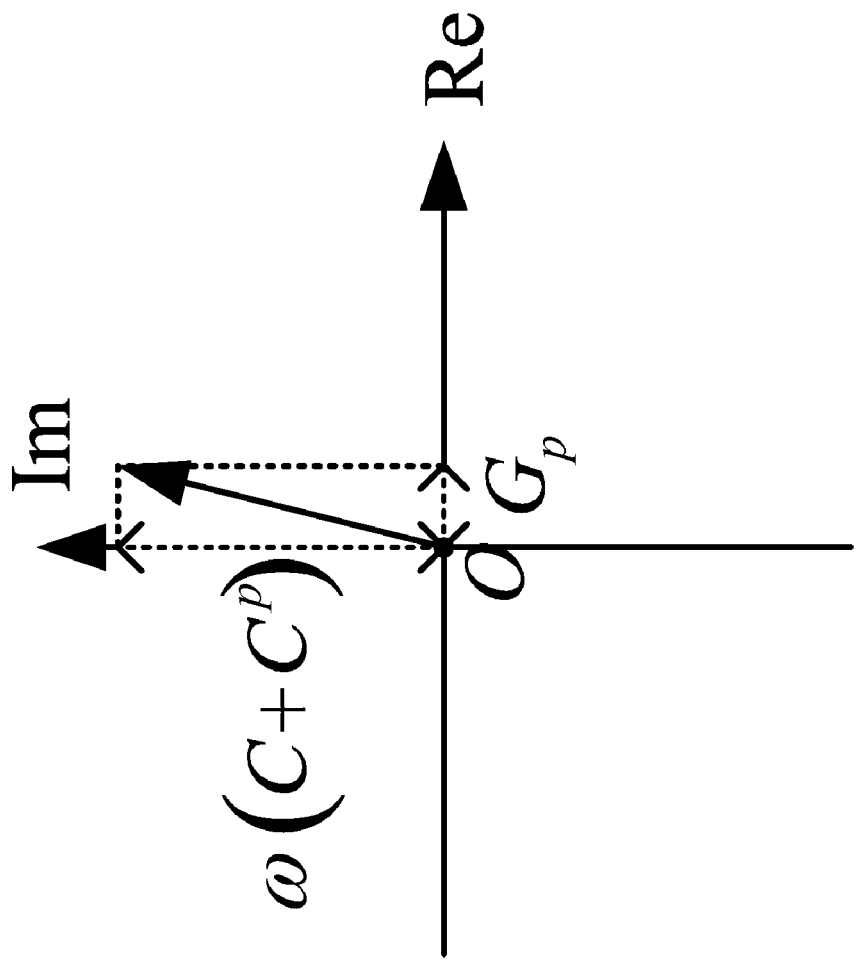
FIG. 26 shows the phase angle of the denominator of formula (24)
Figure 31A:
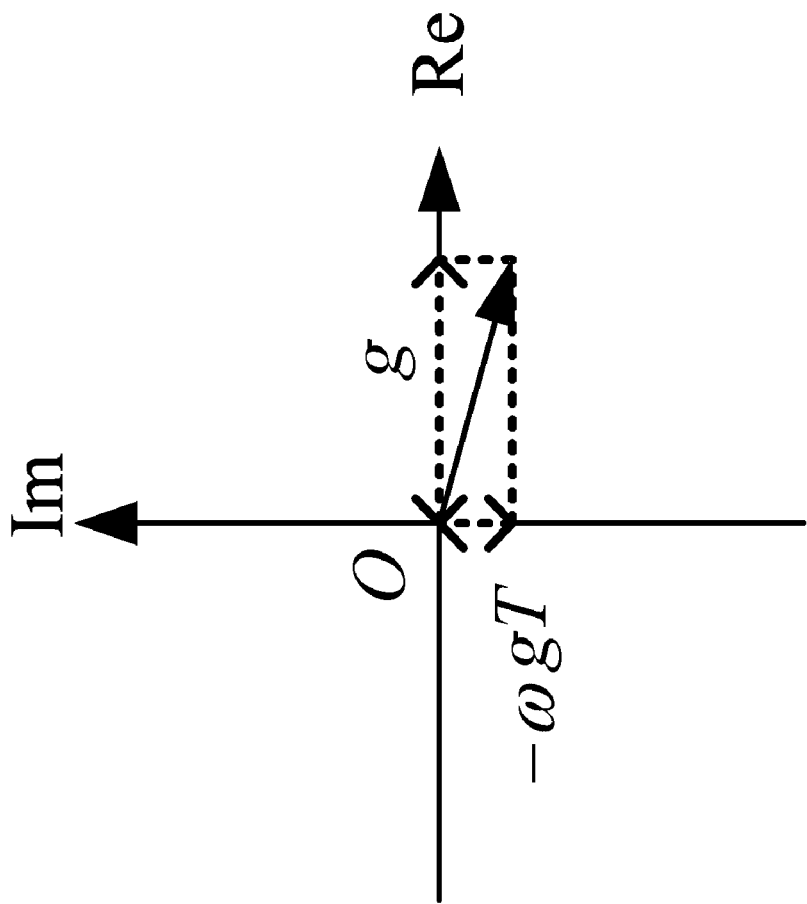
FIG. 31A is phase angle of the numerator of (b1)
Figure 31B:
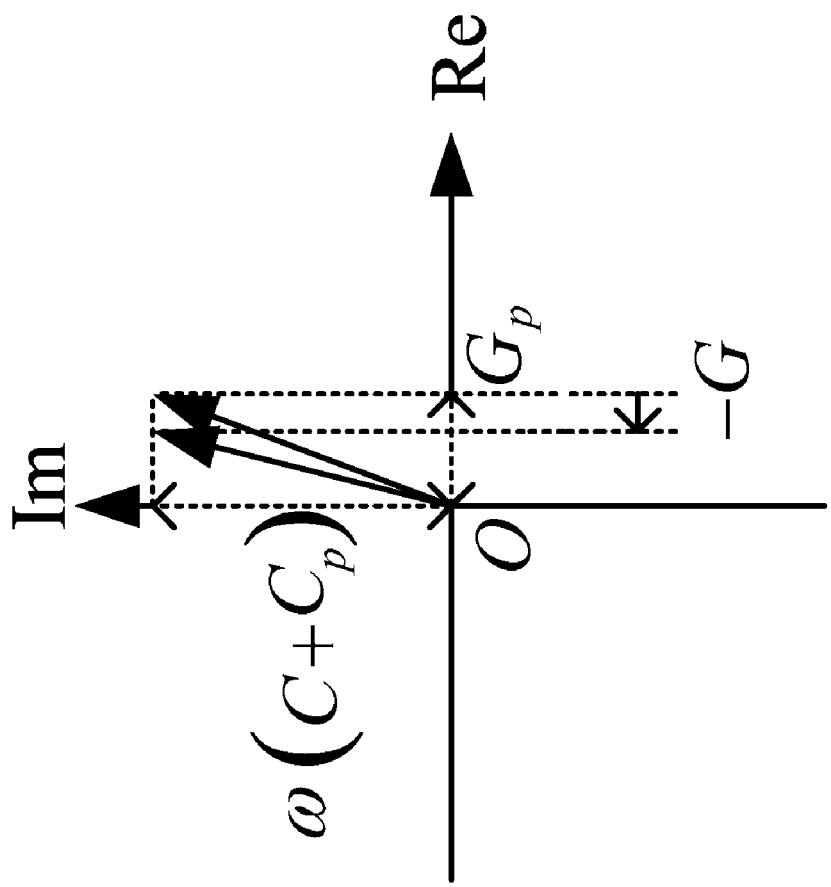
FIG. 31B is Phase change of the denominator of (b1) before and after compensation.

Then, (i) the phase, shown in FIG. 31A, of the numerator decreases by the angle $\arctan(\omega gT/g)$ from the standard 0°, and (ii) the phase, shown in FIG. 26, of the denominator reduces by the angle $\arctan[G_p/\omega(C+C_p)]$ from 90°. When the simulated phase shift is less (resp. larger) than 90° (compared to the theoretical phase shift 90°), the compensation scheme is to let the phase angle of the denominator be much larger (resp. smaller), that is, to shunt a small negative conductance, –G (resp. a small positive conductance G), in parallel with the grounded capacitor (a realization may use an OTA, which works like a negative ((resp. positive)) conductor, in parallel with the grounded capacitor). Then, the phase change of the denominator of (b1) before and after doing this compensation scheme is shown in FIG. 27.

Figure 23A:
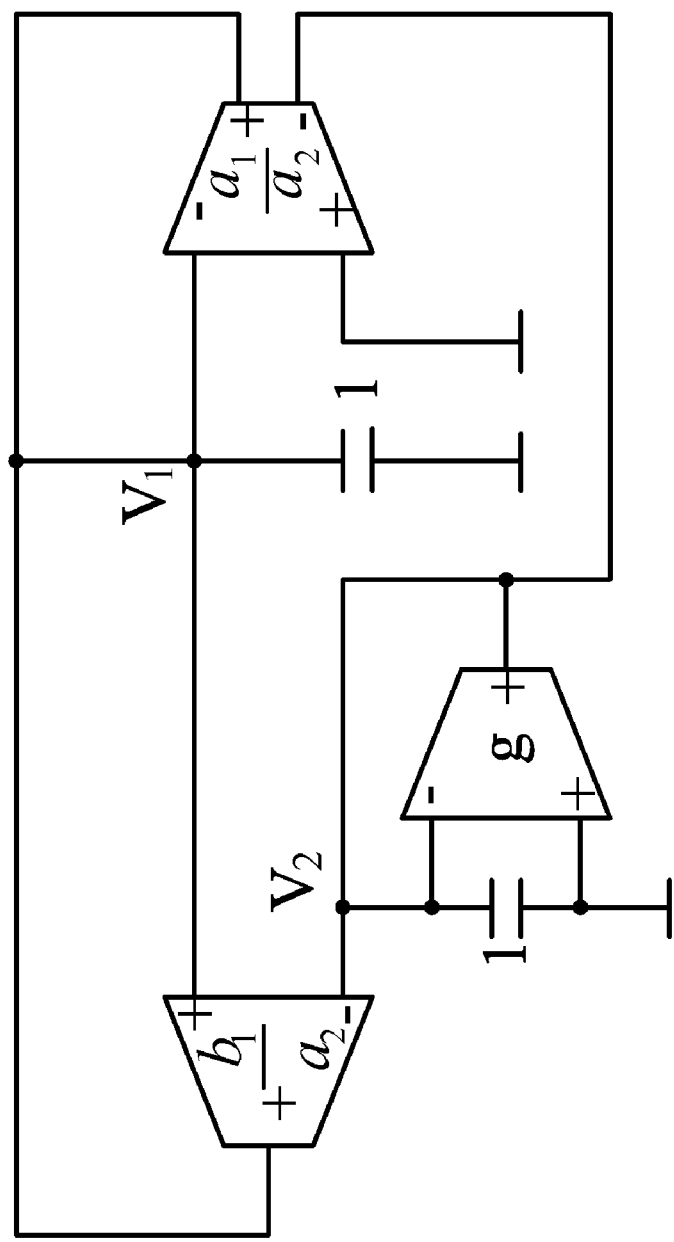
FIG. 23A is a second-order OTA-C oscillator designed from FIG. 3 with a phase shift lower than 90°.

Compensation Scheme V:

For the oscillator structure, shown in FIG. 23A, having phase shift lower than 90°, the non-ideal phase relationship between two node voltages shown in (a14) may be re-written as $$\frac{V_2}{V_1} = \frac{g(1-sT)}{sC_i + g_i(1-sT_i) + sC_p + G_p} = \frac{g - sgT}{(g_i + G_p) + s(C + C_p - g_iT_i)} \quad (a16)$$

in which $sC_p$ and $G_p$ represent the total parasitic capacitance and conductance, respectively, in parallel with the grounded capacitor with the capacitance C.

Figure 28:
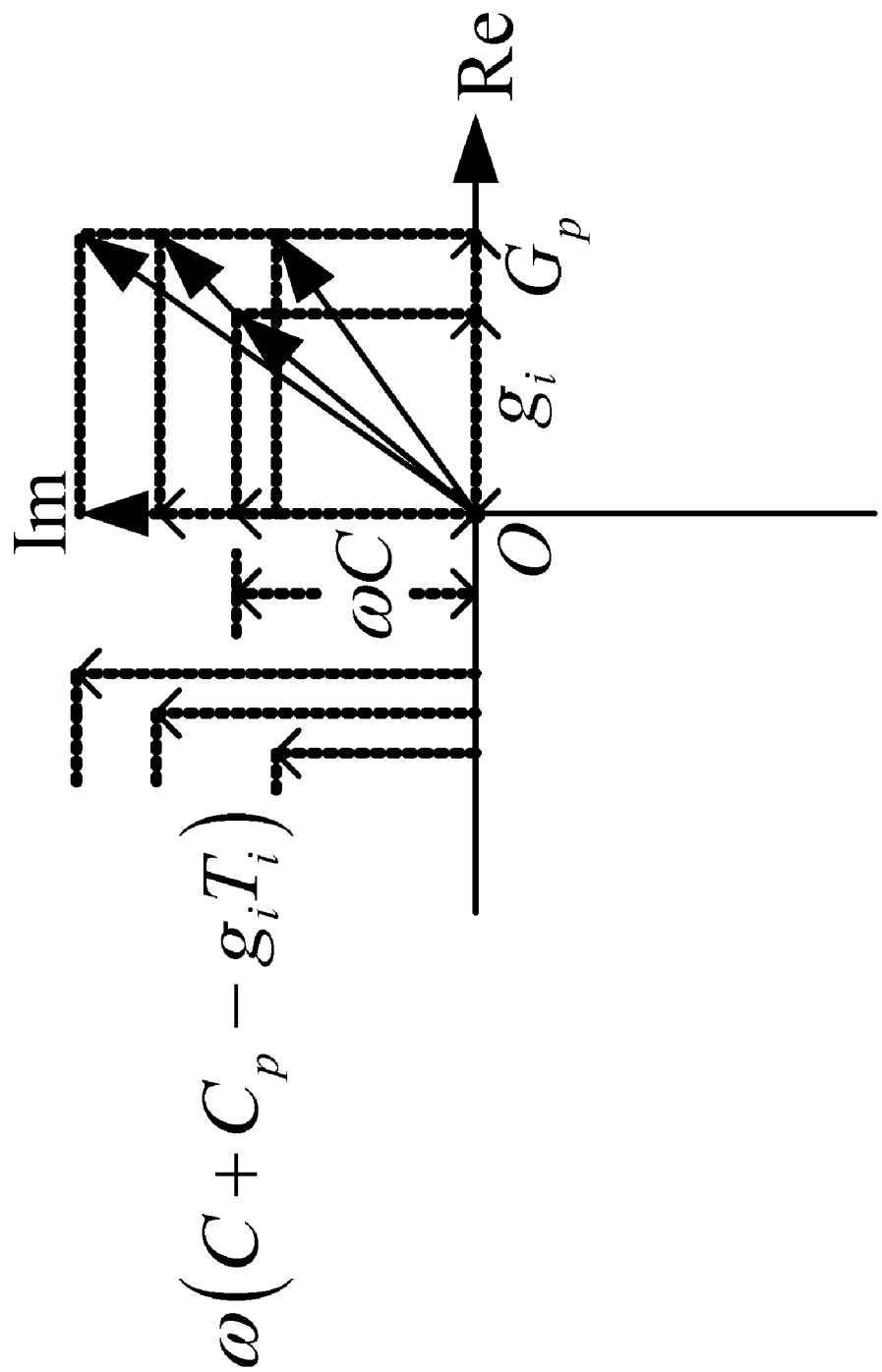
FIG. 28 shows the phase angles of the denominator of formula (25)
Figure 29:
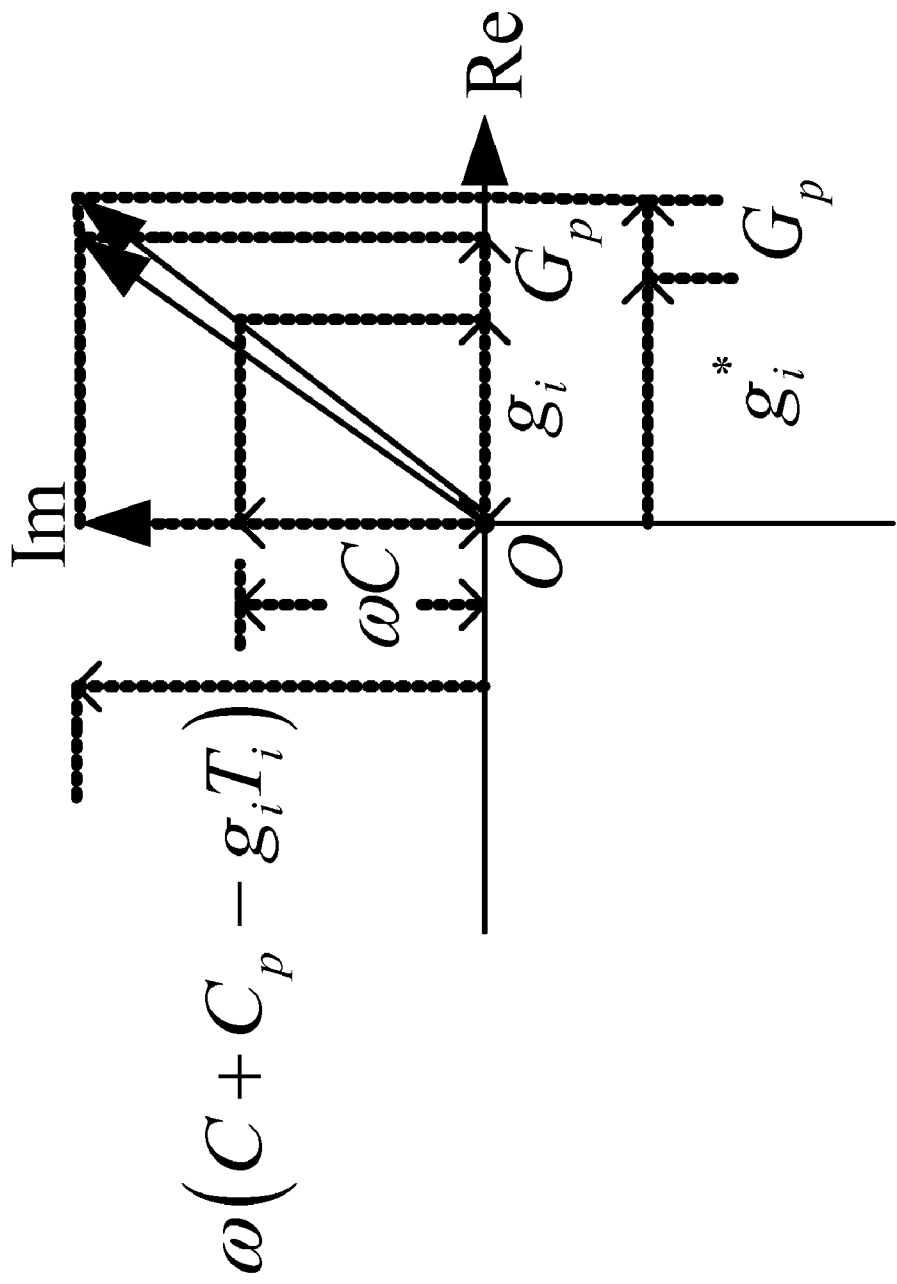
FIG. 29 shows the phase change of the denominator of formula (25) before and after compensation.
Figure 31C:
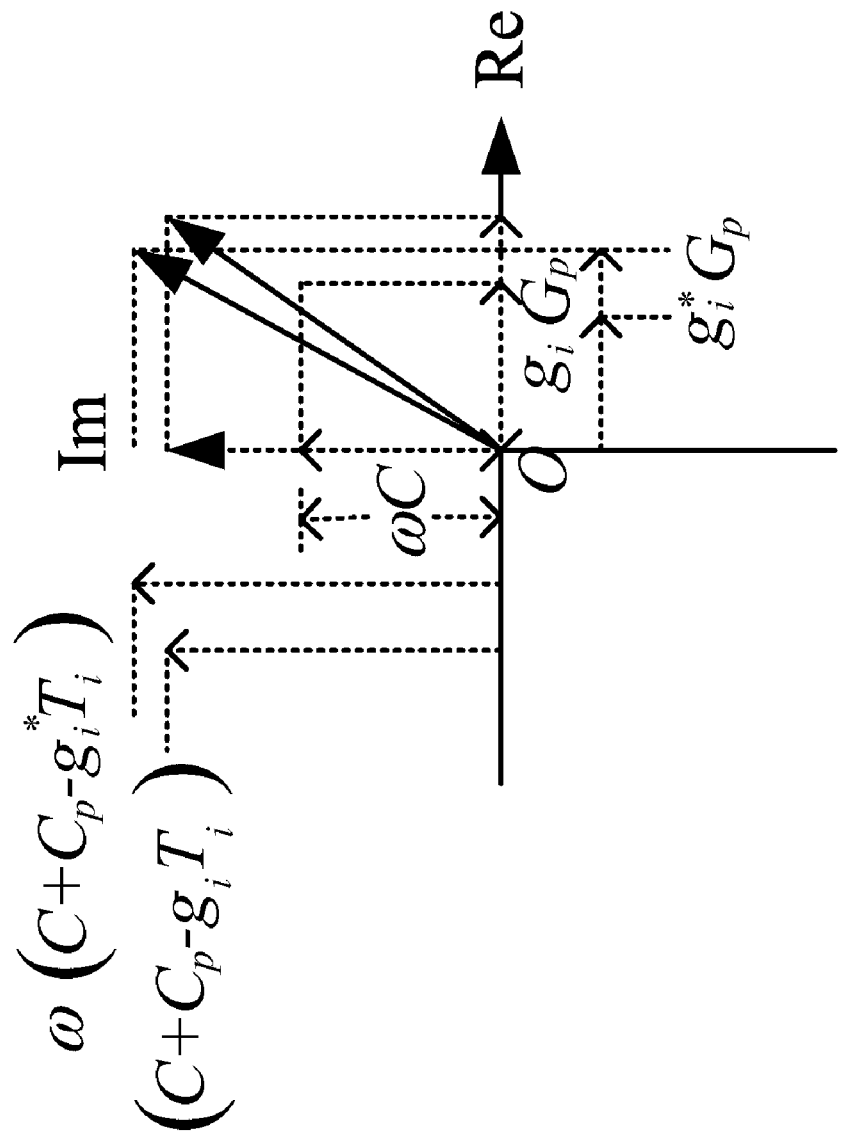
FIG. 31C is Phase change of the denominator of (b16) before and after compensation.

Then, (i) the phase, shown in FIG. 31A, of the numerator decreases by the angle $\arctan(\omega gT/g)$ from the standard 0°, and (ii) the phase, shown in FIG. 28, of the denominator may (i) increase, (ii) remain the same, and (iii) decrease based upon three different possible cases for distinct magnitudes of Cp, Gp, and giTi. When the simulated phase shift is less (resp. larger) than the prediction, the compensation scheme is to let the phase angle of the denominator be larger (resp. smaller), that is, to give a little bit smaller (resp. larger) $g_i^*$ of the single-ended-input OTA which is in parallel with the grounded capacitor C. Then, the phase change of the denominator of (a16) before and after doing this compensation scheme is shown in FIG. 31C. Note that the case shown in FIG. 4 belongs to this scheme when the phase shift is between 0° and 90°.

Figure 17A:
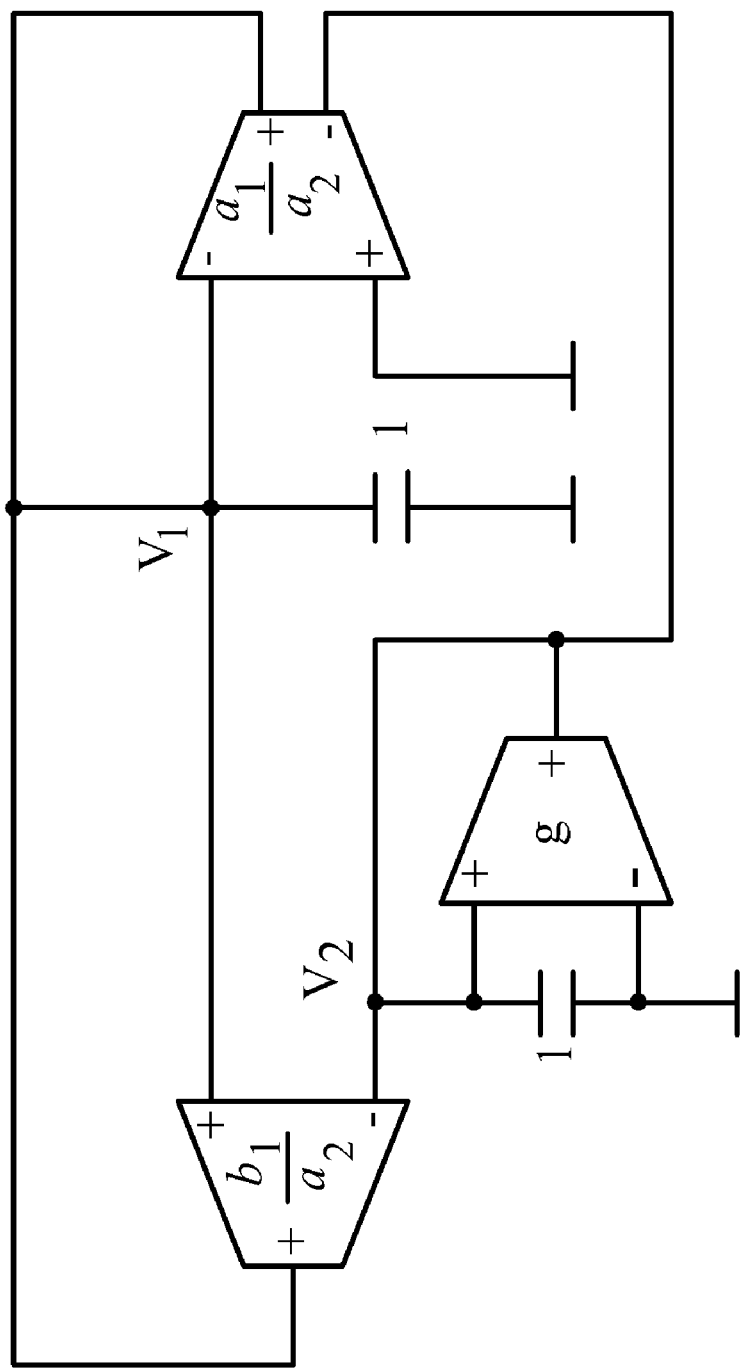
FIG. 17A shows Second-order OTA-C oscillator designed from FIG. 3 with a phase shift larger than 90° but lower than 180°.
Figure 31D:
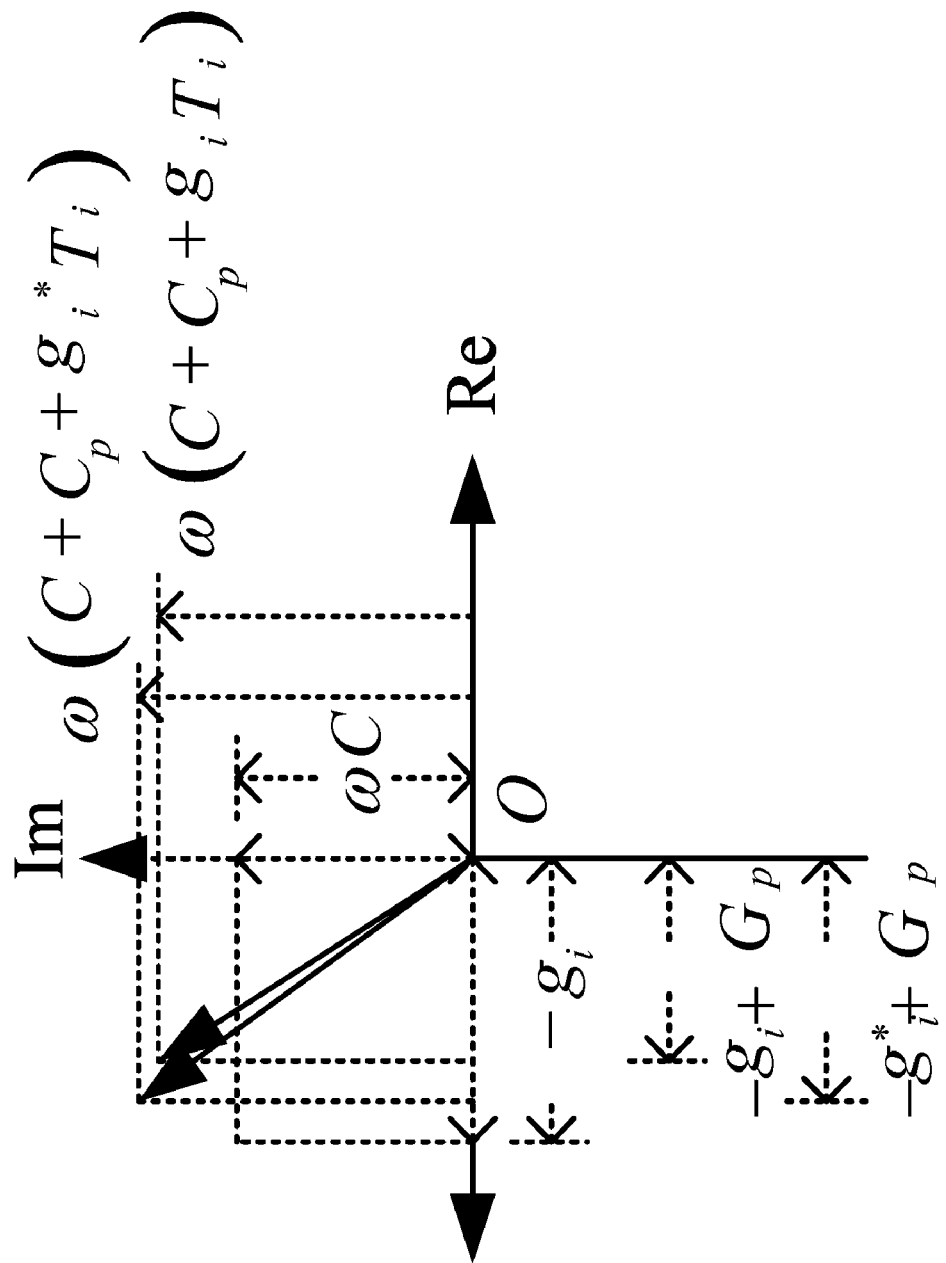
FIG. 31D is Phase change of the denominator of (a17) before and after compensation.

Compensation Scheme VI:

For the oscillator structure shown in FIG. 17A with the phase shift larger than 90° but smaller than 180°, the non-ideal phase relationship between two node voltages shown in (a12) may be re-written as $$\frac{V_2}{V_1} = \frac{g(1-sT)}{sC_i - g_i(1-sT_i) + sC_p + G_p} = \frac{g - sgT}{(-g_i + G_p) + s(C + C_p + g_iT_i)} \quad (a17)$$

in which $sC_p$ and $G_p$ represent the total parasitic capacitance and conductance, respectively, in parallel with the grounded capacitor with the capacitance C. Then, (i) the phase, shown in FIG. 31A, of the numerator decreases by the angle $\arctan(\omega gT/g)$ from 0°, and (ii) the phase (in the second quadrant), shown in FIG. 30, of the denominator may decrease, due to the decrement of the absolute magnitude of the real part and the increment of the imaginary part. When the simulated phase shift is less (resp. larger) than the prediction, the compensation scheme is to let the phase angle of the denominator be larger (resp. smaller), that is, to give a little bit larger (resp. smaller) $g_i^*$, of the single-ended-input OTA which is in parallel with the grounded capacitor C. Then, the phase change of the denominator of (a17) before and after doing this compensation scheme is shown in FIG. 31D. Note that the case shown in FIG. 4 belongs to this scheme when the phase shift is larger than 90° but lower than 180°.

Compensation Scheme VII:

From the de-normalization point of view, the larger the capacitance is the smaller the operating frequency, and the larger the conductance is the higher the operating frequency. Then, the effect of parasitic capacitance and parasitic conductance for the operating frequency is contrary. The parasitic capacitance makes the operating frequency be lower. On the contrary, the parasitic conductance makes the operating frequency be higher. Since the higher (resp. lower) the operating frequency is the more dominant the parasitic capacitance (resp. parasitic conductance) [49], we may conclude that the practical operating frequency may be lower (resp. higher) than the prediction when the circuit is operated at high (resp. low) frequencies. Therefore, if the practical operating frequency is lower (resp. higher) than the prediction at high frequencies (resp. low frequencies), it means that the parasitic capacitance (resp. conductance) is more dominant than the parasitic conductance (resp. capacitance), the compensation scheme is to reduce a little bit capacitance (resp. conductance) from the realized circuit and vice versa.

5. H-Spice Simulations

Five different cases, i.e., (i) a third-order oscillator with two 90° phase shifts, (ii) a third-order one with two 120° phase shifts, (iii) a third-order one with two 60° phase shifts, (iv) a fourth-order one with three 90° phase shifts, and (v) a fourth-order one with 90°, 120°, and 60° phase shifts, will be given for the demonstrations of the realized any-phase-shift OTA-C sinusoidal oscillator structure shown as above. Moreover, the above case (v) will be given for verifying the compensation schemes presented in the above section. To validate the theoretical predictions, 0.35 μm process H-spice simulations are now used. We employ the CMOS implementation of a transconductor reported in [51], with ±1.65 V supply voltages.

Figure 32:
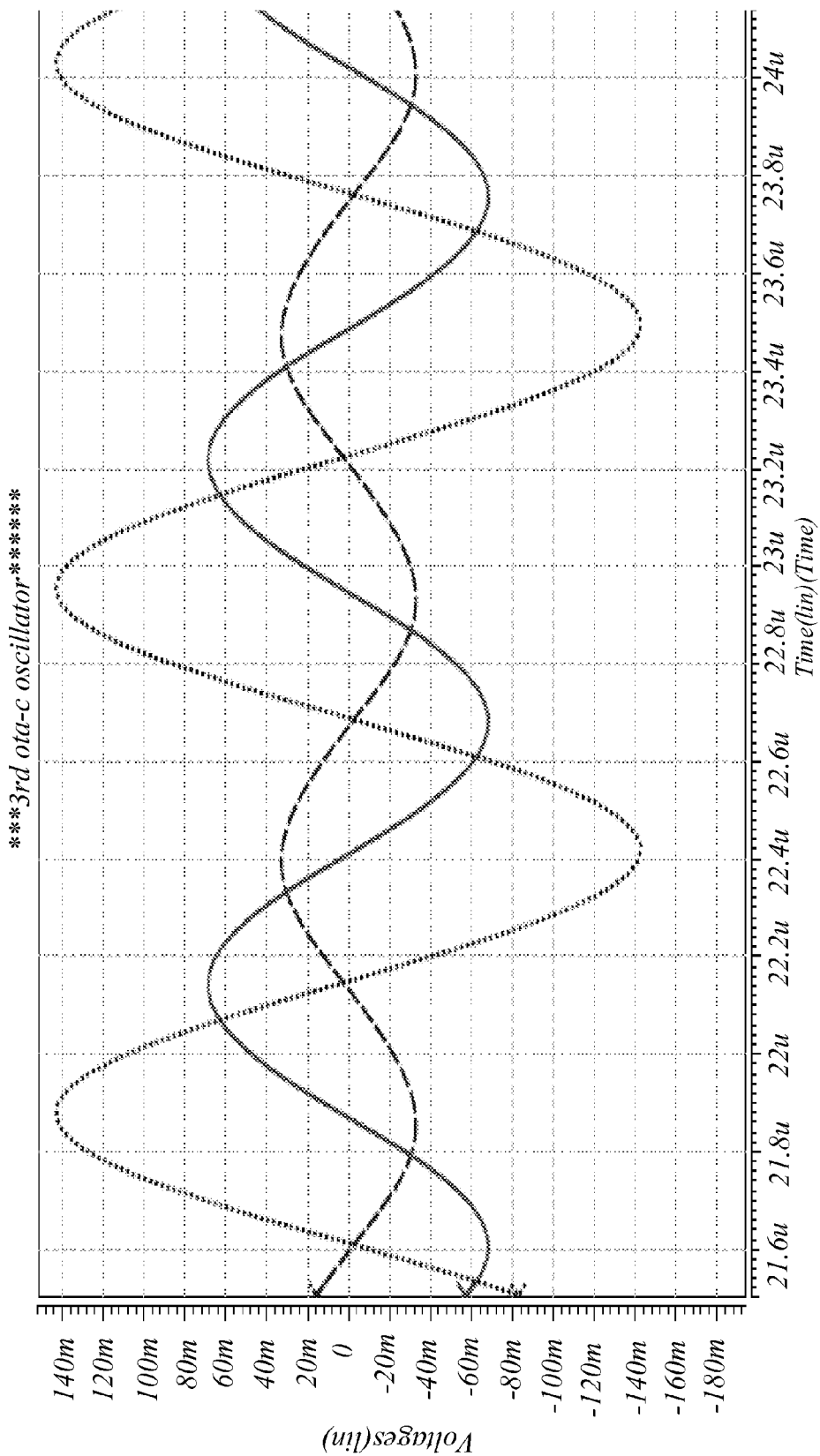
FIG. 32 shows the oscillation waveforms of V1, V2, and V3 for case 1.
Figure 33:
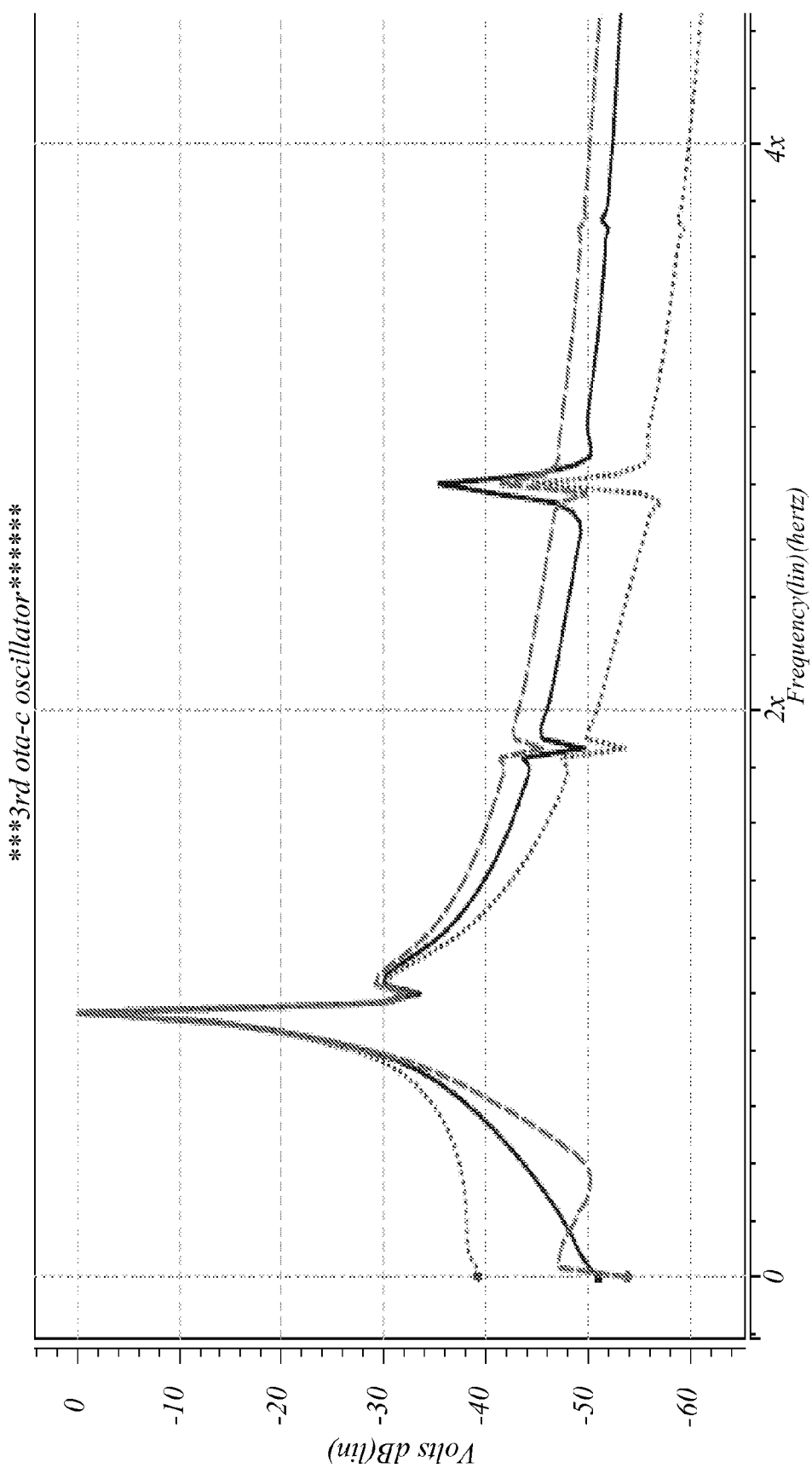
FIG. 33 shows the frequency spectrums of V1, V2, and V3 for case 1.

Case I (Third-Order One with Two 90° Phase Shifts):

Let the W/L be 10μ/2μ, and 10μ/1μ for NMOS and PMOS transistors, respectively, in a CMOS OTA. The component values are given by C1=40 pF, C2=10 pF, C3=10 pF, and g1=g2=125.664 μS (Ib=22.776 μA), g3=31.416 μS (Ib=3.392 μA). The component sequence, 1-2-3, is counted from the left side to the right side in the circuit structure. The oscillation waveforms of the node voltages, V1, V2, and V3 are shown in FIG. 32, whose frequency spectrums are shown in FIG. 33. The total harmonic distortions (THDs) of V1, V2, and V3, are 1.8461%, 0.5671%, and 0.6281%, respectively. The phase of V1 lags behind V2 by 86.868° with error 3.48% and the phase of V2 lags behind V3 by 86.816° with error 3.54%. The simulation frequency is 928.988 kHz with error 7.1012% compared to the theoretical 1 MHz.

Figure 34:
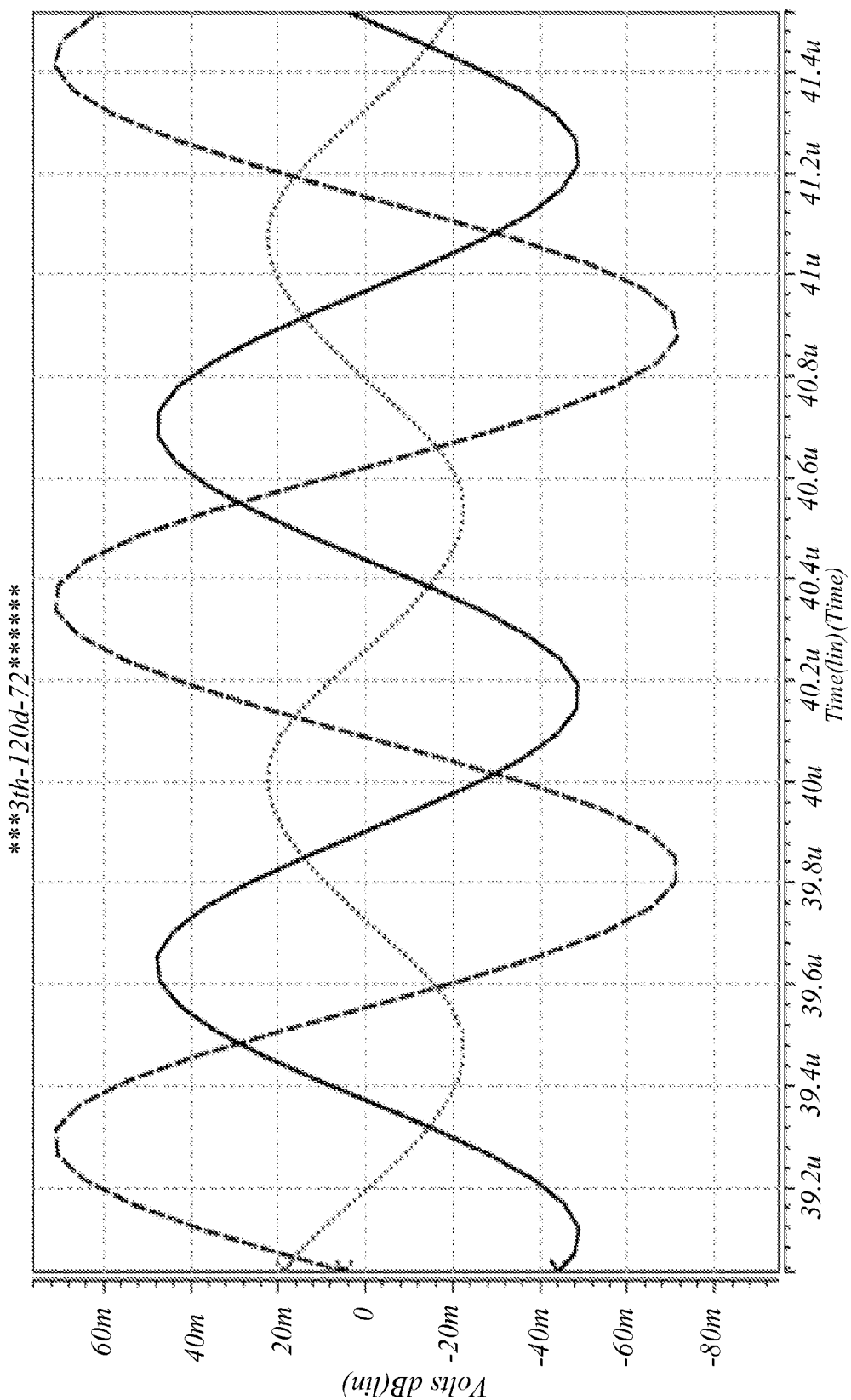
FIG. 34 shows the oscillation waveforms of V1, V2, and V3 for case 2.
Figure 35:
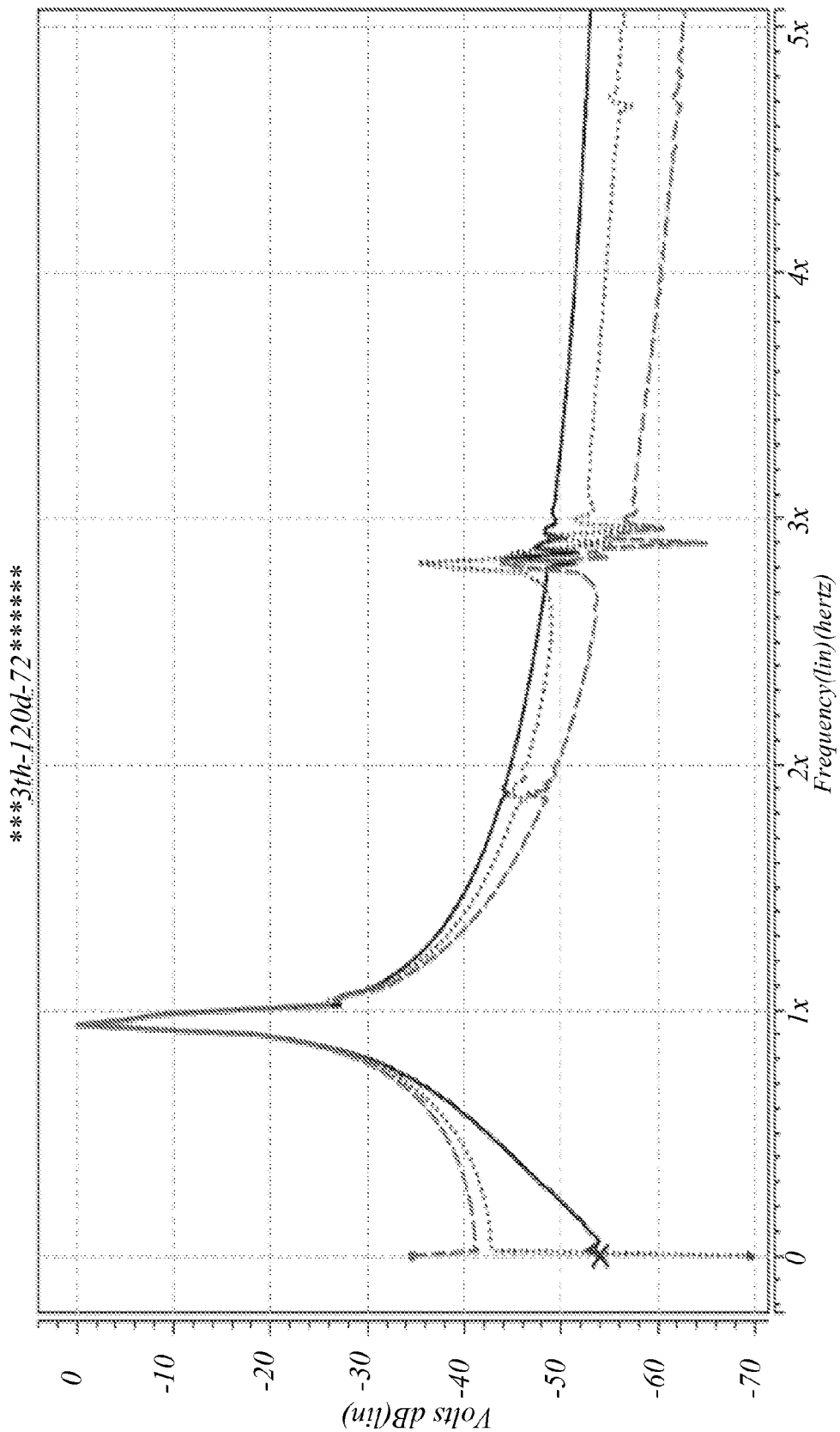
FIG. 35 shows the frequency spectrums of V1, V2, and V3 for case 2.

Case II (Third-Order One with Two 120° Phase Shifts):

Let the W/L be (i) 5μ/0.5μ and 5μ/0.5μ, (ii) 20μ/0.5μ and 20μ/0.5μ, (iii) 20μ/0.5μ and 20μ/0.5μ, (iv) 5μ/2.5μ and 10μ/2.5μ, and (v) 5μ/2.5μ and 10μ/2.5μ, for NMOS and PMOS transistors, respectively, in the (i) OTA1, (ii) OTA2, (iii) OTA3, (iv) OTA4, and (v) OTA5. The component values are given by C1=20 pF, C2=10 pF, C3=10 pF, and g1=24.184 μS (Ib=2.042 μA), g2=g3=145.039 μS (Ib=12.638 μA), g4=g5=36.276 μS (Ib=5.465 μA). The oscillation waveforms of the node voltages, V1, V2, and V3, are shown in FIG. 34, whose frequency spectrums are shown in FIG. 35. The THDs of V1, V2, and V3, are 0.6119%, 1.8691%, and 0.7293%, respectively. The phase of V1 lags behind V2 by 121.141° with error 0.951% and the phase of V2 lags behind V3 by 121.378° with error 1.148%. The simulation frequency is 938.262 kHz with error 6.174% compared to the theoretical 1 MHz.

Figure 36:
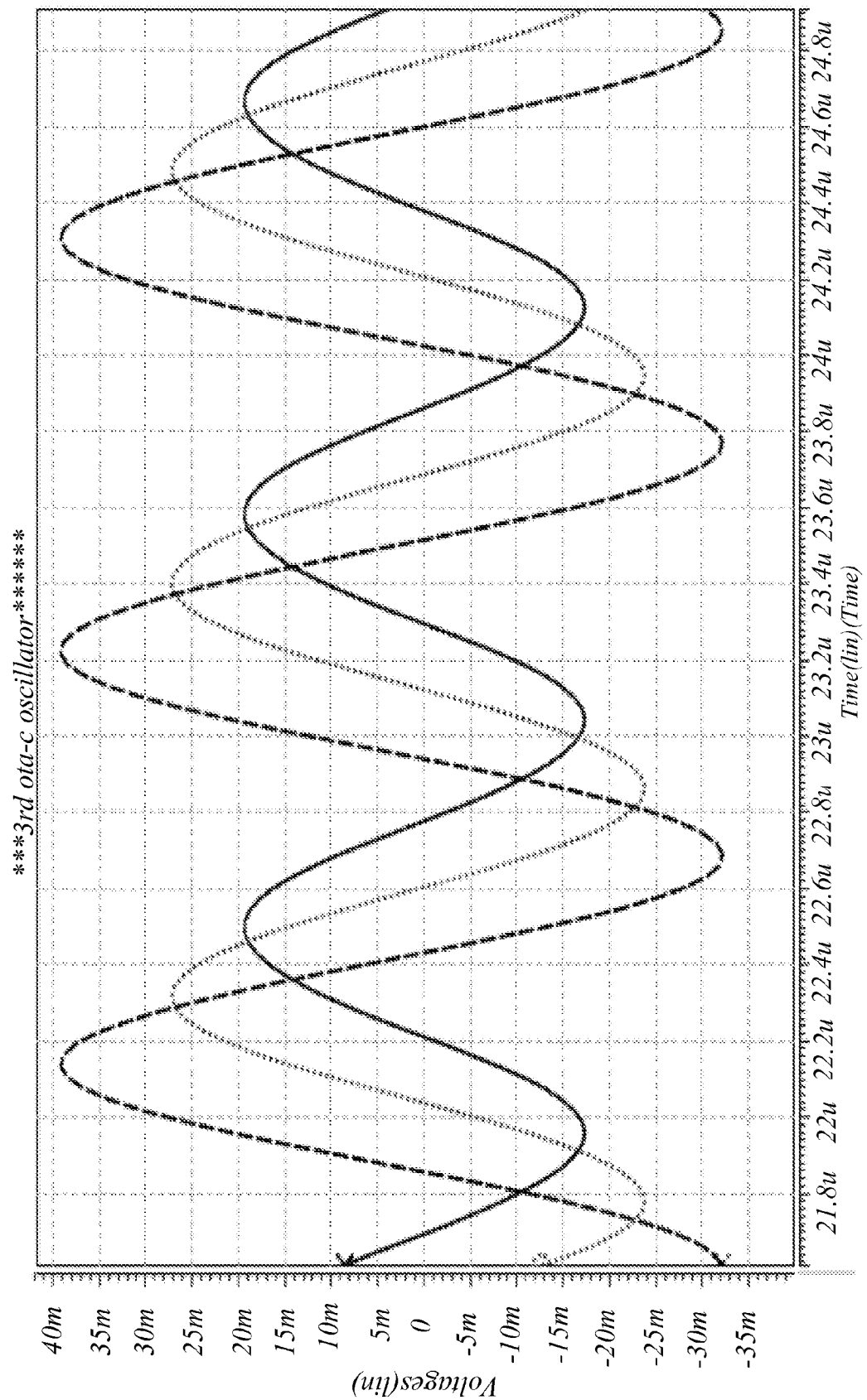
FIG. 36 shows the oscillation waveforms of V1, V2, and V3 for case 3.
Figure 37:
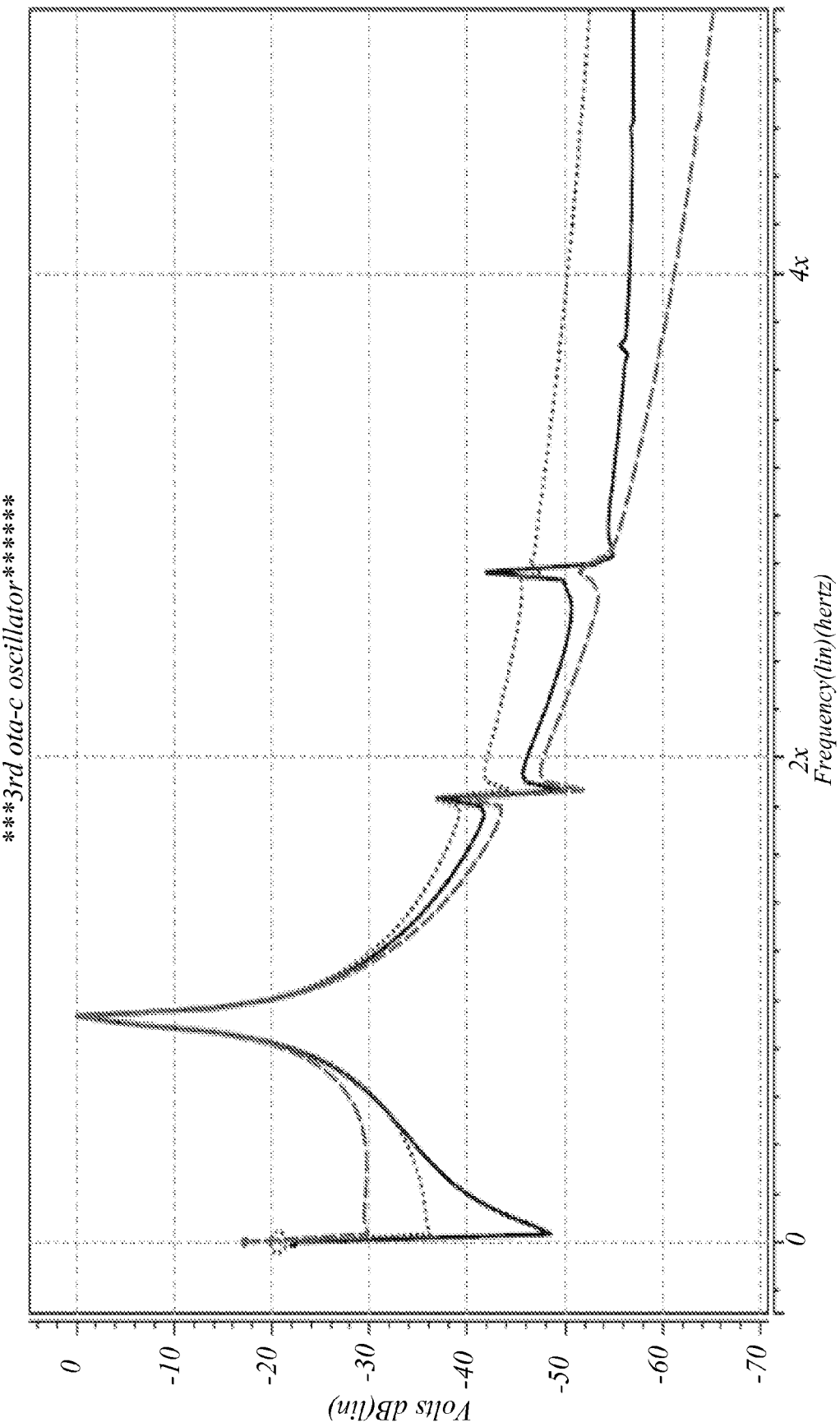
FIG. 37 shows the frequency spectrums of V1, V2, and V3 for case 3.

Case III (Third-Order One with Two 60° Phase Shifts):

We give the W/L=(i) 5μ/1μ and 10μ/1μ, (ii) 5μ/1μ and 10μ/1μ, (iii) 20μ/1μ and 20μ/1μ, (iv) 20μ/1μ and 20μ/1μ, and (v) 20μ/1μ and 20μ/1μ, for NMOS and PMOS transistors in the (i) OTA1, (ii) OTA2, (iii) OTA3, (iv) OTA4, and (v) OTA5, respectively. The component values are given by C1=10 pF, C2=10 pF, C3=10 pF, and g1=g2=99.108 μS (Ib=14.568 μA), g3=33.671 μS (Ib=2.820 μA), g4=g5=36.258 μS (Ib=3.055 μA). The oscillation waveforms of the node voltages, V1, V2, and V3, are shown in FIG. 36, whose frequency spectrums are shown in FIG. 37. The THDs of V1, V2, and V3, are 1.1329%, 0.6897%, and 0.7842%, respectively. The phase of V1 lags behind V2 by 58.162° with error 3.063% and the phase of V2 lags behind V3 by 58.74° with error 2.10%. The simulation frequency is 922.131 kHz with error 7.787% compared to the theoretical 1 MHz.

Figure 38:
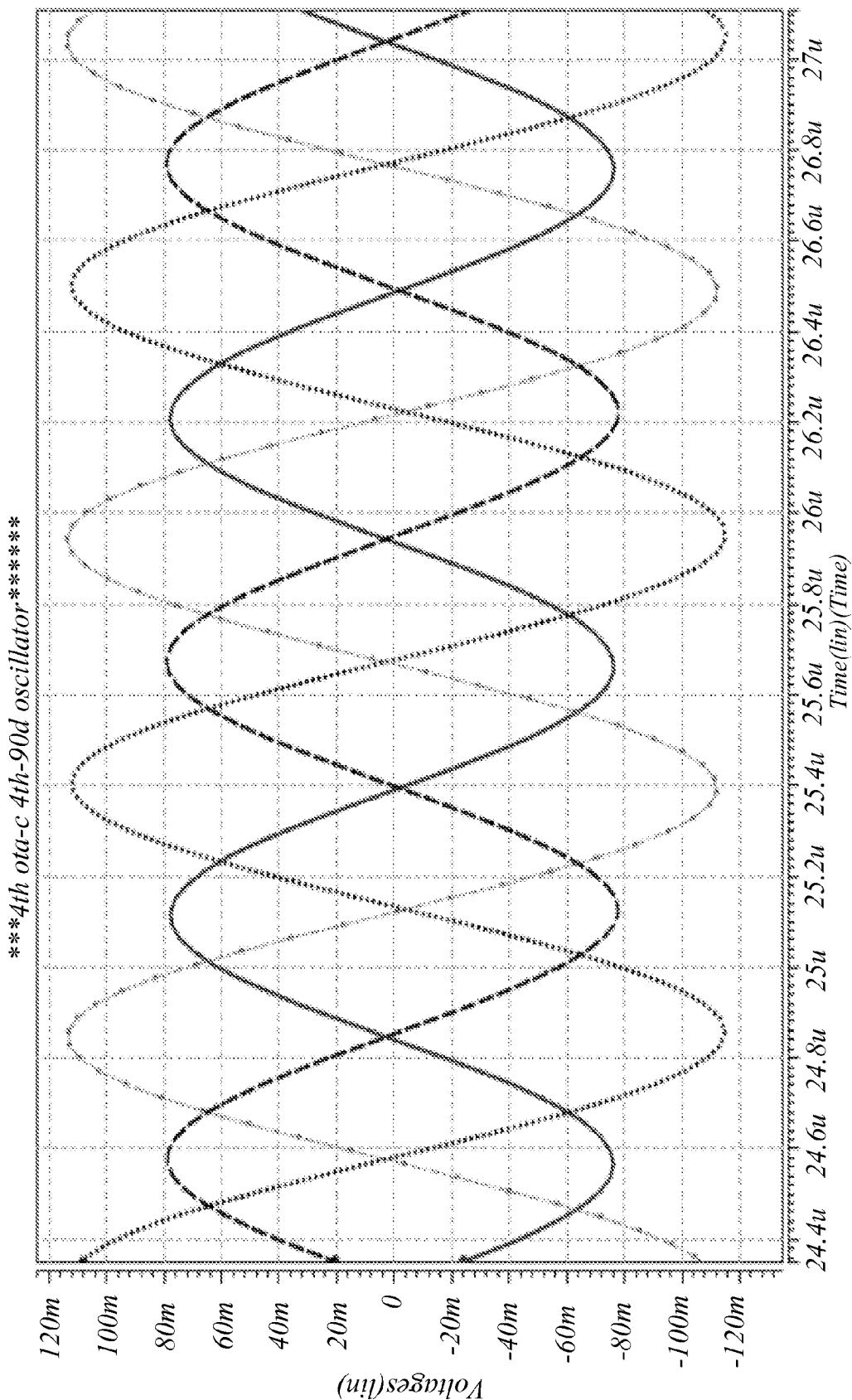
FIG. 38 shows the oscillation waveforms of V1, V2, and V3 for case 4.
Figure 39:
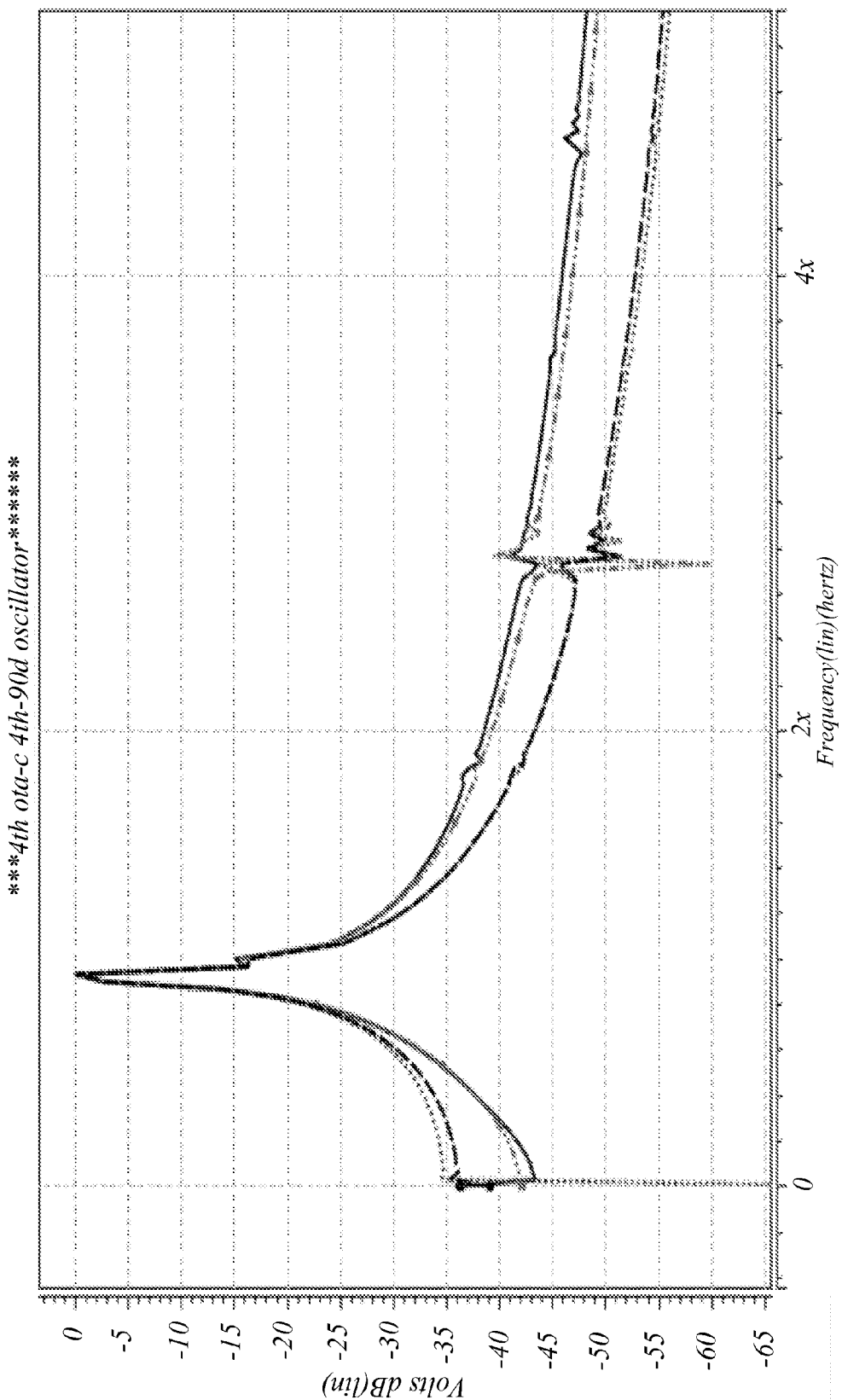
FIG. 39 shows the frequency spectrums of V1, V2, and V3 for case 4.

Case IV (Fourth-Order One with Three 90° Phase Shifts):

Let the W/L be 5μ/1μ and 10μ/1μ for NMOS and PMOS transistors, respectively, in a CMOS OTA. The component values are given by C1=10 pF, C2=10 pF, C3=20 pF, C4=10 pF, and g1=g2=g3=88.858 μS (Ib=12.301 μA), g4=44.429 μS (Ib=4.773 μA). The oscillation waveforms of the node voltages, V1, V2, and V3, are shown in FIG. 38, whose frequency spectrums are shown in FIG. 39. The THDs of V1, V2, V3, and V4, are 0.4605%, 0.6972%, 0.9910%, and 0.5075%, respect-tively. The phase of V1 lags behind V2 by 88.187° with error 2.014%, and the phase of V2 lags behind V3 by 88.269° with error 1.923%, and the phase of V3 lags behind V4 by 88.149° with error 2.057%. The simulation frequency is 910 kHz with error 9.00% compared to the theoretical 1 MHz.

Figure 40:
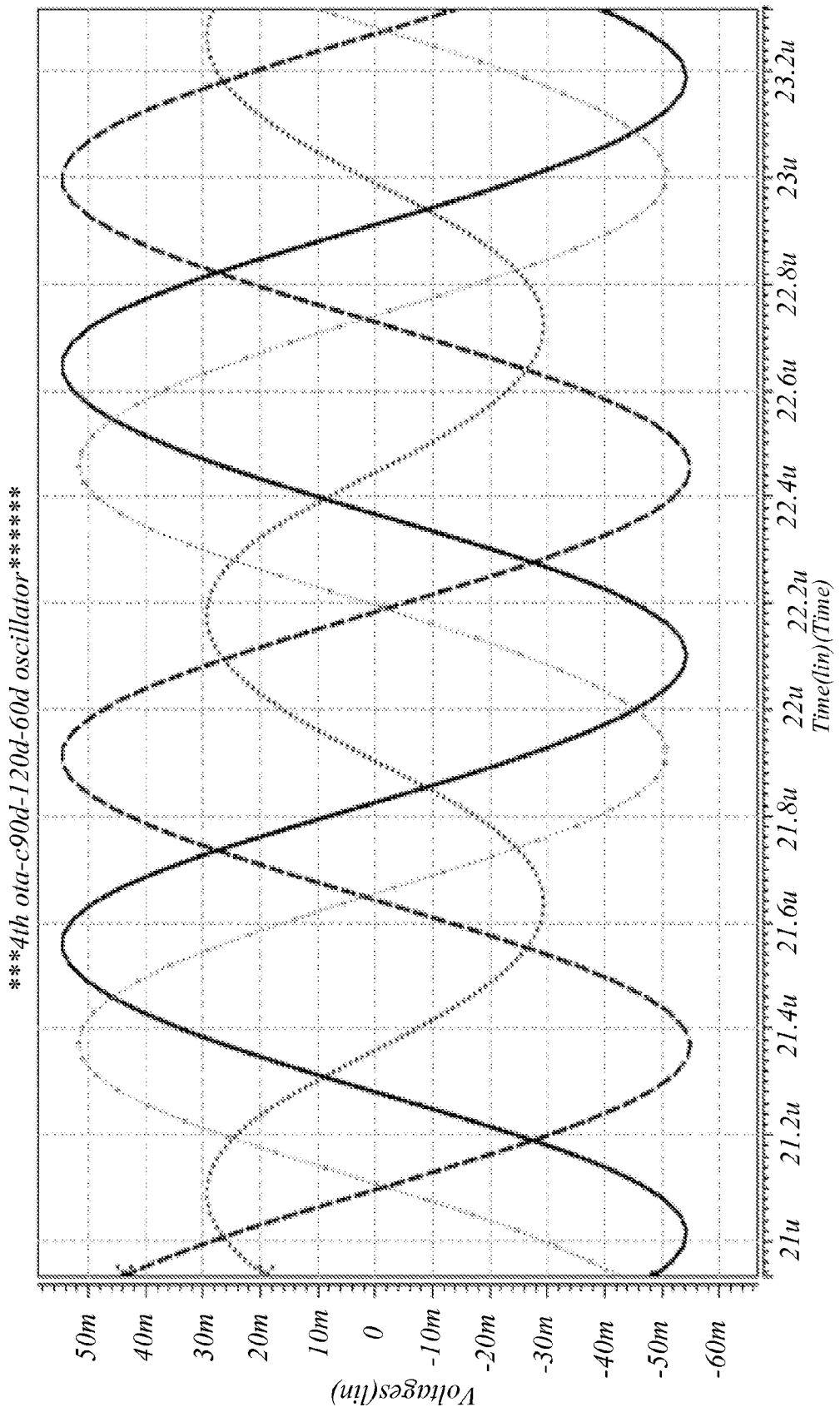
FIG. 40 shows the oscillation waveforms of V1, V2, V3, and V4 for case 5 before compensation.
Figure 41:
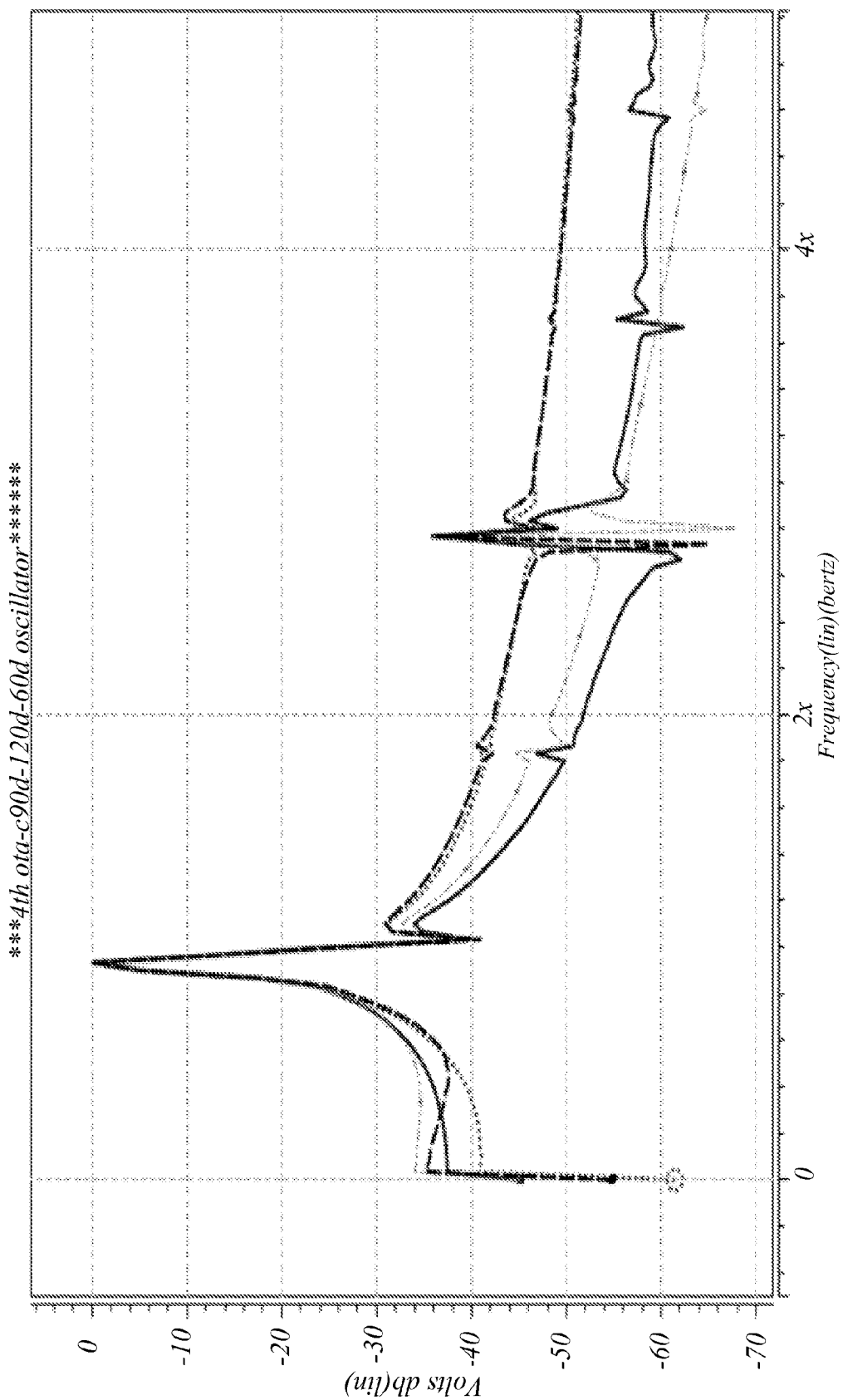
FIG. 41 shows the frequency spectrums of V1, V2, V3, and V4 for case 5 before compensation.

Case V (Fourth-Order One with Three Phase Shifts, 90°, 120°, and 60°):

Let the W/L be (i) 20μ/1μ and 20μ/1μ, (ii) 5μ/2μ and 10μ/1μ, and (iii) 10μ/2μ and 10μ/2μ, for NMOS and PMOS transistors, respectively, in the (i) OTA1 to OTA4, (ii) OTA5, and (iii) OTA6. The component values are given by C1=10 pF, C2=10 pF, C3=10 pF, C4=10 pF, and g1=108.828 μS (Ib=10.365 μA), g2=g3=g4=72.552 μS (Ib=6.518 μA), g5=36.276 µS (Ib=5.65 µA), g6=36.276 µS (Ib=3.75 µA). The oscillation waveforms of the node voltages, V1, V2, and V3, are shown in FIG. 40, whose frequency spectrums are shown in FIG. 41. The THDs of V1, V2, V3, and V4, are 1.7015%, 0.7490%, 0.9159%, and 1.2211%, respectively. The phase of V1 lags behind V2 by 87.184° with error 3.129%, and the phase of V2 lags behind V3 by 118.637° with error 1.136%, and the phase of V3 lags behind V4 by 57.904° with error 3.493%. The simulation frequency is 920.166 kHz with error 7.983% compared to the theoretical 1 MHz.

Compensation I (Fourth-Order One with Three Phase Shifts, 90°, 120°, and 60°):

Compensation schemes I, II, and III shown in Section IV are applied to this fourth-order oscillator with three phase shifts, 90°, 120°, and 60°. If insert a big resistor 420 kΩ in parallel with the capacitor C2 (scheme I), enlarge the bias current 4.912 µA to 5.50 µA for the OTA5 (scheme III), and reduce the bias current 3.988 µA to 3.82 µA for the OTA6 (scheme II), then 1. the phase shifts, 87.184° with error 3.129%, 118.637° with error 1.136%, and 57.904° with error 3.493%, are replaced by 89.145° with error 0.95%, 119.099° with error 0.75%, and 59.846° with error 0.257%, respectively, (note that all errors are within 1%),
2. the THDs of V1, V2, V3, and V4, are simultaneously, reduced to 0.121% from 1.702%, 0.072% from 0.749%, 0.113% from 0.916%, and 0.052% from 1.221%, respectively, (note that all THDs are much lower than the standard value, 1%),
3. the frequency of oscillation is changed to 996.403 kHz with error 0.36% from 920.166 with error 9.783% without carrying out the above compensation scheme IV, namely, without changing the original given capacitances.

Figure 42:
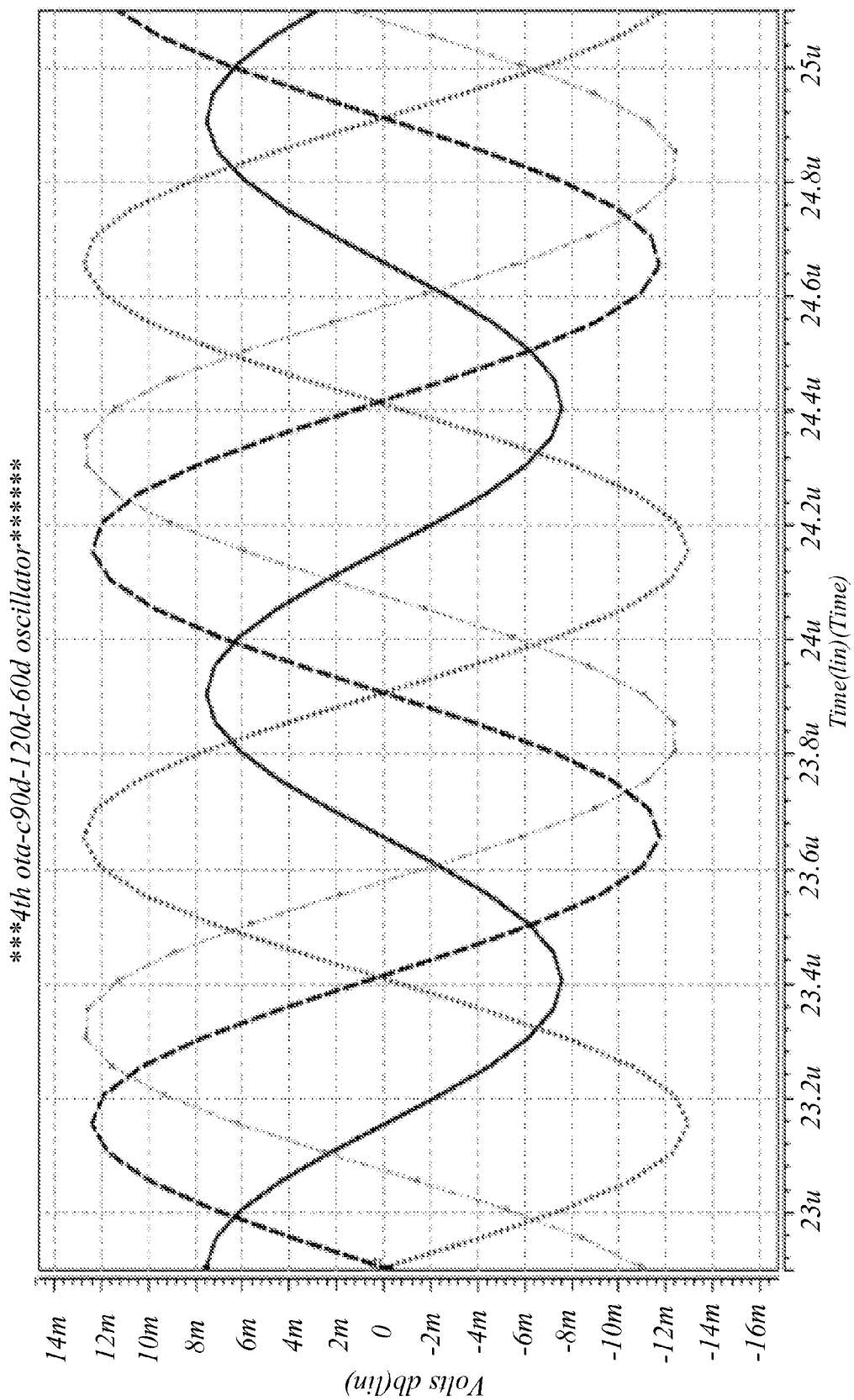
FIG. 42 shows the oscillation waveforms of V1, V2, V3, and V4 for case 5 after compensation.
Figure 43:
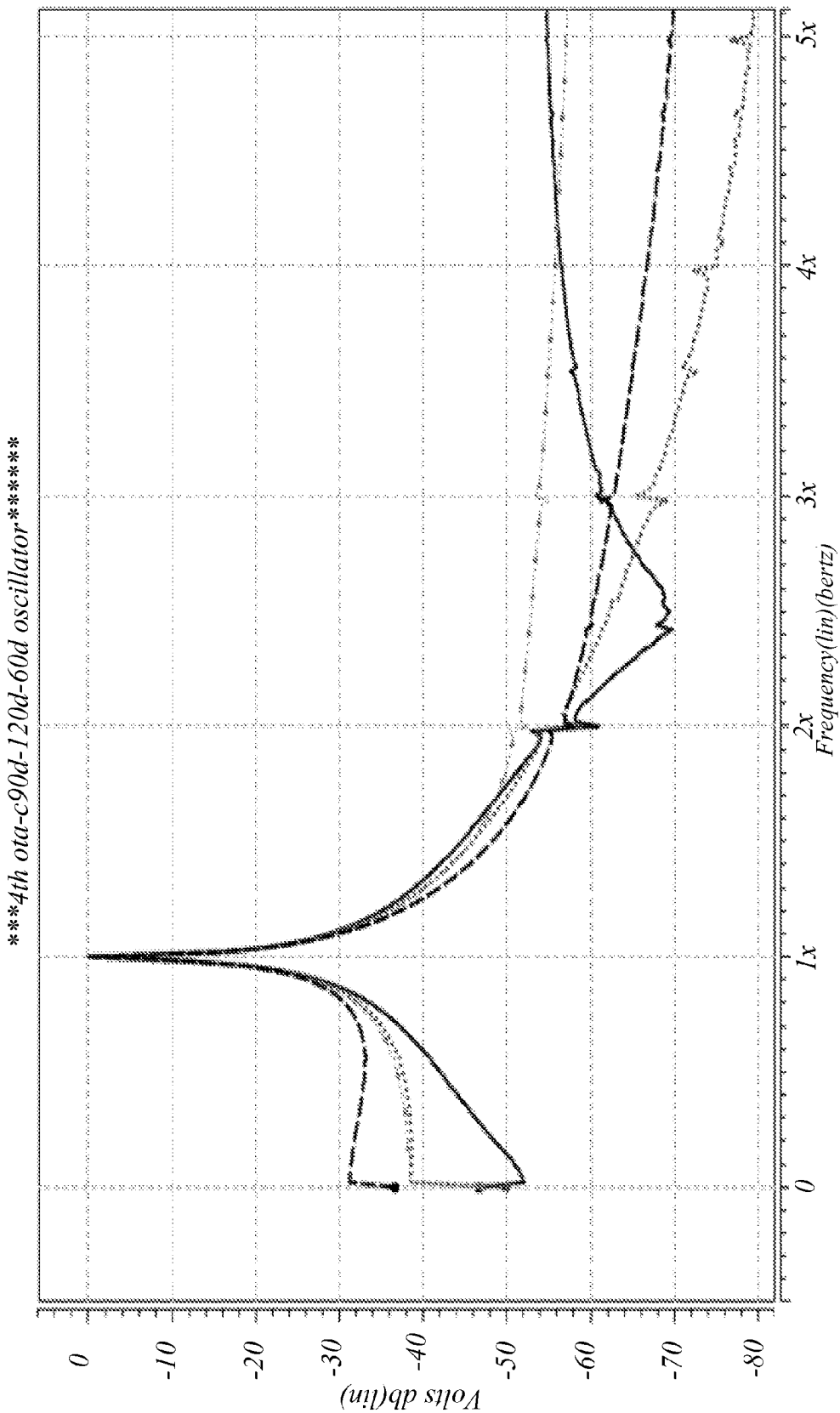
FIG. 43 shows the frequency spectrums of V1, V2, V3, and V4 for case 5 after compensation.

Only carrying out the compensation schemes I, II, and III relevant to phase shifts, we found that both THDs and the frequency of oscillation are simultaneously significantly improved. It may be the main reason that the non-ideal effects have been mostly eliminated when just doing the compensation schemes I, II, and III relevant to phase shifts. FIGS. 42 and 43 show the oscillation waveforms, after compensations, and the frequency spectrums, of the node voltages, V1, V2, V3, and V4, respectively. It is evident that the compensated frequency spectrums shown in FIG. 43 is much better than those before compensations shown in FIG. 41. The above H-Spice simulation results confirm that the compensation schemes are very effective.

5. Equivalent CCCII-C or CCII-RC Oscillator Structures

The smaller the size of integrated circuits the more difficult the manufacture of the component with precise magnitude on an IC chip. Both resistors and capacitors suffer from the problem for a long time. How to make them on the IC chip with precise ohms and farads? Only two kinds of active elements, i.e., operational transconductance amplifiers (OTAs) and second-generation current controlled conveyors (CC-CIIs) [29], enjoy the particular advantage, no need of resistors in circuit design due to their doublet status, both an ordinary active element and a resistor in one of themselves, and then are superior to other kinds of active elements. Therefore, when the integrated circuit is getting smaller in size, the more difficult to manufacture a precise resistor on an IC chip the more important the two active elements, OTAs and CCCIIs, in circuit design. Obviously, an active circuit without resistors is much simpler in architecture than an ordinary one with resistors. The former is without the problem: how to make a precise resistor when the integrated circuit is getting smaller. This is the reason why we choose both OTAs and CCCIIs as active elements in the design. On the other hand, although the CCCII-C circuit can be easily transferred to the corresponding second-generation current conveyor (CCII) [30]-RC circuit by replacing a CCCII with both a CCII and a series resistor at its X terminal, the additional resistors in the CCII-RC circuit increase the chip area compared to the circuit without resistors and degrade the performance of output signals due to the manufacture of resistor on an IC chip without precise ohms.

Figure 44:
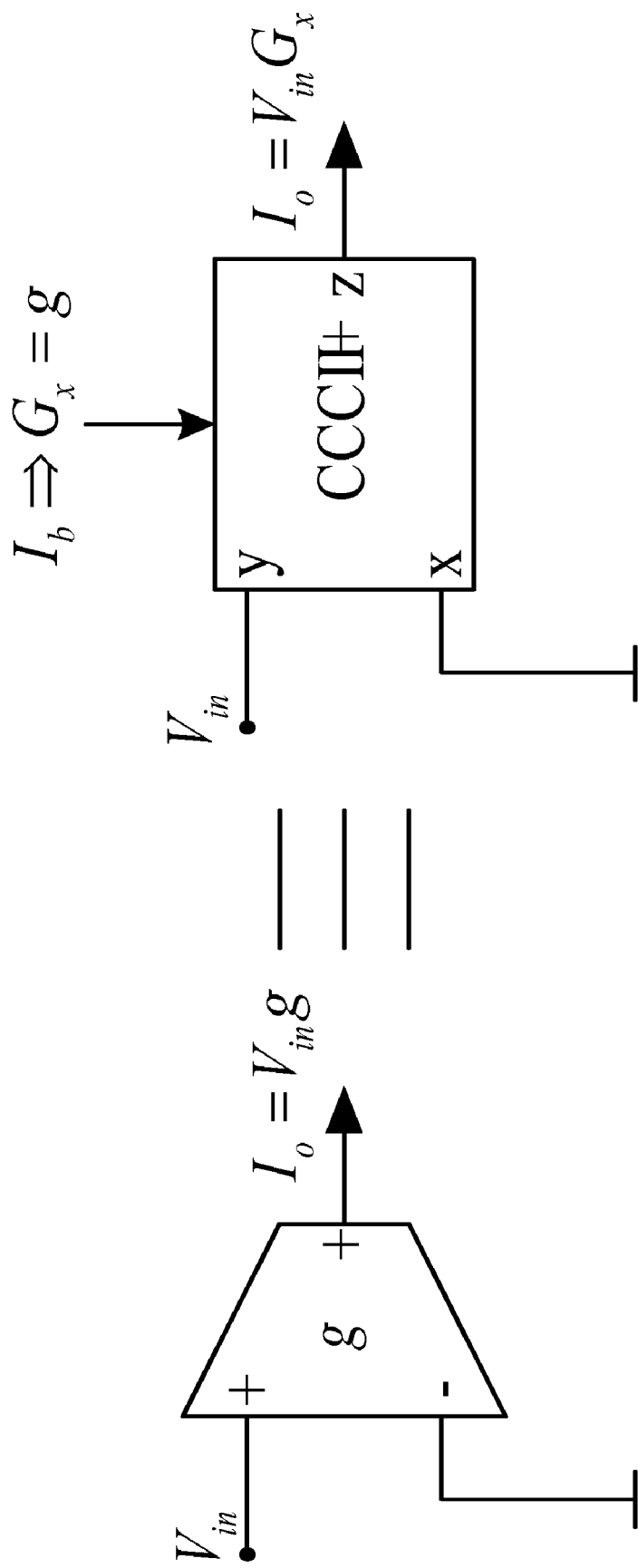
FIG. 44 shows the equivalence between a single-ended-input OTA and a single-ended-input CCCII.
Figure 45:
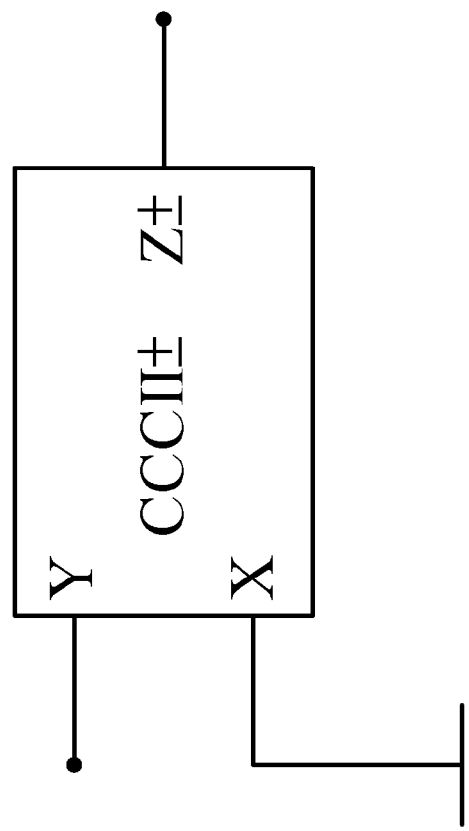
FIG. 45 is a Transformation I between a single-ended-input OTA and a single-ended-input CCCII
Figure 45:
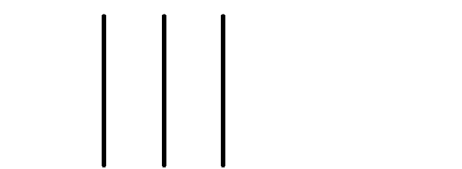
Figure 45:
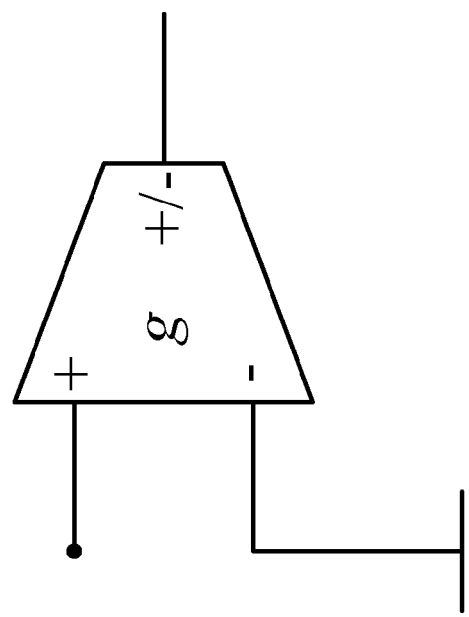
Figure 46:
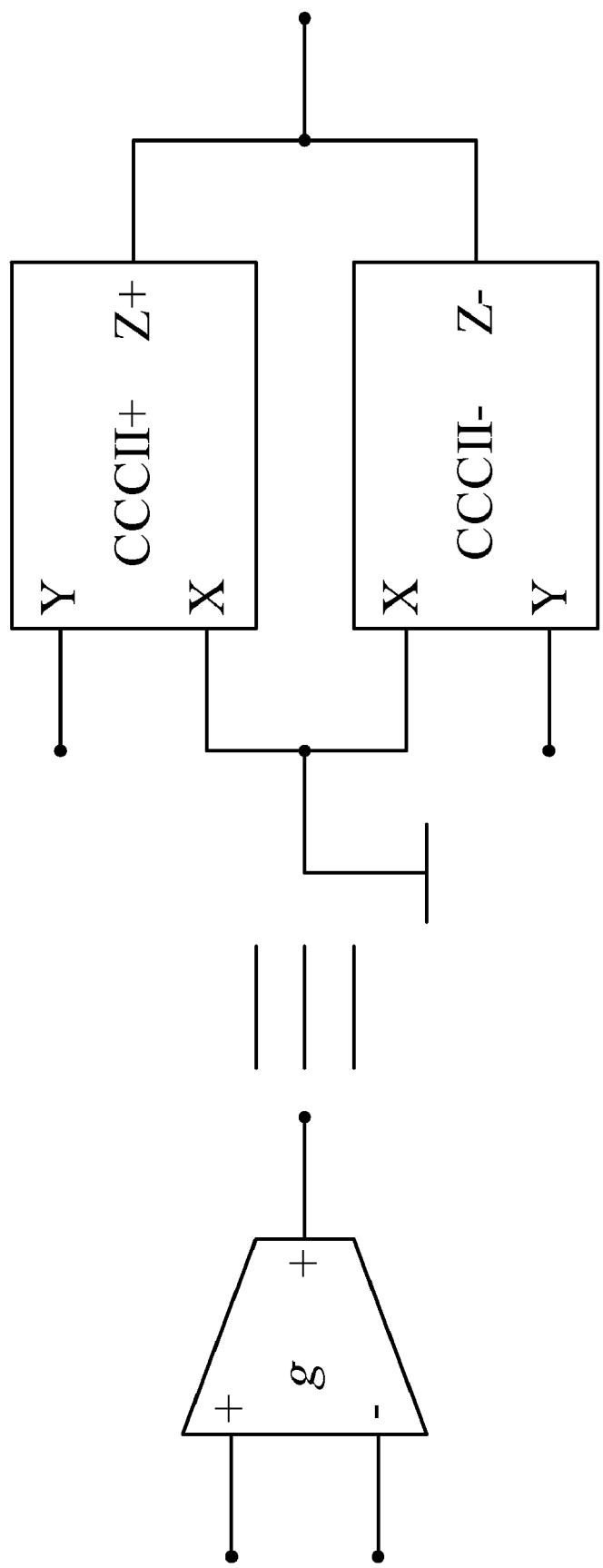
FIG. 46 is a Transformation II between a differential-input OTA and two single-ended-input CCCIIs

A single-ended-input OTA can be easily transferred to a single-ended-input CCCII, referring to FIG. 44, all the single-ended-input OTA-grounded C structures shown as above can be easily converted to the single-ended-input CCCII-grounded C structures just using the equivalence shown in FIG. 44 and its dual part just after the replacement of the output plus sign of the active element shown in FIG. 44 with a minus sign.

Since an OTA can be easily converted into an active current controlled conveyor CCCII [54]. A Transformation I between a single-ended-input OTA and a single-ended-input CCCII. Transformation II between a differential-input OTA and two single-ended-input CCCIIs. the above presented new OTA-C oscillator structures (shown in FIGS. 4, 5, 4A, 4B, 13, 14, 16, 17A, 19, 20, 20A, and 23A) may be easily transformed to the corresponding new CCCII-C oscillator structures.

CONCLUSIONS

A synthesized method much simpler than the recently reported fractional calculus approach for the design of any-phase-shift sinusoidal oscillators is presented. It doesn't need to employ the fractional capacitance which is an infinite series tree branches constructed by resistors and capacitors and difficult to be fabricated on an IC chip. The effective analytical synthesis method is applied using the single-ended-input OTAs and grounded capacitors and produces the voltage-mode and current-mode nth-order quadrature sinusoidal oscillator structure with the minimum number of active and passive components. Two fundamental OTA-C sub-circuitries for realizing the phase shift larger or smaller than 90° are superposed to the above nth-order quadrature sinusoidal oscillator structure and leading to the expansion of quadrature to any-phase-shift for the nth-order OTA-C sinusoidal oscillator structure. Five different sinusoidal oscillator examples with phase shifts, (i) two 90°'s, (ii) two 120°'s, (iii) two 60°'s, (iv) three 90°'s, and (v) 90°, 120°, and 60°, are given for demonstrating the nth-order any-phase-shift OTA-C sinusoidal oscillator structure. Moreover, the compensation schemes are proposed for reducing the output deviations due to the non-ideal transconductance function of an OTA and the parasitic capacitances and conductances on an IC chip. After appropriate compensations but still fixing the capacitances, a synthesized fourth-order three-phase-shift oscillator, using six single-ended-input OTAs and four grounded capacitors, enjoys very precise output parameters, such as the oscillation frequency of 996.403 kHz with 0.36% error compared to theoretical 1 MHz, three phase shifts, 89.145°, 119.099°, and 59.846°, with 0.95% error, 0.75% error, and 0.257% error, respectively, compared to theoretical 90°, 120°, and 60°, and four excellent THDs for the four different node voltages, 0.121%, 0.072%, 0.113%, and 0.052%, all of which are much lower than the standard value, 1.000%.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

In the above detailed description, reference is made to the accompanying drawings which form a part hereof and in which is shown by way of illustration specific embodiments in which the invention can be practiced. These embodiments are described in sufficient detail to enable those skilled in the art to practice and use the invention, and it is to be understood that other embodiments may be utilized and that electrical, logical, or structural changes may be made without departing from the spirit and scope of the present invention. The following detailed description is, therefore, not to be taken in a limiting sense and the scope of the present invention is defined by the appended claims and their equivalents.

REFERENCE

References of interest in the disclosure of the invention, the contents of which are incorporated herein by reference, include:

[1] B. Razavi, "Design considerations for direct-conversion receivers", IEEE Trans. Circuits Syst.-II, vol. 44, no. 6, pp. 428-45, June 1997.

[2] C. H. Park, O. Kim, and B. Kim, "A 1.8-GHz self-calibrated phase-locked loop with precise I/Q matching", IEEE J. Solid-State Circuits, vol. 36, no. 5, pp. 777-783, May 2001.

[3] R. van de Beek, E. Klumperink, C. Vaucher, and B. Nauta, "Low jitter clock multiplication: a comparison between PLLs and DLLs", IEEE Trans. Circuits Syst.-II, vol. 49, no. 8, pp. 555-566, August 2002.

[4] K. Lee et al., "A single-chip 2.4 GHz direct-conversion CMOS receiver for wireless local loop using multiphase reduced frequency conversion technique", IEEE J. Solid-State Circuits, vol. 6, no. 5, pp. 800-809, May 2001.

[5] A Rofougaran et al., "A single-chip 900-MHz spread-spectrum wire-less transceiver in 1-μm CMOS-Part I: Architecture and transmitter design", IEEE J. Solid-State Circuits, vol. 33, no. 4, pp. 515-534, April 1998.

[6] J. G. Maneatis, and M. A. Horowitz, "Precise delay generation using coupled oscillations", IEEE J. Solid-State Circuits, vol. 28, no. 12, pp. 1273-1282, December 1993.

[7] P. Kinget, R. Melville, D. Long, and V. Gopinathan, "An injection-locking scheme for precision quadrature generation", IEEE J. Solid-State Circuits, vol. 37, no. 7, pp. 845-851, July 2002.

[8] L. Romanò, S. Levantino, C. Samori, and A. L. Lacaita, "Multiphase LC Oscillators", IEEE Trans. Circuits Syst.-I, vol. 53, no. 7, pp. 1579-1588, July, 2006.

[9] A. G. Radwan, A. S. Elwakil, and A. M. Soliman, "Fractional-order sinusoidal oscillators: design procedure and practical examples", IEEE Trans. Circuits & Syst.-I, vol. 55, no. 7, pp. 2051-2063, August 2008.

[10] A. G. Radwan, A. S. Elwakil, and A. M. Soliman, "Fractional-order sinusoidal oscillators: design procedure and practical examples", IEEE Trans. Circuits & Syst.-I, vol. 55, no. 7, pp. 2051-2063, August 2008

[11] T. T. Hartley, and C. F. Lorenzo, "Initialization, conceptualization, and application in the generalized fractional calculus", National Aeronautics and Space Administration (NASA/TP-1998-208415) 1998.

[12] M. Nakagawa, and K. Sorimachi, "Basic characteristics of a fractance device", IEICE Trans. Fundam. Electron. Commun. Comput. Sci., vol. E75, no. 12, pp. 1814-1819, 1992.

[13] M. Sugi, Y. Hirano, Y. F. Miura, and K. Saito, "Simulation of fractal immittance by analog circuits: an approach to the optimized circuits", IEICE Trans. Fundam. Electron. Commun. Comput. Sci., vol. E82, no. 8, pp. 1627-1634, 1999.

[14] S. I. Liu, and J. H. Tsay, "Single-resistance-controlled sinusoidal oscillator using current-feedback amplifiers", Int. J. Electron., vol. 80, no. 5, pp. 661-664, 1996.

[15] A. M. Soliman, "Current feedback operational amplifier based oscillators", Analog Integr. Circuits Signal Process, vol. 23, pp. 45-55, 2000.

[16] V. K. Singh, R. K. Sharma, A. K. Singh, D. R. Bhaskar, and R. Senani, "Two new canonic single-CFOA oscillators with single resistor controls", IEEE Trans. Circuits & Syst.-II, vol. 52, no. 12, pp. 860-864, December 2005.

[17] C. M. Chang, B. M. Al-Hashimi, H. P. Chen, S. H. Tu, and J. A. Wan, "Current-mode single resistance controlled oscillators using only grounded passive components", Electronics Letters, vol. 38, no. 19, pp. 1071-1072, September 2002.

[18] C. M. Chang, "Novel current-conveyor-based single-resistance-controlled/voltage-controlled oscillator employing grounded resistors and capacitors", Electronics Letters, vol. 30, no. 3, pp. 181-183, 1994.

[19] P. A. Martinez, J. Sabadell, C. Aldea, and S. Celma, "Variable frequency sinusoidal oscillators based on CCII+", IEEE Trans. Circuits Syst.-I, vol. 46, no. 11, pp. 1386-1390, November 1999.

[20] B. Linares-Barranco, A. Rodriguez-Vázquez, J. L. Huerrtas, and R. Sanchez-Sinencio, J. J. Hoyle, "Generation and Design of Sinusoidal Oscillators using OTAs", IEEE Proc.-ISCAS, pp. 2863-2866, 7-9, June 1988.

[21] Y. Tao, and J. K. Fidler, "Electronically tunable dual-OTA second-order sinusoidal oscillators/Filters with non-interacting controls: a systematic synthesis approach", IEEE Trans. Circuits Syst.-I, vol. 47, no. 2, pp. 117-129, February 2000.

[22] M. N. S. Swamy, R. Raut, and Z. Tang, "Generation of new OTA-C oscillator structures", IEEE Proc. MWSCAS, vol. 1, pp. 73-76, July, 2004.

[23] J. Galan, R. G. Carvajal, A. Torralba, F. Nuñoz, and J. Ramirez-Angulo, "A low-power low-voltage OTA-C sinusoidal oscillator with a large tuning range", IEEE Trans. Circuits Syst.-I, vol. 52, no. 2, pp. 283-291, February 2005.

[24] Masood-ul-Hasan, Y. Sun, X. Zhu, and J. Moritz, "Oscillation-based DFT for second-order OTA-C filters", IEEE Proc. ISCAS, pp. 720-723, 18-21 May, 2008.

[25] C. Zamarreño-Ramos, T. Serrano-Gotarredona, B. Linares-Barranco, "OTA-C oscillator with low frequency variations for on-chip clock generation in serial LVDS-AER links", IEEE Proc. ISCAS, pp. 2657-2660, 24-27, May 2009.

[26] B. Linares-Barranco, T. Serrano-Gotarredona, J. Ramos-Martos, J Ceballos-Cáceres, J. M. Mora, and A. Linares-Barranco, "A precise 90° quadrature OTA-C oscillator tunable in the 50-130-MHz Range", IEEE Trans. Circuits Syst.-I, vol. 51, no. 4, pp. 649-663, April 2004.

[27] D. N. Loizos, P. P. Sotiriadis, "A quadrature sinusoidal oscillator with phase-preserving wide-range linear frequency tunability and frequency-independent amplitude", IEEE Trans. Circuits Syst.-II, vol. 53, no. 11, pp. 1279-1283, November 2006.

[28] J. W. Horng, C. L. Hou, C. M. Chang, W. Y. Chung, H. W. Tang, and Y. H. Wen, "Quadrature oscillators using CCIIs", Int. J. Electron., vol. 92, no. 1, pp. 21-31, January 2005.

[29] P. Prommee, and K. Dejhan, "An integrable electronic-controlled quadrature sinusoidal oscillator using CMOS operational transconductance amplifier", Int. J. Electron., vol. 89, no. 5, pp. 365-379, 2002.

[30] S. Maheshwari, and I. A. Khan, "Current controlled third order quadrature oscillator", IEE Proc.-Circuits Devices Syst., vol. 152, no. 6, pp. 605-607, December 2005.

[31] S. I. Liu, Y. H. Liao, "Current-mode quadrature sinusoidal oscillator using FTFN", Int. J. Electronics, vol. 81, no. 2, pp. 171-175, 1996.

[32] A. M. Soliman, and A. M. Soliman, "Novel MOS-C oscillators using the current feedback op-amp", Int. J. Electron., vol. 87, no. 3, pp. 269-280, 2000.

[33] C. M. Chang, B. M. Al-Hashimi, H. P. Chen, S. H. Tu, and J. A. Wan, "Current-mode single resistance controlled oscillators using only grounded passive components", Electronics Letters, vol. 38, no. 19, pp. 1071-1072, September 2002.

[34] C. M. Chang, and T. S. Liao, "Novel sinusoidal oscillators using a single dual current output OTA", International Journal of Electronics, vol. 89, no. 6, pp. 493-503, June 2002.

[35] N. Minhaj, "Current conveyor-based voltage-mode two-phase and four-phase quadrature oscillators", Int. J. Electron., vol. 94, no. 7, pp. 663-669, July 2007.

[36] Ü. Keskin, and D. Boilek, "Current mode quadrature oscillator using current differencing transconductance amplifiers (CDTAs)", IEE Proc.-Circuits, Devices Syst., vol. 153, no. 3, pp. 214-218, June 2006.

[37] M. T. Ahmed, I. A. Khan, and N. Minhaj, "On transconductance-C quadrature oscillators", Int. J. Electron., vol. 83, no. 2, pp. 201-207, 1997.

[38] S. Minaei, and M. A. Ibrahim, "General configuration for realizing current-mode first-order all-pass filter using DVCC", Int. J. Electron., vol. 92, no. 6, pp. 347-356, June 2005.

[39] I. A. Khan, and S. Khwaja, "An integrable gm-C quadrature oscillator", Int. J. Electron., vol. 87, no. 11, pp. 1353-1357, 2000.

[40] J. W. Horng, C. L. Hou, C. M. Chang, H. P. Chou, C. T. Lin, and Y. H. Wen, "Quadrature oscillators with grounded capacitors and resistors using FDCCIIs", ETRI Journal, vol. 28, no. 4, pp. 486-494, August 2006.

[41] S. Maheshwari, "High output impedance current-mode all-pass sections with two grounded passive components", IET Circuits Devices Syst., vol. 2, no. 2, pp. 234-242, February 2008.

[42] J. W. Horng, C. L. Hou, C. M. Chang, Y. T. Lin, I. C. Shiu, and W. Y. Chiu, "First-order all-pass filter and sinusoidal oscillators using DDCCs", Int. J. Electron., vol. 93, no. 7, pp. 457-466, 2006.

[43] C. M. Chang, B. M. Al-Hashimi, "Analytical synthesis of current-mode high-order OTA-C filters", IEEE Trans. Circuits & Syst.-I, vol. 50, no. 9, pp. 1188-1192, September 2003.

[44] C. M. Chang, B. M. Al-Hashimi, Y. Sun, and J. N. Ross, "New high-order filter structures using single-ended-input OTAs and grounded capacitors", IEEE Trans. Circuits & Syst.-II, vol. 51, no. 9, pp. 458-463, September 2004.

[45] C. M. Chang, C. L. Hou, W. Y. Chung, J. W. Horng, and C. K. Tu, "Analytical synthesis of high-order single-ended-input OTA-grounded C all-pass and band-reject filter structures", IEEE Trans. Circuits & Syst.-I, vol. 53, no. 3, pp. 489-498, March 2006.

[46] C. M. Chang, "Analytical synthesis of the digitally programmable voltage-mode OTA-C universal biquad", IEEE Trans. Circuits & Syst-II, vol. 53, no. 8, pp. 607-611, August 2006.

[47] C. M. Chang, A. M. Soliman, and M. N. S. Swamy, "Analytical synthesis of low sensitivity high-order voltage-mode DDCC and FDCCII-grounded R and C all-pass filter structures", IEEE Trans. Circuits & Syst-I, vol. 54, no. 7, pp. 1430-1443, July 2007.

[48] S. H. Tu, C. M. Chang, J. N. Ross, and M. N. Swamy, "Analytical synthesis of current-mode high-order single-ended-input OTA and equal-capacitor elliptic filter structures with the minimum number of components", IEEE Trans. Circuits & Syst.-I, vol. 54, no. 10, pp. 2195-2210, October 2007.

[49] Y. Sun, and J. K. Fidler, "Synthesis and performance analysis of universal minimum component integrator-based IFLF OTA-grounded capacitor filter", IEE Proc.-Circuits Devices Syst., vol. 143, no. 2, pp. 107-114, 1996.

[50] R. Schaumann, and M. E. V. Valkenburg, Design of Analog Filters. New York: Oxford University Press, 2001.

[51] S. Szczepanski, A. Wyszynski, and R. Schaumann, "Highly linear voltage-controlled CMOS trans-conductors," IEEE Trans. Circuits Syst.-I, vol. 40, no. 4, pp. 258-262, April 1993.

[52] A. Fabre O. Saaid, F. Wiest, and C. Boucheron, "High frequency applications based on a new current controlled conveyor", IEEE Trans. Circuits Syst. I, fundam. Theory Appl., vol. 43, pp. 82-91, 1996.

[53] K. C. Smith, and A. Sedra, "The current conveyor—a new circuit building block", IEEE Proc., vol. 56, pp. 1368-1369, 1968.

[54] C. M. Chang, B. M. Al-Hashimi, and J. N. Ross, "Unified active filter biquad structures", IEE Proc.-Circuits Devices, and Systems, vol. 151, no. 4, pp. 273-277, August 2004.

What is claimed is:

1. An oscillator, comprising:
a first voltage node;
a second voltage node;
a first, a second and a third grounded capacitors; and
a first, a second and a third operational transconductance amplifiers (OTAs) connected in a serial sequence, wherein, each OTA has a particular transconductance value, and each OTA has a negative input, a positive input, and one or two outputs, wherein
one of the negative input and the positive input of each OTA is configured as a predetermined input, and the other of the negative input and the positive input of each OTA is configured to be grounded; and
the predetermined input of the first OTA is connected to the first grounded capacitor and connected to first outputs of all OTAs, the first grounded capacitor is connected to the predetermined input of the first OTA, is connected to a first input of the third OTA, the predetermined input of the second OTA is connected to the second grounded capacitor and connected to a second output of the first OTA, and the predetermined input of the third OTA is connected to the third grounded capacitor and connected to a second output of the second OTA.

2. The oscillator as claimed in claim 1, wherein each of the second and the third grounded capacitor is in parallel with a sub-OTA with a negative input, a positive input, and a positive output, and the second or the third grounded capacitor has two terminals connected to the negative input and the positive input of the sub-OTA respectively, and the output of the sub-OTA is connected to one, which is not grounded, of the negative input and the positive input of the sub-OTA.

3. The oscillator as claimed in claim 1, wherein a first voltage is denoted as $V_1$, and a second voltage is denoted as $V_2$, and a practical relation with frequency-dependent transconductance $g(1-sT)$, parasitic capacitance $C_p$ and parasitic conductance $G_p$ between $V_1$ and $V_2$ is as $$\frac{V_2}{V_1} = \frac{\pm[g(1-sT)]}{sC+sC_p+G_p} = \frac{\pm[g-sgT]}{G_p+s(C+C_p)},$$

when a practical phase shift between a numerator, $V_2$, and a denominator, $V_1$, is simulated to be less than 90°, a compensation operation is to shunt a small negative conductance when a former sign of the numerator is "+"or a positive conductance when the former sign of the numerator is "−".

4. The oscillator as claimed in claim 2, wherein a first voltage is denoted as $V_1$, and a second voltage is denoted as $V_2$, and a practical relation with frequency-dependent transconductance $g_i(1\text{-}sT_i)$, parasitic capacitance $C_p$ and parasitic conductance $G_p$ between and $V_1$ and $V_2$ is as $$\frac{V_2}{V_1} = \frac{\pm[g_i(1-sT_i)]}{sC_i+g_i(1-sT_i)+sC_p+G_p} = \frac{\pm[g_i-sg_iT_i)]}{(g_i+G_p)+s(C_i+C_p-g_iT_i)},$$

when a practical phase shift between a numerator, $V_2$, and a denominator, $V_1$, is simulated to be less than a prediction, a compensation operation is to adjust the transconductance of the sub-OTA to be larger when a former sign of the numerator is "−"or smaller when the former sign of the numerator is "+".

5. The oscillator as claimed in claim 2, wherein a first voltage is denoted as $V_1$, and a second voltage is denoted as $V_2$, and a practical relation with frequency-dependent transconductance $g_i(1\text{-}sT_i)$, parasitic capacitance $C_p$ and parasitic conductance $G_p$ between $V_1$ and $V_2$ is as $$\frac{V_2}{V_1} = \frac{\pm[g_i(1-sT_i)]}{sC_i+g_i(1-sT_i)+sC_p+G_p} = \frac{\pm[g_i-sg_iT_i)]}{(g_i+G_p)+s(C_i+C_p-g_iT_i)},$$

when a practical phase shift between a numerator, $V_2$, and a denominator, $V_1$, is simulated to be less than a prediction, a compensation operation is to adjust the transconductance of the sub-OTA to be smaller when a former sign of the numerator is "−"or larger when the former sign of the numerator is "+".

6. An oscillator, comprising:
a first voltage node;
a second voltage node; and
two separated first, second and third grounded capacitors; and
a first, a second and a third operational transconductance amplifiers (OTAs) connected in a serial sequence, wherein, each OTA has a particular transconductance value, and each OTA has a negative input, a positive input, at least two negative outputs, and at least two positive outputs, wherein
one of the negative input and the positive input of each OTA is configured as a predetermined input, and the other of the negative input and the positive input of each OTA is configured as an alternate predetermined input, thus the predetermined input and the alternate predetermined input have opposite polarity signs; and
the predetermined input and the alternate predetermined input of the first OTA are connected to first and fourth outputs, both of which have opposite polarity signs, respectively, of all OTAs, and are connected to the two separate first grounded capacitors, respectively, the two separate first grounded capacitors are connected to first and fourth outputs of the third OTA, respectively, the predetermined input and the alternate predetermined input of the second OTA are connected to second and third outputs, both of which have opposite polarity signs, respectively, of the first OTA, and connected to the two separate second grounded capacitors, and the predetermined input and the alternate predetermined input of the third OTA are connected to second and third outputs, both of which have opposite polarity signs, respectively, of the second OTA, and connected to the two separate third grounded capacitors.

* * * * *